(12) United States Patent
Juengling

(10) Patent No.: US 8,076,229 B2
(45) Date of Patent: Dec. 13, 2011

(54) METHODS OF FORMING DATA CELLS AND CONNECTIONS TO DATA CELLS

(75) Inventor: Werner Juengling, Boise, ID (US)

(73) Assignee: Micron Technology, Inc., Boise, ID (US)

(*) Notice: Subject to any disclaimer, the term of this patent is extended or adjusted under 35 U.S.C. 154(b) by 464 days.

(21) Appl. No.: 12/130,825

(22) Filed: May 30, 2008

(65) Prior Publication Data

US 2009/0294842 A1    Dec. 3, 2009

(51) Int. Cl.
*H01L 21/3205* (2006.01)
(52) U.S. Cl. ........................................ 438/585
(58) Field of Classification Search ............... None
See application file for complete search history.

(56) References Cited

U.S. PATENT DOCUMENTS

| | | | |
|---|---|---|---|
| 3,885,861 A | 5/1975 | Farnsworth et al. | |
| 5,160,987 A | 11/1992 | Pricer et al. | |
| 5,196,910 A | 3/1993 | Moriuchi et al. | |
| 5,661,061 A | 8/1997 | Usuami et al. | |
| 5,821,513 A | 10/1998 | O'Hagan et al. | |
| 5,858,829 A | 1/1999 | Chen | |
| 5,925,918 A | 7/1999 | Wu et al. | |
| 5,949,057 A | 9/1999 | Feng | |
| 5,966,600 A * | 10/1999 | Hong ........................... 438/253 |
| 6,008,513 A | 12/1999 | Chen | |
| 6,043,562 A | 3/2000 | Keeth | |
| 6,080,674 A | 6/2000 | Wu et al. | |
| 6,081,008 A | 6/2000 | Rostoker | |
| 6,100,129 A | 8/2000 | Tu et al. | |
| 6,130,551 A | 10/2000 | Agrawal et al. | |
| 6,216,257 B1 | 4/2001 | Agrawal et al. | |
| 6,258,656 B1 | 7/2001 | Lange et al. | |
| 6,258,659 B1 | 7/2001 | Gruening et al. | |
| 6,268,243 B1 | 7/2001 | Park | |
| 6,282,113 B1 | 8/2001 | DeBrosse | |
| 6,316,309 B1 | 11/2001 | Holmes et al. | |
| 6,380,759 B1 | 4/2002 | Agrawal et al. | |
| 6,432,769 B1 | 8/2002 | Fukuda et al. | |
| 6,440,792 B1 | 8/2002 | Shaio et al. | |

(Continued)

FOREIGN PATENT DOCUMENTS

DE          19946719          4/2001

(Continued)

OTHER PUBLICATIONS

Betty Prince, Ph.D.; "Trends in Scaled and Nanotechnology Memories"; Memory Strategies International; Leander, Texas; 2005.

(Continued)

*Primary Examiner* — Scott B Geyer
(74) *Attorney, Agent, or Firm* — Fletcher Yoder

(57) ABSTRACT

Disclosed are methods and devices, among which is a method that includes forming a lower conductive material on a substrate, forming a stop material on the substrate, forming a sacrificial material on the substrate, etching the sacrificial material with an etch that is selective to the sacrificial material and selective against the stop material, and etching the lower conductive material.

18 Claims, 52 Drawing Sheets

U.S. PATENT DOCUMENTS

| | | | |
|---|---|---|---|
| 6,548,850 B1* | 4/2003 | Gernhard et al. | 257/301 |
| 6,689,660 B1 | 2/2004 | Noble et al. | |
| 6,845,033 B2 | 1/2005 | Kirihata et al. | |
| 6,897,107 B2 | 5/2005 | Divakaruni et al. | |
| 6,897,514 B2* | 5/2005 | Kouznetsov et al. | 257/314 |
| 6,927,462 B2 | 8/2005 | Goodwin et al. | |
| 6,967,147 B1 | 11/2005 | Tews et al. | |
| 6,998,666 B2 | 2/2006 | Beintner et al. | |
| 7,091,543 B2 | 8/2006 | Tzeng et al. | |
| 7,098,105 B2 | 8/2006 | Juengling | |
| 7,099,216 B2 | 8/2006 | Luk et al. | |
| 7,132,333 B2 | 11/2006 | Schloesser et al. | |
| 7,151,023 B1 | 12/2006 | Nayfeh et al. | |
| 7,190,060 B1 | 3/2007 | Chiang | |
| 7,195,995 B2 | 3/2007 | Mouli | |
| 7,205,606 B2 | 4/2007 | Tran | |
| 7,345,937 B2 | 3/2008 | Yoon et al. | |
| 2001/0003034 A1 | 6/2001 | Furukawa et al. | |
| 2002/0155656 A1 | 10/2002 | Hayano et al. | |
| 2003/0168676 A1 | 9/2003 | Itabashi et al. | |
| 2003/0198073 A1 | 10/2003 | Keeth | |
| 2003/0230783 A1 | 12/2003 | Willer et al. | |
| 2004/0027848 A1 | 2/2004 | Wald et al. | |
| 2004/0043592 A1 | 3/2004 | Goodwin et al. | |
| 2004/0062069 A1 | 4/2004 | Keeth | |
| 2004/0125636 A1 | 7/2004 | Kurjanowicz et al. | |
| 2004/0156247 A1 | 8/2004 | Cho et al. | |
| 2004/0198065 A1* | 10/2004 | Lee et al. | 438/725 |
| 2004/0202027 A1 | 10/2004 | Kuzmenka et al. | |
| 2005/0056940 A1 | 3/2005 | Sandhu et al. | |
| 2005/0133852 A1 | 6/2005 | Shau | |
| 2005/0151206 A1 | 7/2005 | von Schwerin | |
| 2005/0196918 A1 | 9/2005 | von Schwerin | |
| 2005/0245024 A1 | 11/2005 | von Schwerin | |
| 2006/0006446 A1 | 1/2006 | von Schwerin | |
| 2006/0057814 A1 | 3/2006 | Weis | |
| 2006/0063328 A1 | 3/2006 | Chindalore et al. | |
| 2006/0073662 A1 | 4/2006 | Jang et al. | |
| 2006/0076602 A1 | 4/2006 | Harter et al. | |
| 2006/0131630 A1 | 6/2006 | Sun et al. | |
| 2006/0131651 A1 | 6/2006 | Sato et al. | |
| 2006/0197086 A1* | 9/2006 | Rhee et al. | 257/59 |
| 2006/0244106 A1 | 11/2006 | Morikado | |
| 2006/0246607 A1 | 11/2006 | Fazan et al. | |
| 2006/0270151 A1 | 11/2006 | Lee | |
| 2006/0273415 A1 | 12/2006 | Kim | |
| 2006/0281250 A1 | 12/2006 | Schloesser | |
| 2007/0010058 A1 | 1/2007 | Juengling | |
| 2007/0023805 A1 | 2/2007 | Wells et al. | |
| 2007/0052040 A1 | 3/2007 | von Schwerin | |
| 2007/0111455 A1 | 5/2007 | Kim et al. | |
| 2007/0121414 A1 | 5/2007 | Butler | |
| 2007/0134878 A1 | 6/2007 | Brask et al. | |
| 2007/0145450 A1 | 6/2007 | Wang et al. | |
| 2007/0166933 A1 | 7/2007 | Song et al. | |
| 2007/0170522 A1 | 7/2007 | Lee et al. | |
| 2007/0176221 A1 | 8/2007 | Nakamura | |
| 2007/0176222 A1 | 8/2007 | Ikemasu et al. | |
| 2007/0176253 A1 | 8/2007 | Wang et al. | |
| 2007/0190736 A1 | 8/2007 | Liu et al. | |
| 2007/0262375 A1 | 11/2007 | Juengling | |

FOREIGN PATENT DOCUMENTS

| | | |
|---|---|---|
| EP | 0285410 | 10/1988 |
| JP | 2006054431 | 2/2006 |
| KR | 930005234 | 6/1993 |
| KR | 20020018071 | 3/2002 |
| TW | 380316 | 1/2000 |
| TW | 388125 | 4/2000 |
| WO | WO 9728532 | 8/1997 |
| WO | WO 0161738 | 8/2001 |
| WO | WO 0231878 | 4/2002 |
| WO | WO 0249100 | 6/2002 |
| WO | WO 2004/038770 | 5/2004 |

OTHER PUBLICATIONS

Branislav Curanovic; "Development of a Fully-Depleted Thin-Body FinFET Process"; Department of Microelectronic Engineering, College of Engineering; Rochester Institute of Technology; Rochester, New York; Nov. 2003.

Claeys, Cor; "Technological Challenges of Advanced CMOS Processing and Their Impact on Design Aspects"; Proceedings of the 17th International Conference on VLSI Design (VLSID '04); 1063-9667/04; IEEE Computer Society; Leuven, Belgium.

Enrico Gili; "Fabrication of Vertical MOSFETs With Reduced Parasitics and Suppression of Short Channel Effects"; Department of Electronics and Computer Science, Microelectronics Group; University of Southampton, Jun. 2004 http://66.102.1.104/scholar?hl=en&lr=&q=cache:BErKI49qg2MJ:www.ecs.soton.ac.uk/~eg02r/Publications/MinithesisEGili.pdf+dram+fins+%22process+flow%22+%22vertical+access%22.

F. Fishburn, et al.; "A 78nm 6F2 DRAM Technology for Multigigabit Densities".

J. Sturm, et al.; "Increased Transconductance in Fully-Depleted Ultra-Thin Silicon-on-Insulator MOSFETs"; 6 pages.

J-H. Ahn, S-H. Hong, S-J. Kim, J-B. Ko, S-W. Shin, S-D. Lee, Y-W. Kim, K-S. Lee, S-K. Lee, S-E. Jang, J-H. Choi, S-Y. Kim, G-H. Baw, S-W. Park, Y-J. Park, "An Experimental 256Mb Non-Volatile DRAM with Cell Plate Boosted Programming Technique". IEEE International Solid-State Circuits Conference, ISSCC 2004 / Session 2 / Non-Volatile Memory / 2.2, 2004.

R. Katsumata, et al.; "Fin-Array-FET on bulk silicon for sub-100 nm Trench Capacitor DRAM"; 2003 Symposium on VLSI Technology Digest of Technical Papers; Jun. 2003, 2 pages.

T. Park, et al.; "Fabrication of Body-Tied FinFETs (Oega MOSFETs) Using Bulk Si Wafers"; 2003 Symposium on VLSI Technology Digest of Technical Papers; Jun. 2003, 2 pages.

Bor-Wen Chan, Min-Hwa Chi, Liou, Y.H; Notch Elimination in Polycide Gate Stack Etching for Advanced DRAM Technology; Center for Technol. Dev., Worldwide Semicond. Manuf. Corp., Hsinchu; http://ieeexplore.ieee.org/xpl/freeabs_all.jsp?tp=&arnumber=883094&isnumber=19090.

Chien Yu, Rich Wise, Anthony Domenicucci; A Two-Step Spacer Etch for High-Aspect-Ration Gate Stack Process; IBM Microelectronics; http://www.mrs.org/s_mrs/s_mrs/sec_subscribe.asp?CID=2353&DID=113693&ation=detail.

Ikeda, H., Inukai, H.; High-Speed DRAM Architecture Development; NEC Corp., Sagamihara; Solid-State Circuits, IEEE Journal; May 1999; vol. 34, Issue 5, pp. 685-692; http://ieeexplore.ieee.org/xpls/abs_all.jsp?arnumber=760380&isnumber=16453.

Endoh, T., Shinmei, K., Sakuraba, H., Masuoka, F.; New Three-Dimensional Memory Array Architecture for Future Ultrahigh-Density DRAM; Res. Inst. Of Electrical Communication, Tohoku University, Sendai; Solid-State Circuites, IEEE Journal; Apr. 1999; vol. 34, Issue 4, pp. 476-483; hottp://ieeexplore.ieee.org/xpls/abs_all.jsp?arnumber=753680.

Takashima, D., Nakano, H.; A Cell Transistor Scalable DRAM Array Architecture; Memory LSI Res. & Dev. Center, Toshiba Corporation, Yokohama; Solid-State Circuits, IEEE Journal; May 2002; vol. 37, Issue 5, pp. 587-591; http://ieeexplore.ieee.org/xpls/abs_all.jsp?arnumber=997851.

Johgn-Man Park, Sang-Yeon Han, Chang-Hoon Jeon, Si-Ok Sohn, Jun-Bum Lee, Yamada, S., Shin-Deuk Kim, Wook-Je Kim; Wouns Yang, Donggun Park, Byung-Il Ryu; Fully Integrated Advanced Bulk FinFETs Architecture Featuring Partially-Insulating Technique for DRAM Cell Application of 40nm Generation and Beyond; http://ieeexplore.ieee.org/xpl/freeabs_all.jsp?arnumber=4154360.

* cited by examiner

METHODS OF FORMING DATA CELLS AND CONNECTIONS TO DATA CELLS

BACKGROUND

1. Field of Invention

Embodiments of the invention relate generally to electronic devices and, more specifically, in certain embodiments, to methods of forming connections to data cells.

2. Description of Related Art

Many types of electronic devices have data cells. Typically, the data cells each include a data element (e.g., a memory element, an imaging element, or other device configured to output data, such as various kinds of sensors) and, in some instances, an access device, such as a transistor or diode. Generally, the access device controls access to the data element, and the data element outputs signals indicative of stored or sensed data.

Often the data elements are arranged in an array, e.g., generally in rows and columns. Data cells within the array are accessed, e.g., written to or read from, through circuitry near the periphery of the array. For instance, sense amplifiers or other sensing circuitry are often positioned adjacent arrays of data cells for reading data. Similarly, address decoders, e.g., row and column address decoders, are often disposed adjacent the array for addressing particular data cells or groups of data cells.

Devices in the array often are structured differently from structures in the periphery. Array transistors may be formed from materials that are different from the materials used to form transistors in the periphery, and the dimensions, e.g., thickness, of materials in these devices may be different. In some devices, differences between the array and periphery are accommodated with multiple lithography steps. For instance, a first photolithography tool may pattern a first material in the array, and a second, different photolithography tool, may pattern a second, different material in the periphery. In this way, different design tradeoffs, e.g., size versus signal quality, may be made between the array devices and the periphery devices.

These differences, however, can increase the cost of electronic devices. Each lithography step adds costs, and certain lithography steps are particularly expensive. Typically, manufacturing lines use several different generations of lithography equipment, ranging from more advanced, newer equipment to less capable, older equipment. The newer equipment is typically much more expensive, so designers strive to reduce the number of manufacturing steps that use the newer lithography equipment. Patterning array and periphery devices, however, is often done with separate lithography steps on the newer equipment, adding to the cost of electronic devices.

DETAILED DESCRIPTION

Figure 1:
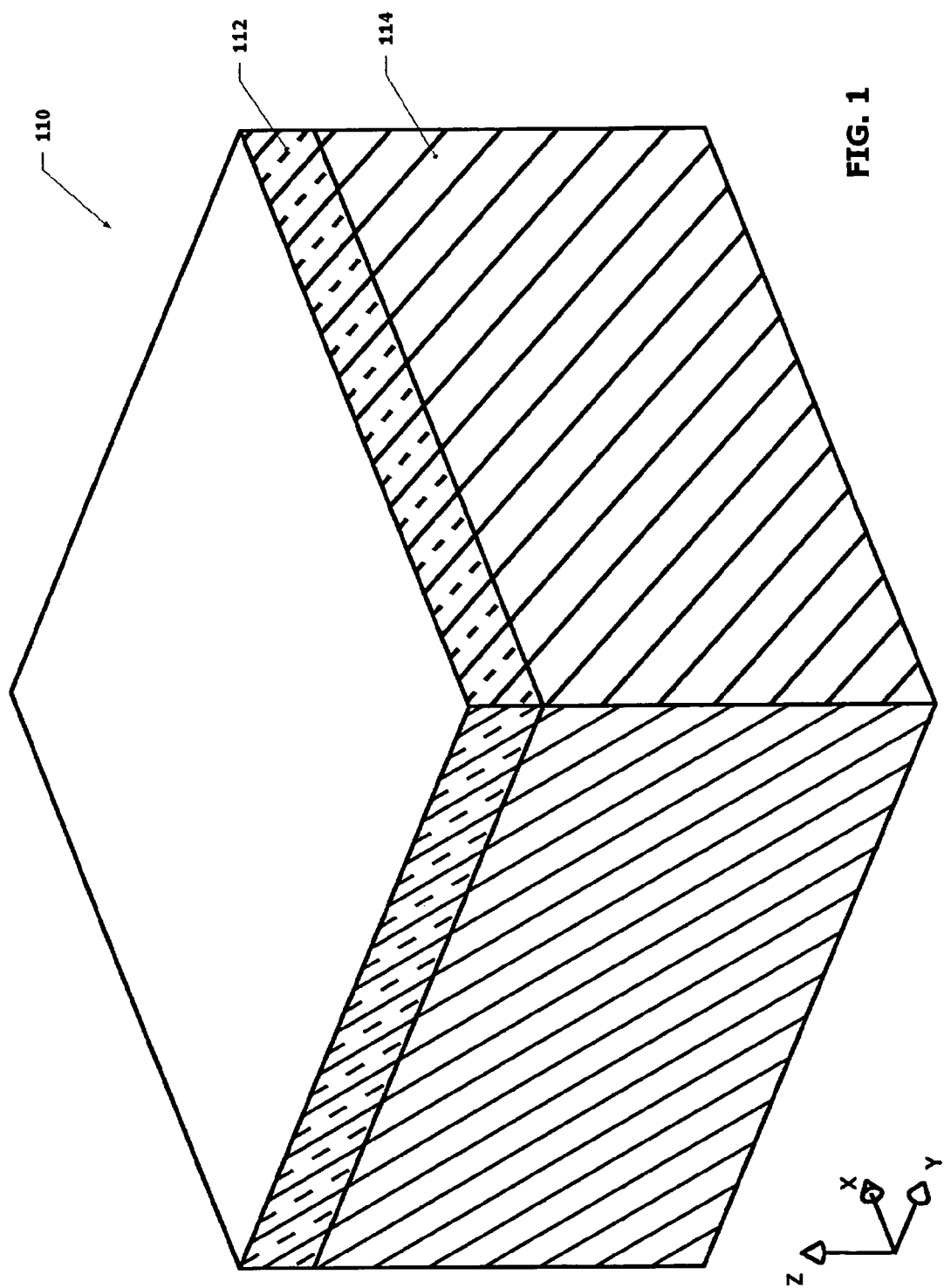
FIGS. 1-20 illustrate an example of a process for forming an array of transistors.

FIG. 1 illustrates a first step in an embodiment of a process for forming an array of transistors. The process may begin with providing a substrate 110. The substrate 110 may include semiconductive materials such as single-crystal or poly-crystalline silicon, gallium arsenide, indium phosphide, or other materials with semiconductor properties. Alternately, or additionally, the substrate 110 may include a non-semiconductor body on which an electronic device may be constructed, e.g., a body such as a plastic or ceramic work surface. The term "substrate" encompasses these structures in a variety of stages of manufacture, including an unprocessed whole wafer, a partially-processed whole wafer, a fully-processed whole wafer, a portion of a diced wafer, or a portion of a diced wafer in a packaged electronic device.

The substrate 110 may include an upper doped region 112 and a lower doped region 114. The depth of the upper doped region 112 may be generally uniform over a substantial area of the substrate 110, and the upper doped region 112 may be doped differently from the lower doped region 114. For example, the upper-doped region 112 may include an n+ material and the lower-doped region 114 may include a p− material or vise versa.

Figure 2:
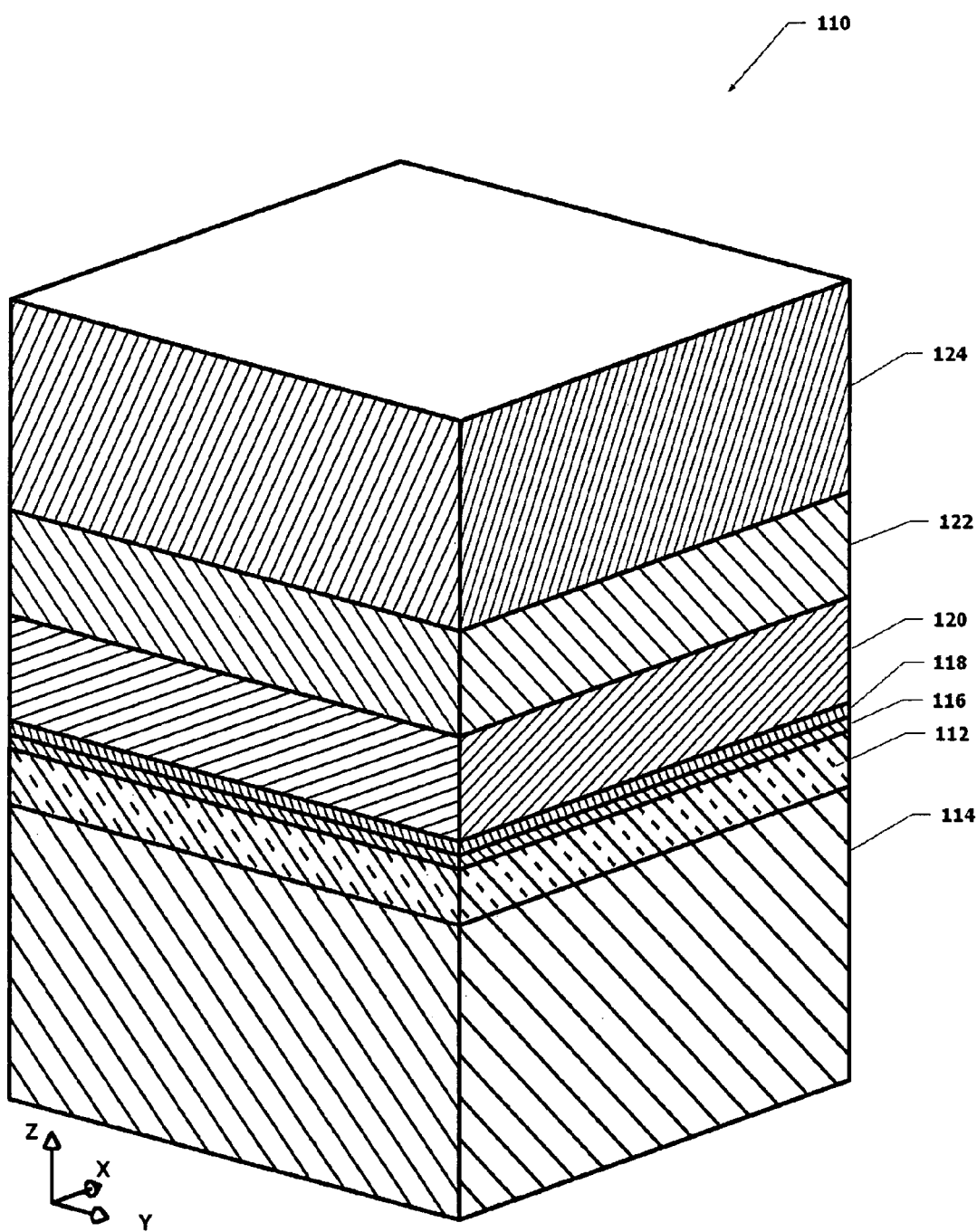

Next, several films may be formed on the substrate 110, as illustrated by FIG. 2. A pad oxide 116 may be formed on the upper doped region 112. The pad oxide 116 may have a thickness less than 300 Å, e.g., less than or equal to about 80 Å may be useful. The pad oxide 116 may be formed with a variety of techniques. For instance, it may be grown by exposing the substrate 110 to oxygen, e.g., in a diffusion furnace, or it may be deposited with atomic-layer deposition (ALD), chemical-vapor deposition (CVD), or other processes. A stop body (e.g., a layer) 118 may be formed on the pad oxide 116 with, for example, CVD. The stop body 118 may include a nitride, such as silicon nitride, and it may have a thickness less than 300 Å, e.g., about 95 Å may be useful, but like the other structures described herein, the stop body 118 is not limited to these dimensions or materials. A sacrificial body 120 may be formed on the stop body 118. The sacrificial body 120 may be made of polysilicon and it may have a thickness between about 500 Å and about 2,000 Å, e.g., about 1000 Å may be useful. The sacrificial body 120 may be formed with CVD or other appropriate processes. A lower masking body 122 may be formed on the sacrificial body 120. The lower masking body 122 may be made of an oxide and it may have a thickness between about 500 Å and about 2,000 Å, e.g., about 1000 Å may be useful. The lower masking body 122 may be formed with CVD, a spun-on-dielectric process, or other processes. Finally, an upper masking body 124 may be formed on the lower masking body 122. The upper masking body 124 may be made of carbon or other materials formed with CVD or other processes, and it may have a thickness between about 1000 Å and abut 3000 Å, e.g., about 2000 Å may be useful.

Figure 3:
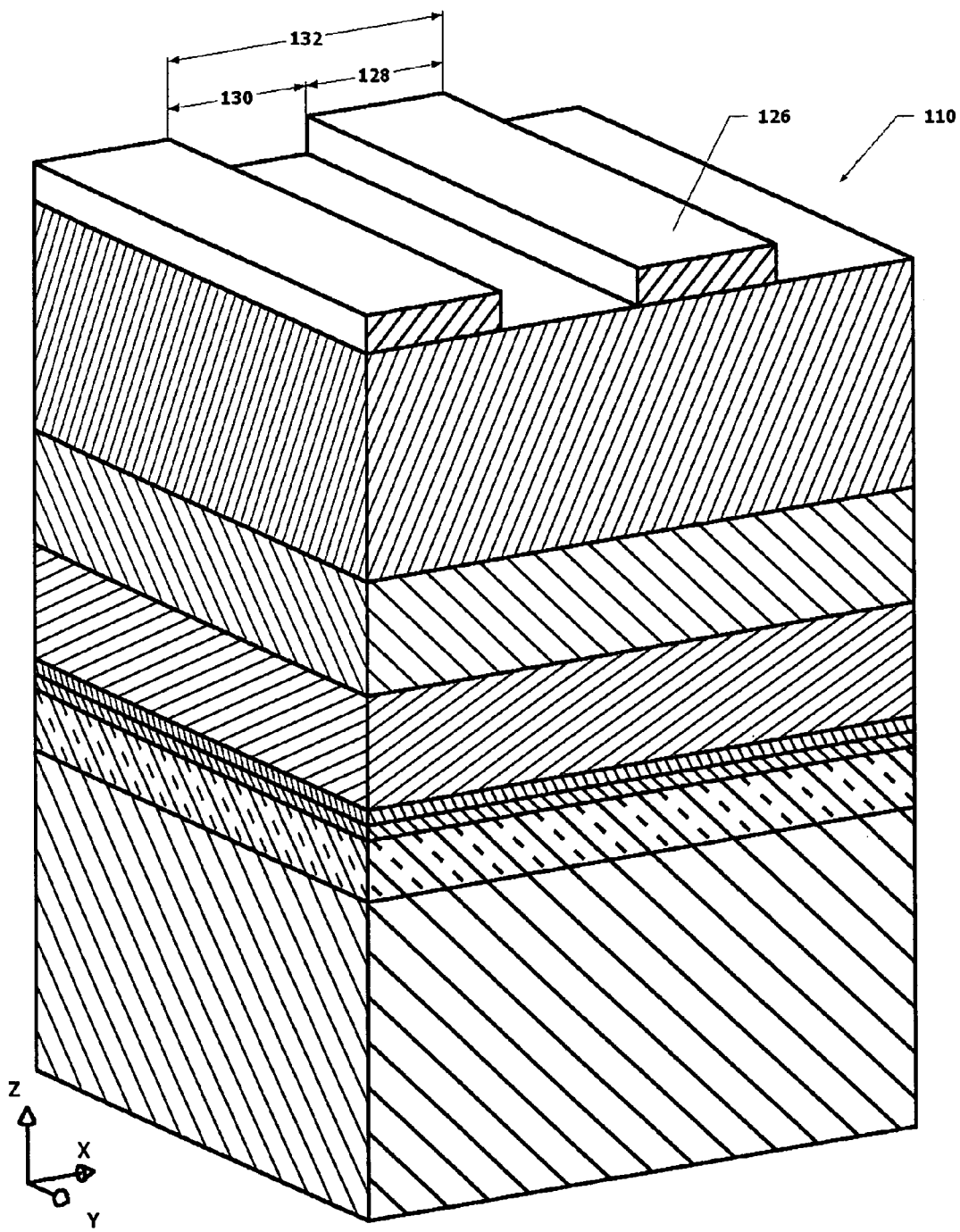

Next, a column mask 126 may be formed, as illustrated by FIG. 3. (The term "column" does not refer to any particular horizontal direction on the substrate 110 other than a direction that is different from the direction that subsequently-introduced rows extend.) The column mask 126 may include a pattern of lines that define masked regions having a width 128 and exposed regions having a width 130. The widths 128 and 130 may be generally equal to each other and each generally equal to the lithographic-resolution limit (e.g., the photolithographic-resolution limit, or minimum feature size), referred to as "F." The column mask 126 may have a pitch 132 (e.g., a distance over which a pattern repeats) that is generally equal to 2 F. The lines formed by the column mask 126 may be generally straight, generally parallel to each other, and may generally extend in the Y-direction. These lines may be generally continuous and generally uniform in the Y-direction. In other embodiments, though, the lines formed by the column mask 126 may have other shapes, e.g., they may undulate (e.g., up and down, left and right, or both), they may vary in width in the Y-direction, or they may be formed from a plurality of shorter segments.

Figure 4:
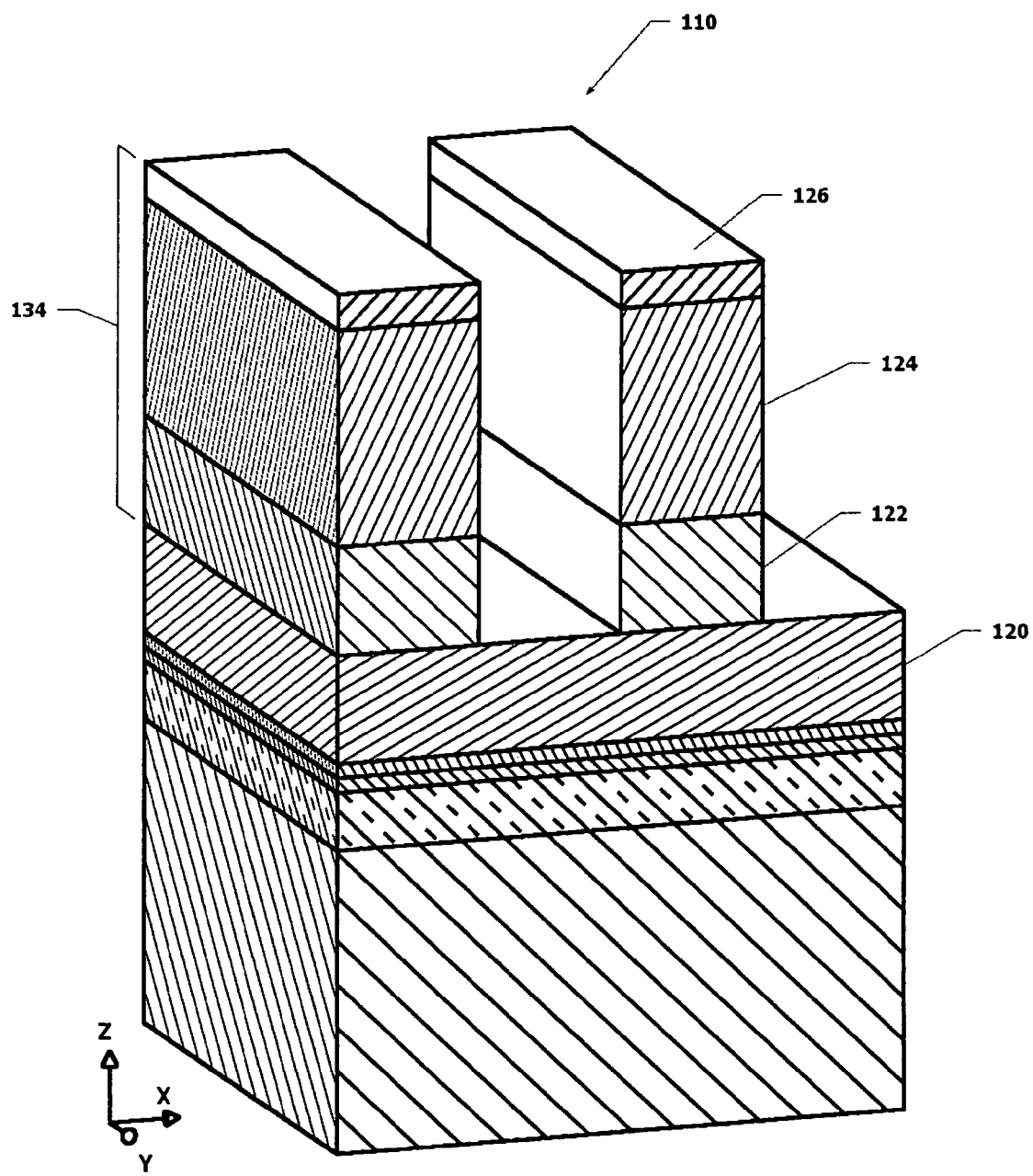

After forming the column mask 126, a column hard mask 134 may be formed, as illustrated by FIG. 4. The column hard mask 134 may be formed by generally-anisotropically etching (e.g., with a directional plasma etch) the portion of the upper masking body 124 and the portion of the lower masking body 122 that are disposed under the region not covered by the column mask 126. In some embodiments, the etch may stop on or in the sacrificial body 120.

Figure 5:
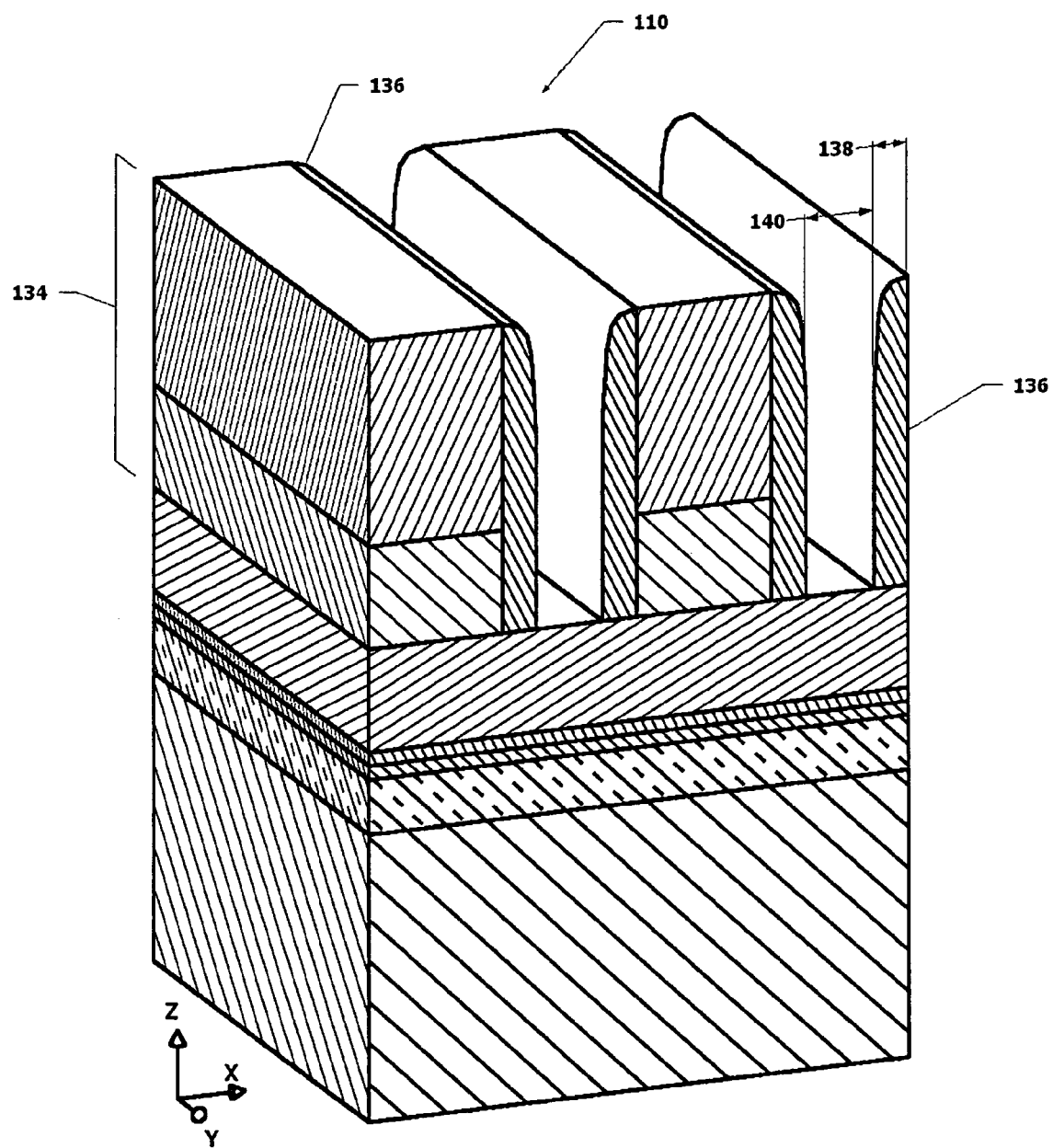

Next, the column mask 126 may be removed, and the column spacers 136 may be formed on the sidewalls of the column hard mask 134, as illustrated by FIG. 5. The column spacers 136 may be formed by depositing a generally conformal film (e.g., a film that is of generally uniform thickness on both vertical and horizontal structures) and, then, anisotropically etching that film to remove it from horizontal surfaces, leaving material disposed against generally vertical surfaces on the substrate 110. The column spacers 136 may be made of an oxide, and they may have a width 138 that is less than 100 nm, e.g., less than or equal to about 36 nm. The column spacers 136 may narrow the area exposed by the column hard mask 134 to a width 140 that is less than or equal to F, e.g., generally equal to or less than ¾ F, ½ F, or ¼ F.

Figure 6:
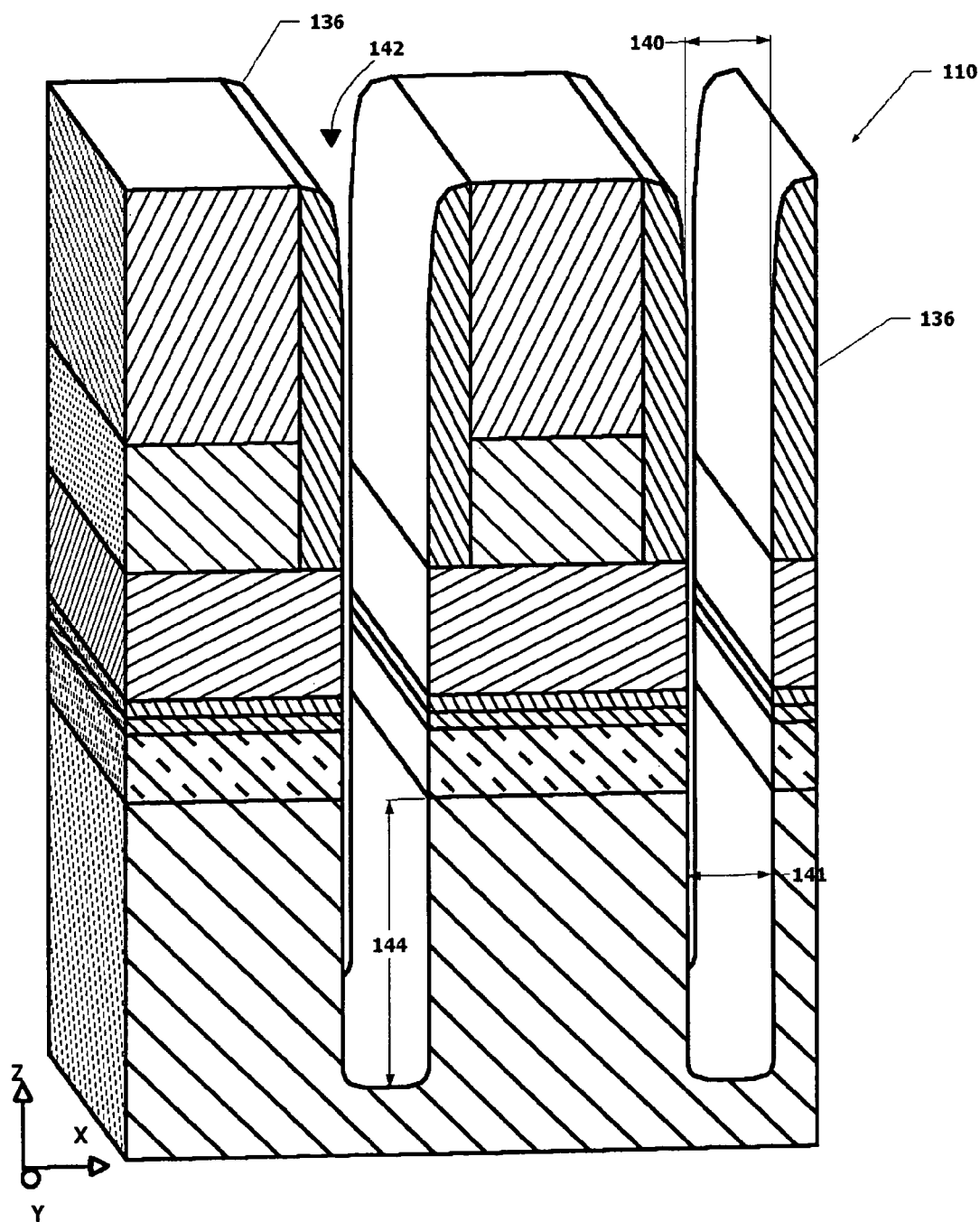

Next, as illustrated by FIG. 6, column isolation trenches 142 may be formed. The column isolation trenches 142 may be formed by generally anisotropically etching the exposed regions between the column spacers 136. The column isolation trenches 142 may have a width 141 that corresponds to (e.g., is generally equal to or is proportional to) the width 140. The column isolation trenches 142 may generally extend in the Y-direction and may be generally parallel to each other and generally straight. The cross-sectional shape of the column isolation trenches 142 may be generally uniform in the Y-direction. In some embodiments, the column isolation trenches 142 may have a depth 144 that is between about 500 Å and about 5000 Å, e.g., about 2500 Å.

Figure 7:
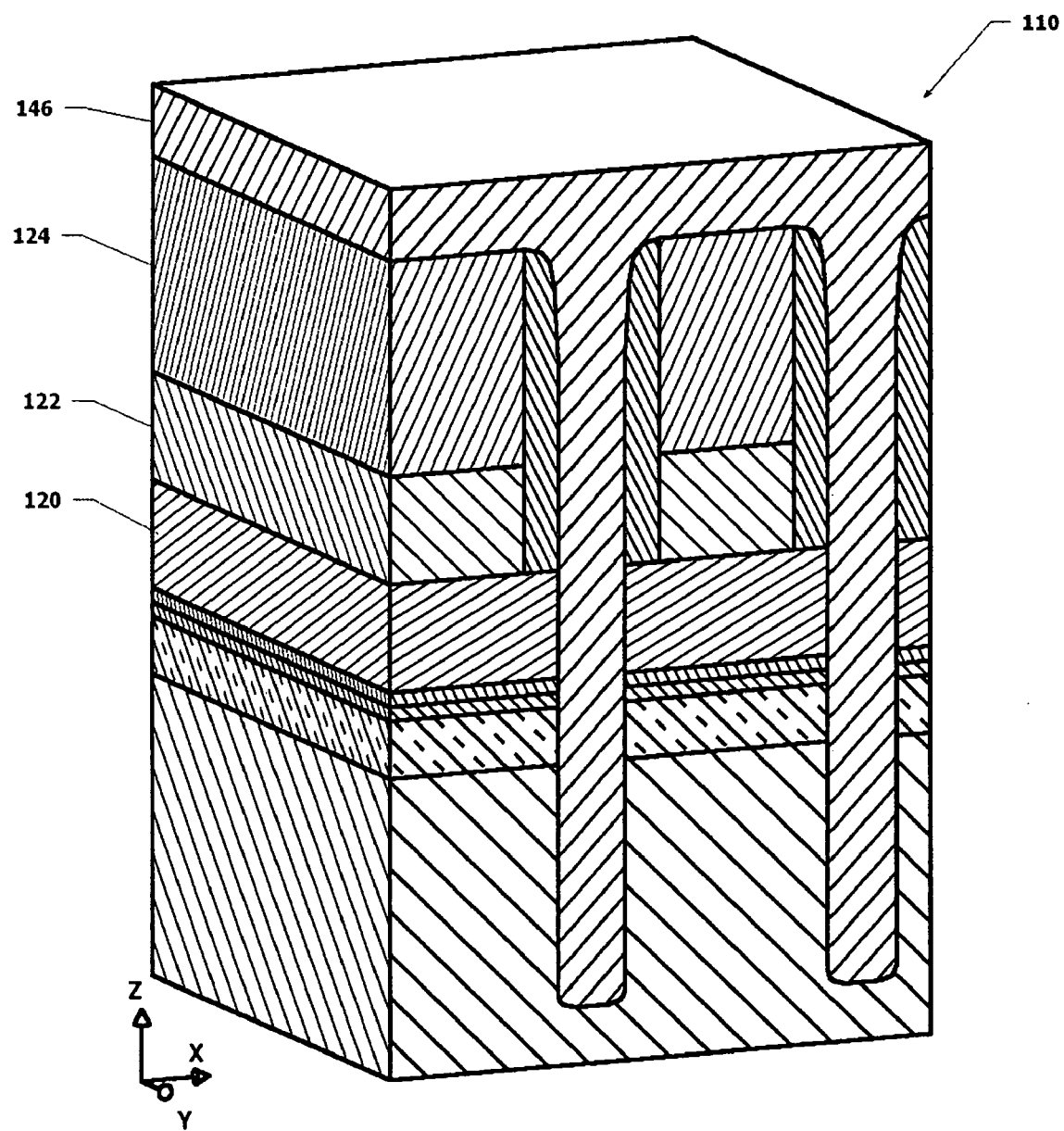

After forming the column isolation trenches 142, they may be filled partially or entirely with a dielectric 146, as illustrated by FIG. 7. The dielectric 146 may be made of a variety of materials, such as an oxide, and it may be lined with a variety of liner films (not shown), such as an oxide liner and a nitride liner. The dielectric 146 may be formed with a variety of processes, such as a high-density plasma CVD process. In some embodiments, prior to forming the dielectric 146, the bottom of the column isolation trenches 142 may be implanted or diffused with a dopant (not shown) selected to further electrically isolate structures on opposing sides of the column isolation trenches 142.

Figure 8:
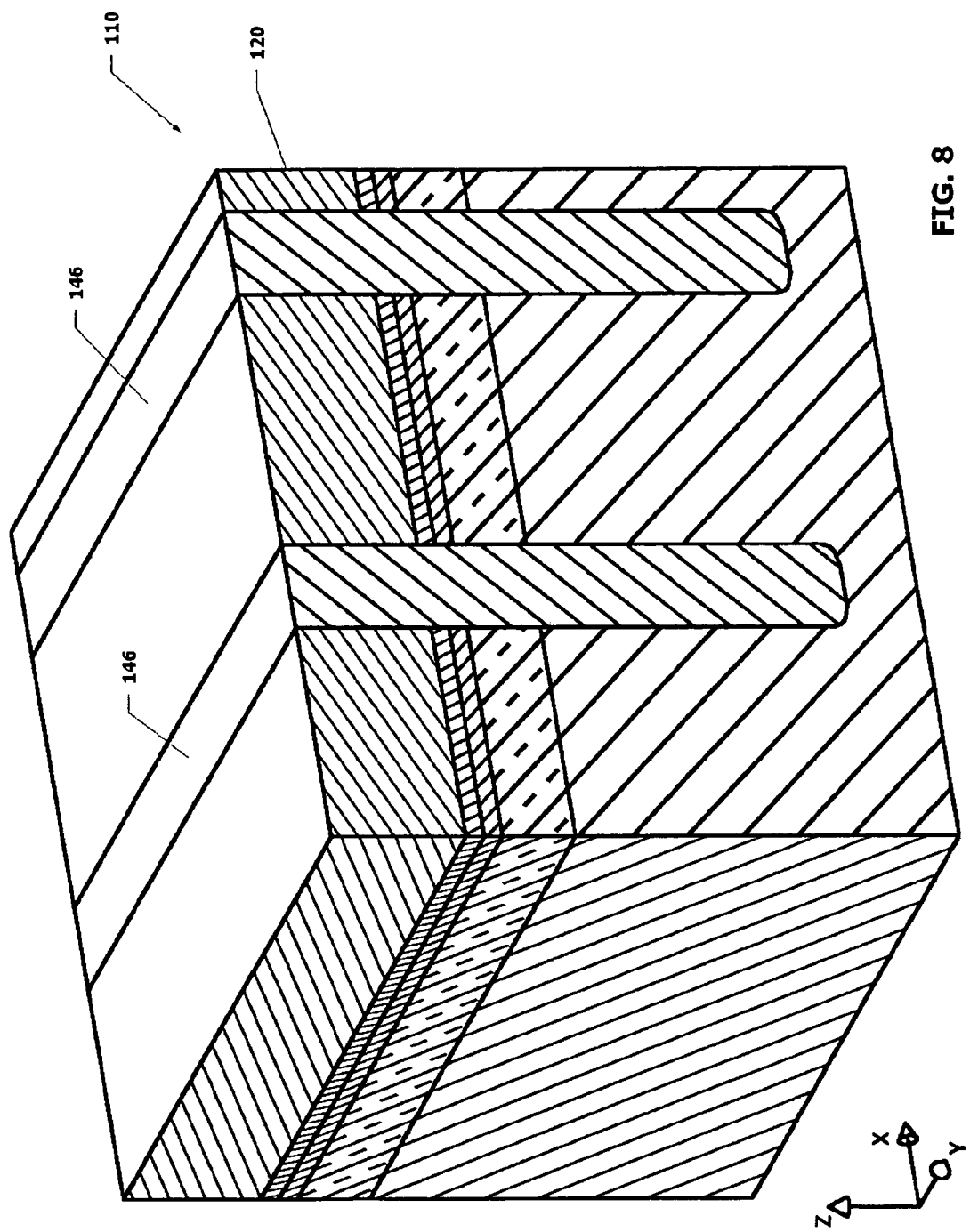

Next, the substrate 110 may be planarized, as illustrated by FIG. 8. Planarizing the substrate 110 may include etching the substrate 110 or polishing the substrate with chemical-mechanical planarization (CMP). Planarization may include removing both the upper masking body 124 and the lower masking body 122, and planarization may stop on or in the sacrificial body 120. Additionally, an upper portion of the dielectric 146 may be removed.

Figure 9:
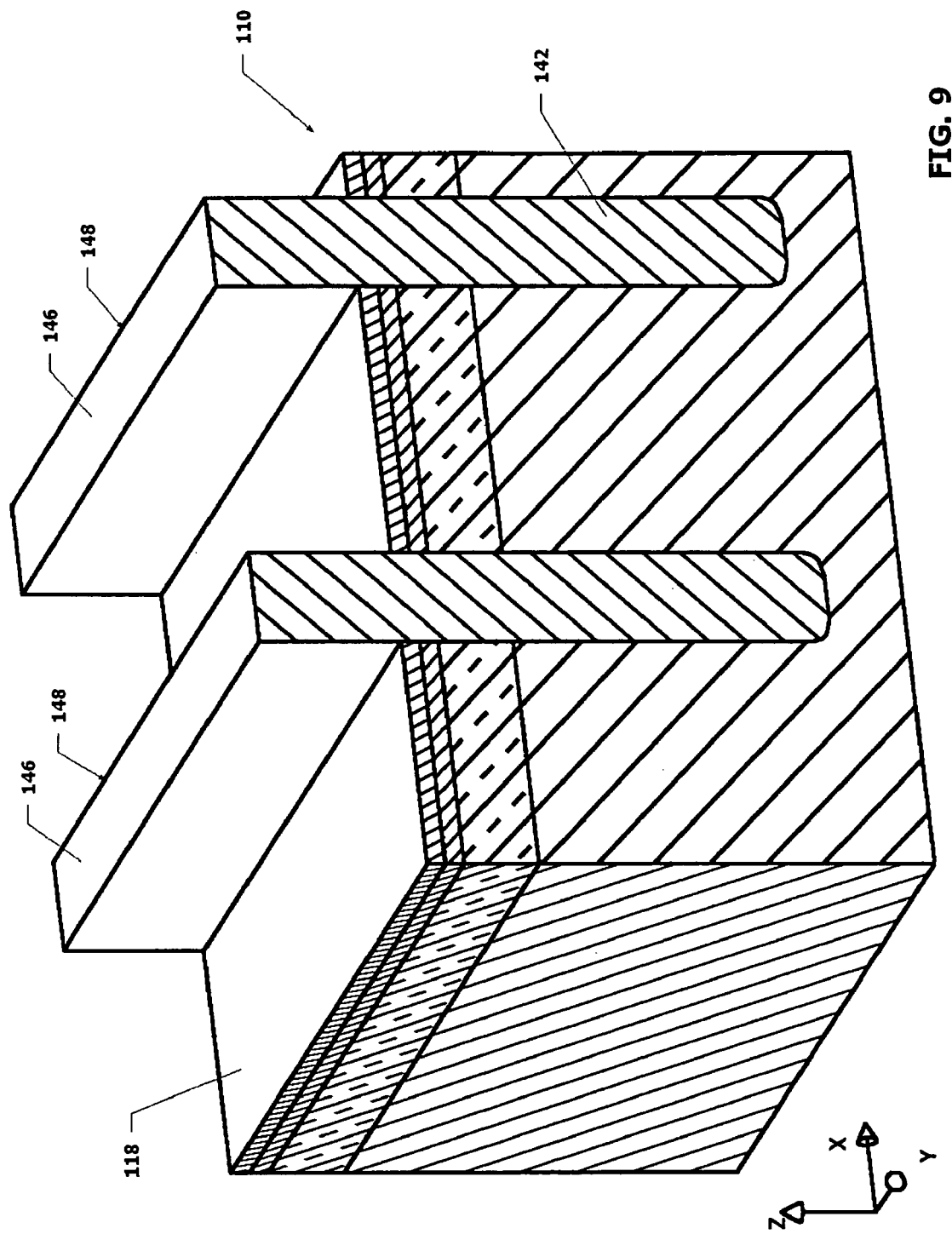

Next, the sacrificial body 120 may be partially or entirely removed, as illustrated by FIG. 9. Removing the sacrificial body 120 may include wet etching or dry etching the substrate 110 with an etch that selectively etches the sacrificial body 120 without removing a substantial portion of the exposed dielectric 146, i.e., with an etch that is selective to the sacrificial body 120. An etch is said to be "selective to" a material if the etch removes that material without removing a substantial amount of other types of material exposed on the substrate. After removing the sacrificial body 120, generally vertical projections 148 formed by the dielectric 146 may extend from the substrate 110.

Figure 10:
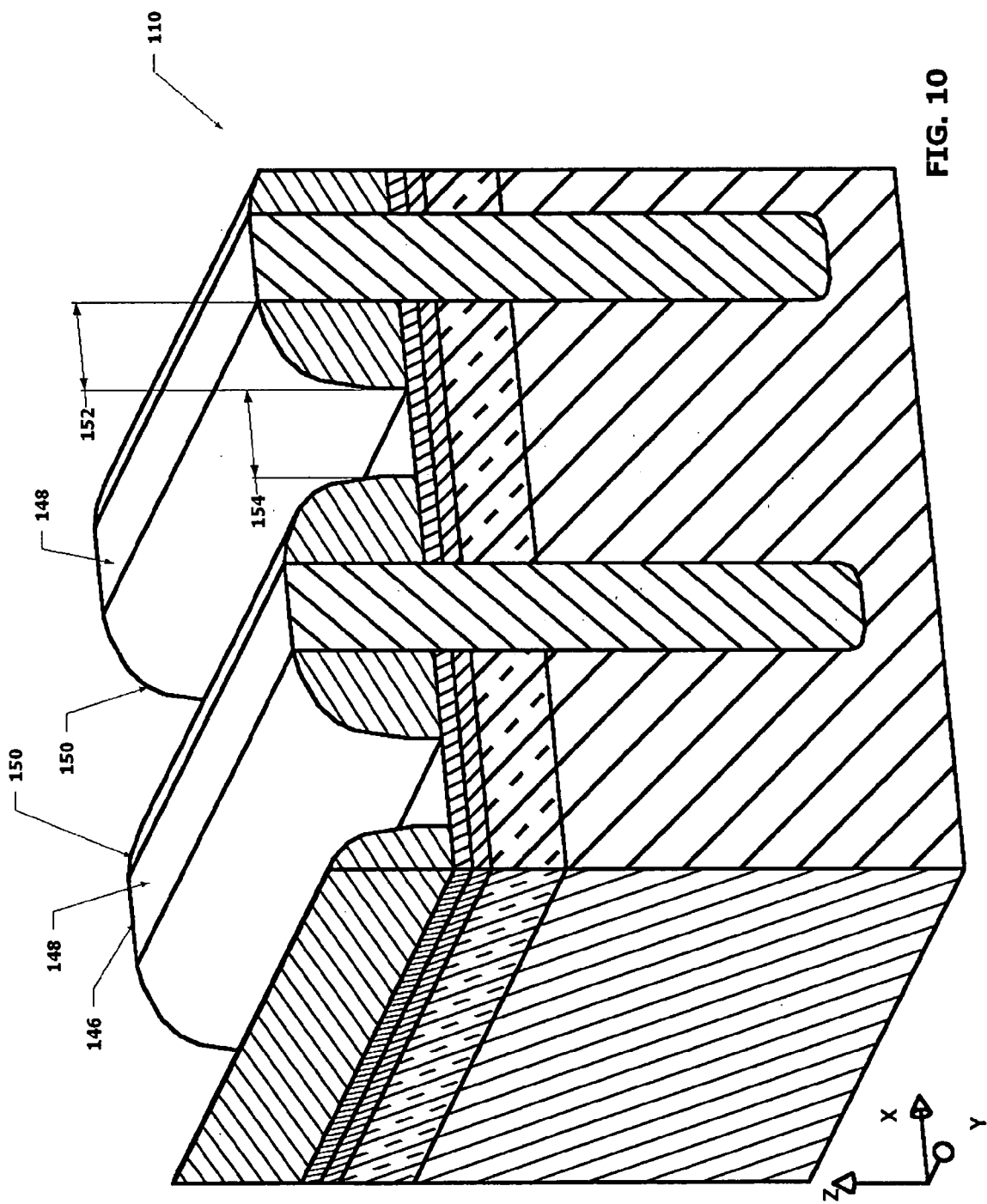

Next, a second spacer 150 may be formed on the sidewalls of the generally vertical projections 148 of dielectric 146, as illustrated by FIG. 10. As with the previously-described column spacers 136, the second column spacers 150 may be formed by depositing a generally conformal film on the substrate 110 and anisotropically etching the film until the film is generally removed from the horizontal surfaces, leaving the material on the vertical surfaces on the substrate 110. The second column spacers 150 may be made of the same material as the dielectric 146, e.g., an oxide, or they may be made of a different material. The second column spacers 150 may have a width 152 that is less than or generally equal to 100 nm, e.g., less than or generally equal to 36 nm. The spacers 150 may define a width 154 between adjacent spacers 150 that is generally less than or equal to 1 F, ¾ F, ½ F, or ¼ F.

Figure 11:
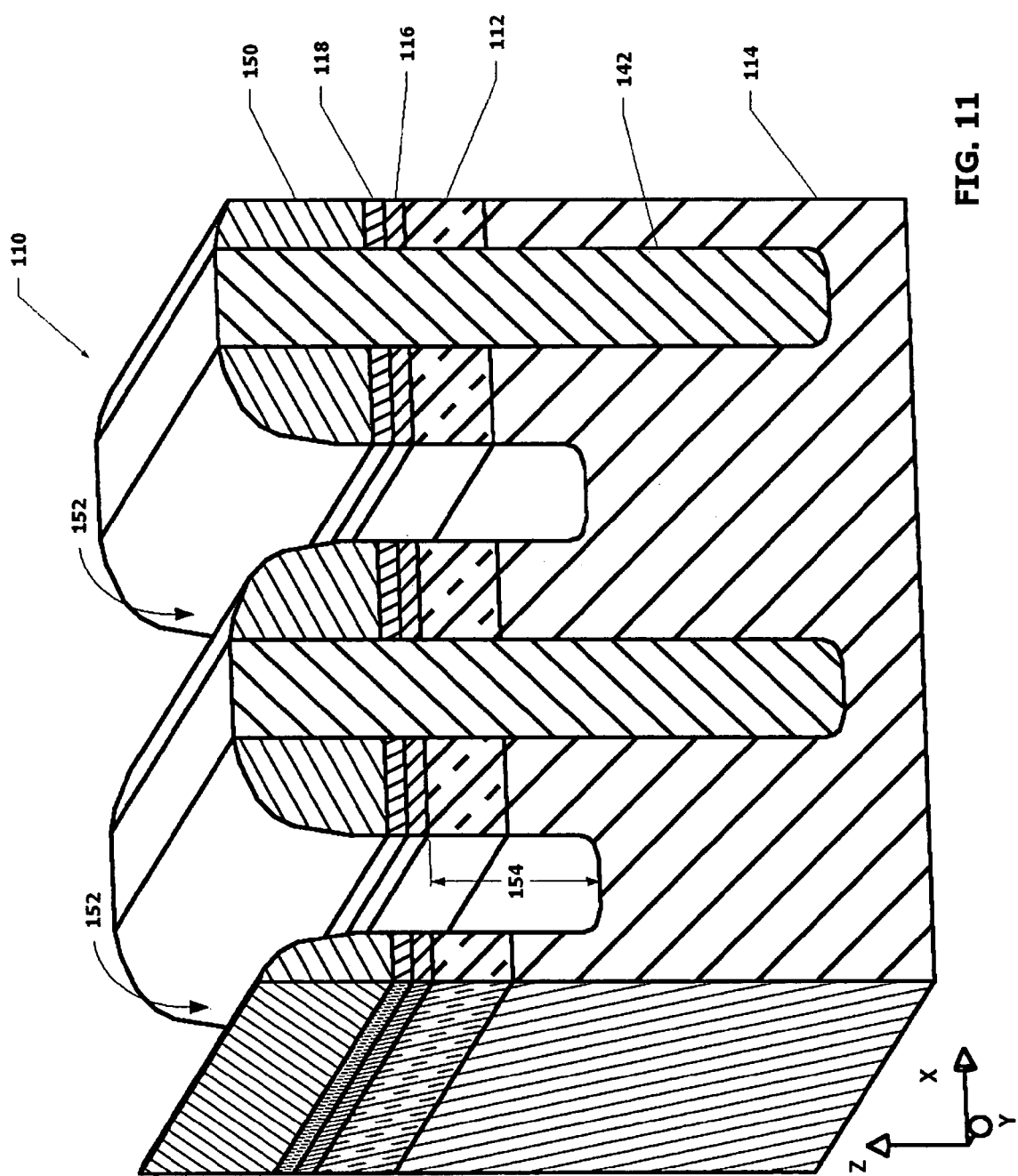

After forming the second group of column spaces 150, an intra-device trench 152 may be formed, as illustrated by FIG. 11. The intra-device trench 152 may be formed by generally anisotropically etching the exposed regions between the second column spacers 150. The intra-device trenches 152 may be generally parallel to each other and the column isolation trenches 142, and they may generally extend in the Y-direction. The intra-device trenches 152 may have a depth 154 that is both less than the depth 144 (FIG. 6) of the column isolation trenches 142 and greater than the depth of the upper doped region 112.

Figure 12:
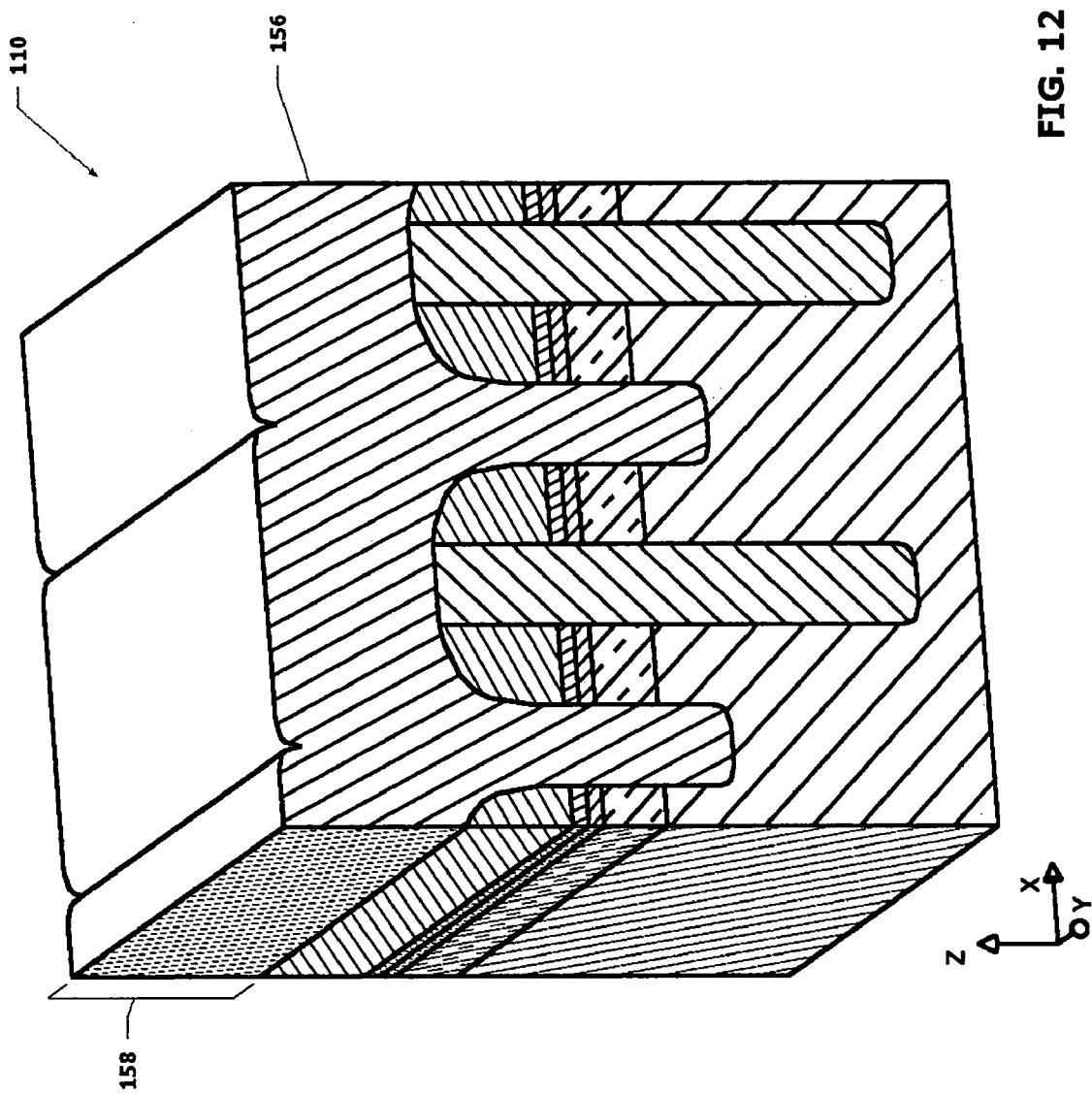

Next, a dielectric 156 may be formed, as illustrated by FIG. 12. The dielectric 156 may be formed with a thickness that produces an overburden 158, increasing the likelihood that the intra-device trenches 152 are filled. For example, the dielectric 156 may have a thickness less than about 800 Å, e.g., less than or equal to about 400 Å. The dielectric 156 may include or be formed primarily with tetra-ethyl-ortho silane (TEOS), e.g., with TEOS CVD, or other appropriate dielectric materials. The dielectric 156 may be densified after being formed by heating the substrate 110 to drive volatile compounds from the dielectric 156.

Figure 13:
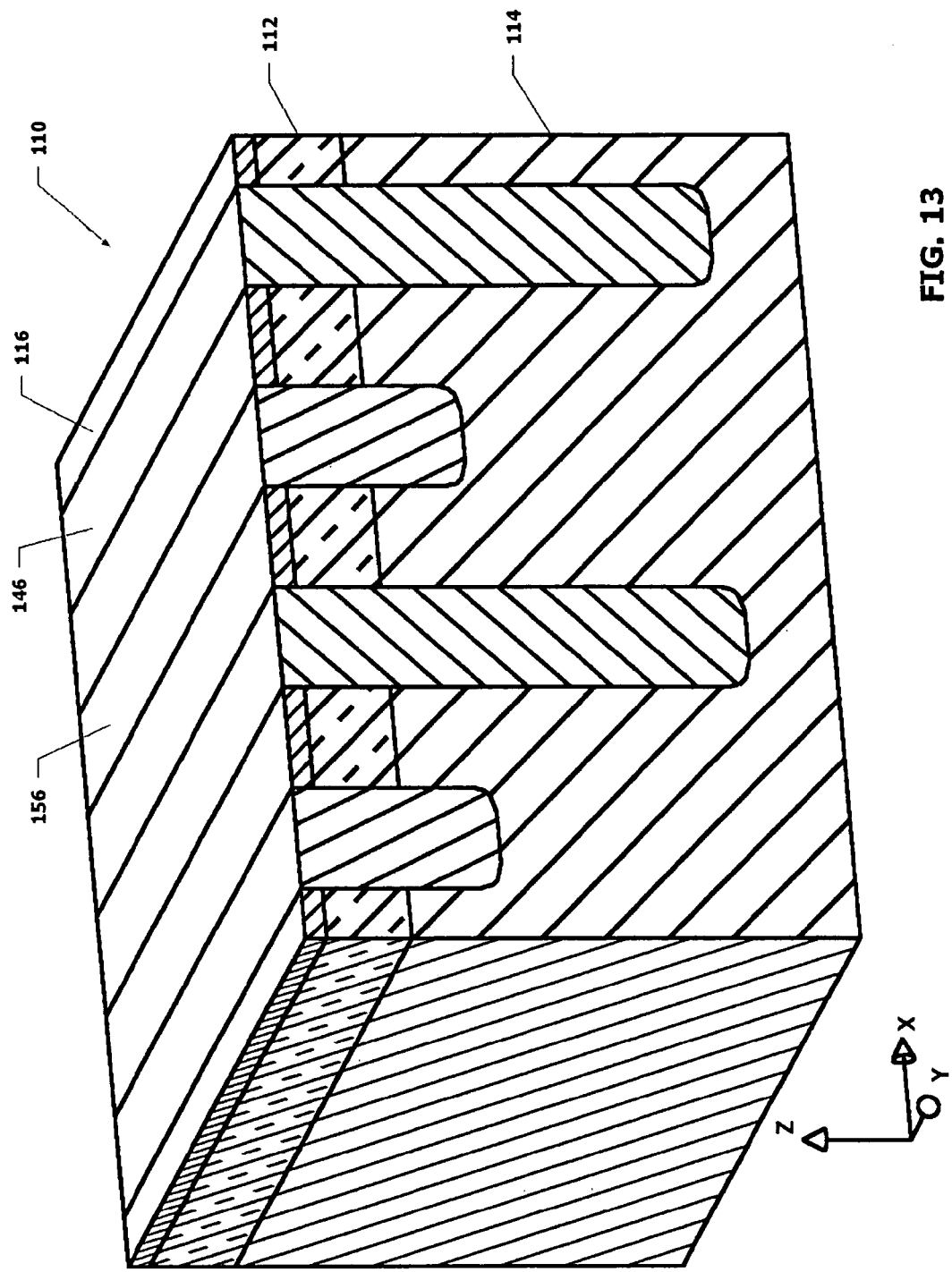

After forming the dielectric 156, the substrate 110 may be planarized, as illustrated by FIG. 13. The substrate 110 may be planarized with CMP, an etch-back process (e.g., by depositing a sacrificial planarizing material and then etching through the sacrificial planarizing material and into underlying structures), or other appropriate processes. The stop body 118 (FIG. 2) may function as a planarization stop, impeding removal of material from the upper doped region 112 and the pad oxide 116. After planarization, the material from the stop body 118 remaining on the substrate 110 may be removed, e.g., with a wet etch that stops in the pad oxide 116 or the upper doped region 112.

Figure 14:
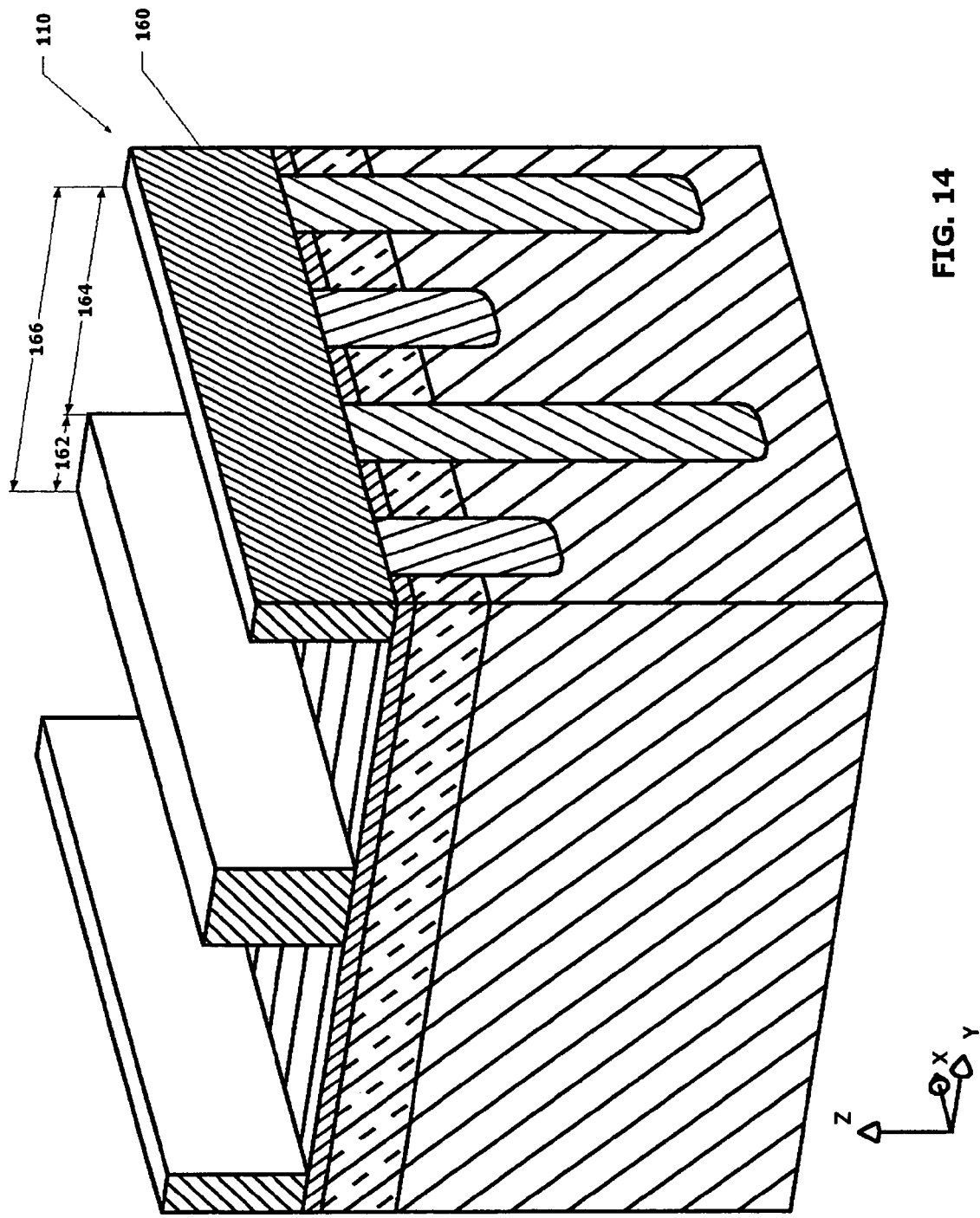

Next, a row mask 160 may be formed, as illustrated by FIG. 14. The row mask 160 may be generally perpendicular to the column mask 126 (FIG. 4). The row mask 160 may be formed with photoresist or it may be a hard mask, for example, and it may be patterned with photolithography or other lithographic processes, e.g., nano-imprint lithography or electron-beam lithography. For example, the row mask 160 may be formed by patterning a body of amorphous carbon that is formed on the substrate 110. The amorphous carbon may be formed with a thickness less than about 3000 Å, e.g., a thickness less than or equal to about 2000 Å. The row mask 160 may define masked regions having a width 162 and exposed regions having a width 164. In some embodiments, the row mask 160 may be formed with a sub-photolithographic process, e.g., a sidewall-spacer process, a resist-reflow process, or a line-width thinning process. The widths 162 or 164 may be generally equal to or less than F, ¾ F, or ½ F. The row mask 160 may define a repeating pattern of lines with a pitch 166, or in some embodiments, the pattern may be interrupted by other structures. The masked regions of the row mask 160 may be generally straight, generally parallel to one another, and may generally extend in the X-direction. In other embodiments, the masked regions of the row mask 160 may undulate side to side or up and down, or they may be segmented.

Figure 15:
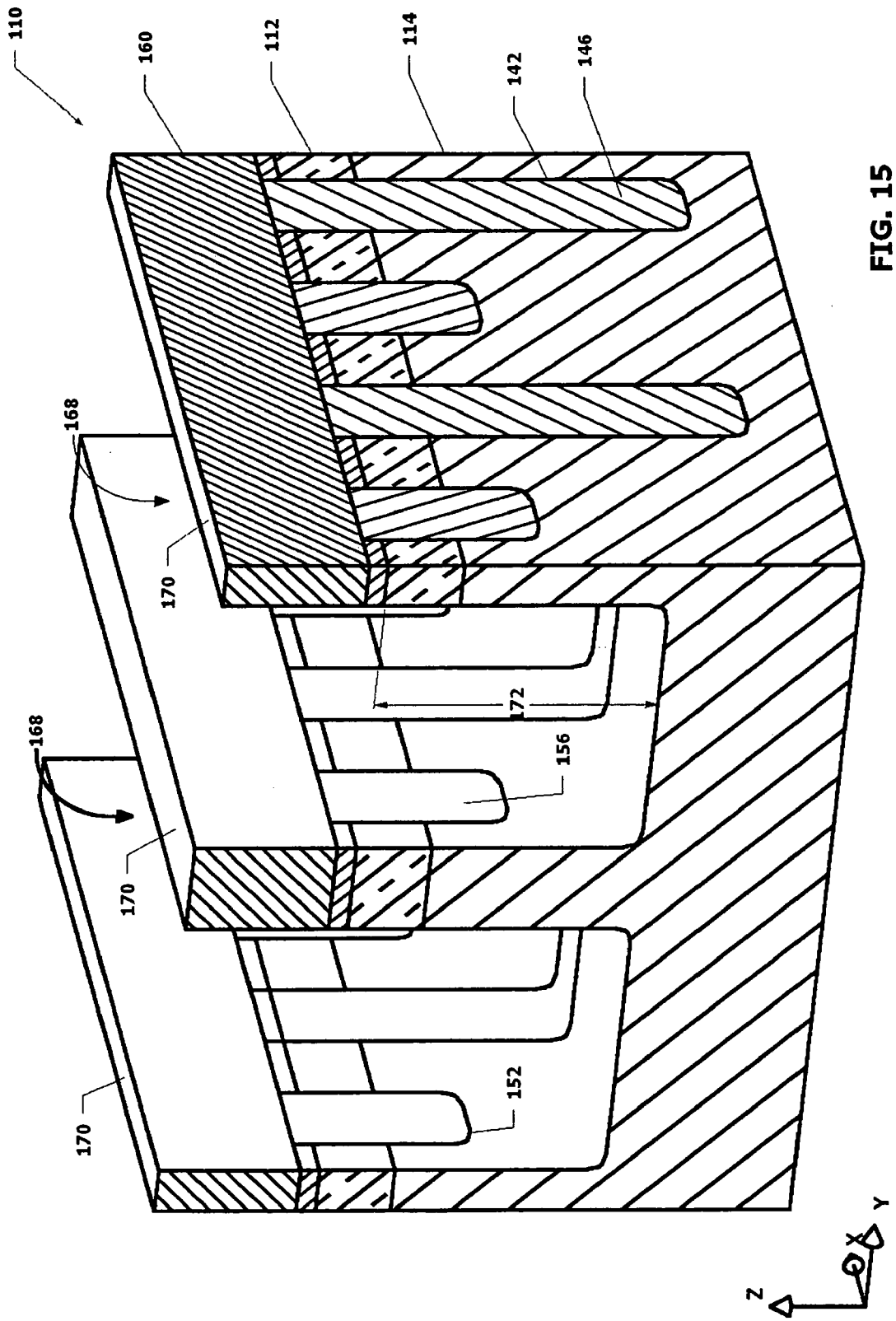

Next, row trenches 168 may be formed, as illustrated by FIG. 15. The row trenches 168 may define fin rows 170 disposed under the masked region of the row mask 160. The row trenches 168 may be formed with a dry etch that etches the upper doped region 112, the lower doped region 114, the dielectric 146, and the dielectric 156 at generally the same rate. The row trenches 168 may have a depth 172 that is greater than the depth of the intra-device trenches 152 (FIG. 11) and less than a depth of the column isolation trenches 142 (FIG. 11). The depth 172 may be less than about 3000 Å, e.g., equal to or less than about 1400 Å.

Figure 16:
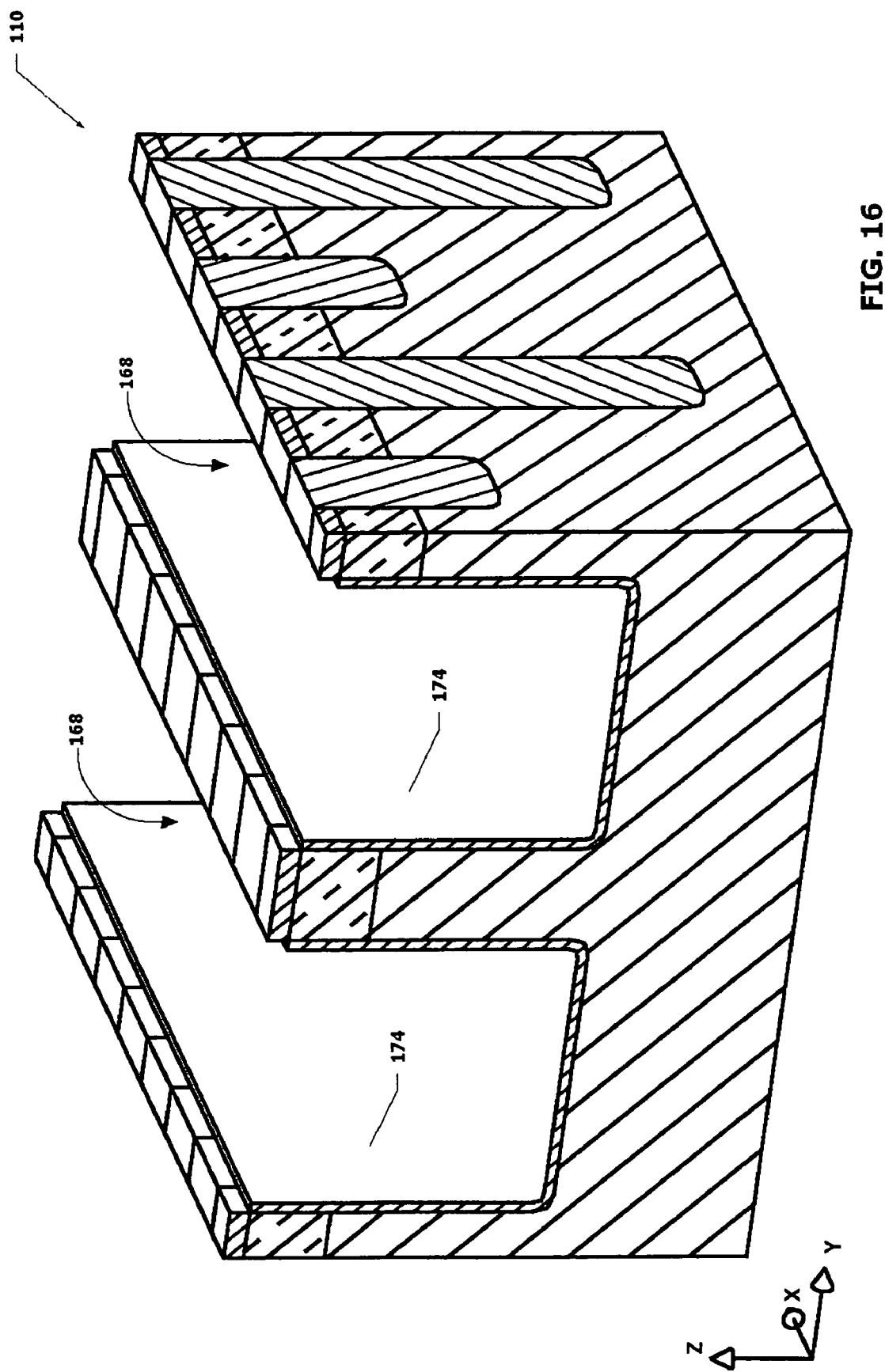

A gate dielectric 174 may be formed in the row trenches 168, as illustrated by FIG. 16. The gate dielectric 174 may be deposited, grown, or otherwise formed, and it may substantially or entirely cover the exposed portions of the upper doped region 112 and the lower doped region 114. The gate dielectric 174 may include a variety of dielectric materials, such as oxide (e.g., silicon dioxide), oxynitride, or high-dielectric constant materials like hafnium dioxide, zirconium dioxide, and titanium dioxide. The gate dielectric 174 may have a thickness less than about 60 Å, e.g., a thickness equal to or less than about 40 Å.

Figure 17:
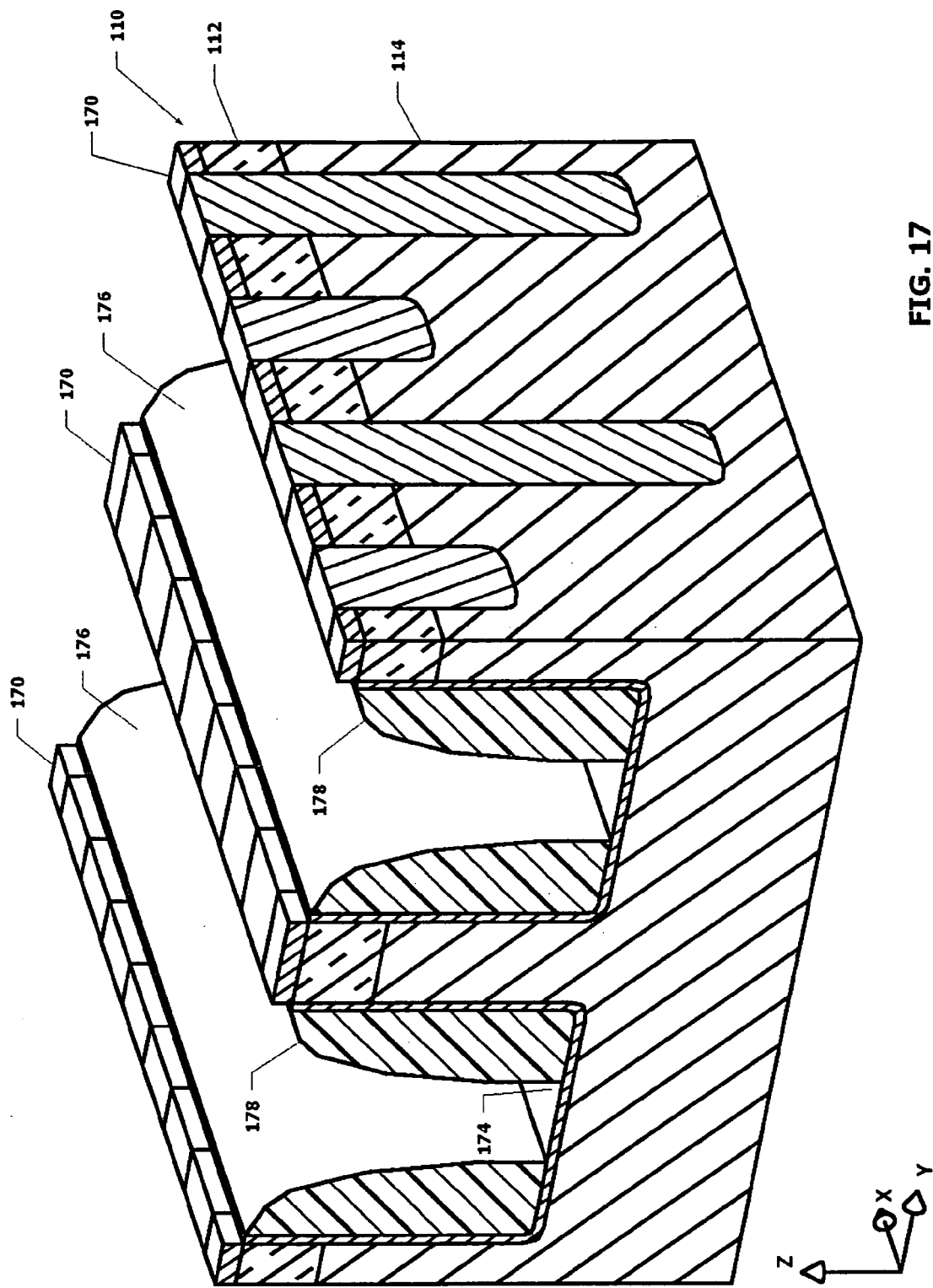

Next, gates 176 and 178 may be formed on either side of the fin rows 170, as illustrated by FIG. 17. The gates 176 and 178 may connect to one another, e.g., by wrapping around the ends (not shown) of the fin rows 170, or they may be electrically independent. The gates 176 and 178 may partially or substantially entirely overlap the upper doped region 112. The gates 176 and 178 may be sidewall spacers formed by depositing a conductive film on the substrate 110 and, then, anisotropically etching the conductive film until the conductive film is generally removed from horizontal surfaces, leaving conductive material disposed against generally vertical surfaces. For example, the gates 176 and 178 may include TiN, Ru, or other appropriate conductive materials. In some embodiments, after depositing the conductive material, but before etching the material to form spacers, a protective body may be formed on the conductive material. Examples of a protective body include a high-aspect-ratio-process (HARP) oxide formed on the conductive material. The conductive material may be less than about 400 Å thick, e.g., less than or equal to about 250 Å thick, and the protective body may be less than about 200 Å thick, e.g., equal to or less than about 150 Å. If a protective body is used, the protective body may be anisotropically etched, e.g., dry etched, to expose generally horizontal portions of the conductive material, and the exposed portions of the conductive material may then be dry etched or wet etched, e.g., with an SCI etch for less than 10 minutes, e.g., generally equal to or less than five minutes. After removing the exposed portions of the conductive material, the remaining portion of the protective body 118 may be removed with another etch that selectively removes the protective body, while leaving a substantial portion of the conductive material disposed against the sidewalls of the fin rows 170.

Figure 18:
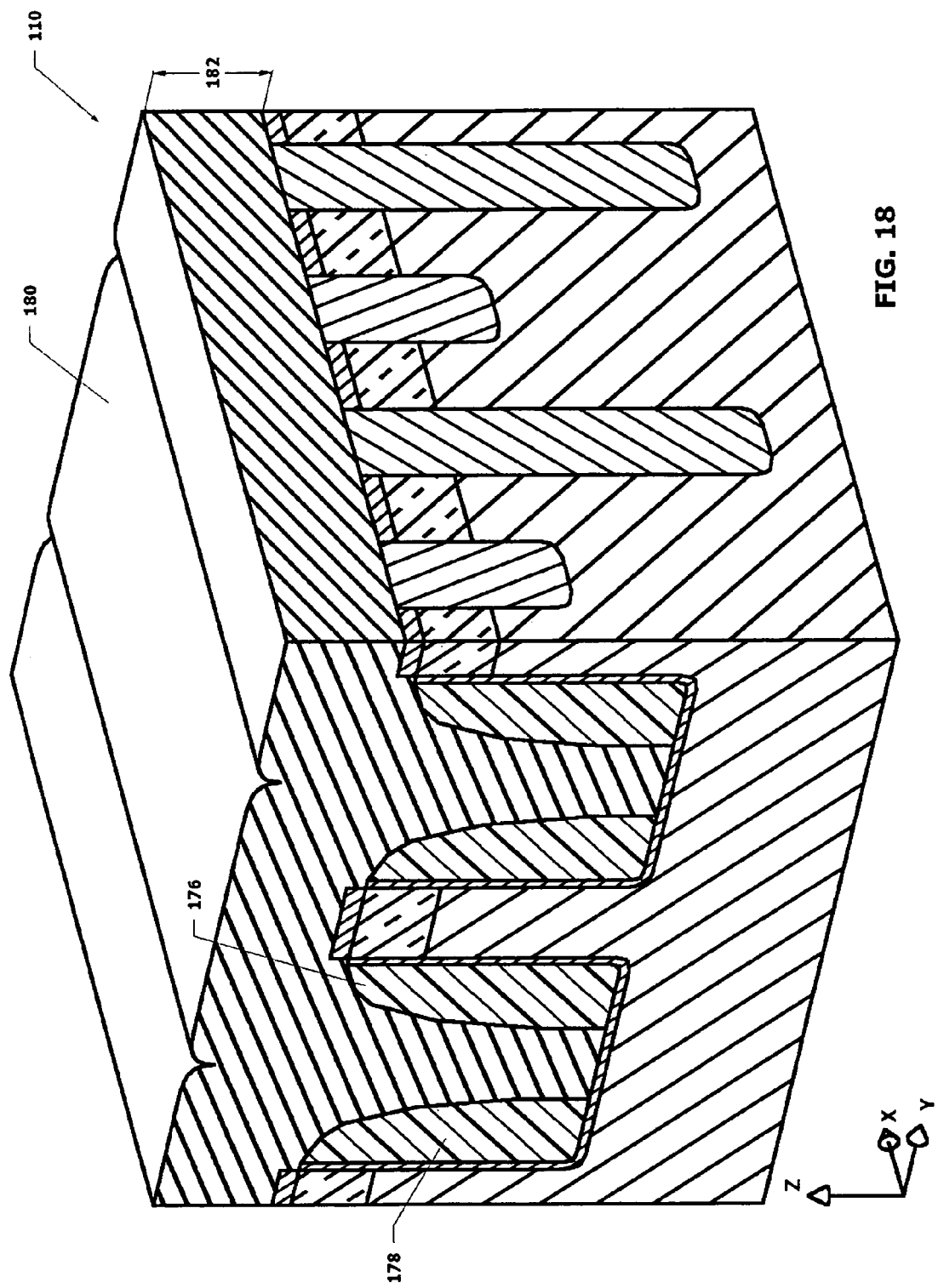

After forming the gates 176 and 178, a dielectric 180 may be formed on the substrate 110, as illustrated by FIG. 18. The dielectric 180 may be formed with an overburden 182 to increase the likelihood of covering the gates 176 and 178 over a substantial portion of the substrate 110. The dielectric 180 may include an oxide formed with TEOS CVD or other appropriate materials. In some embodiments, the dielectric 180 is formed with a thickness of less than about 1500 Å, e.g., equal to or less than about 1000 Å.

Figure 19:
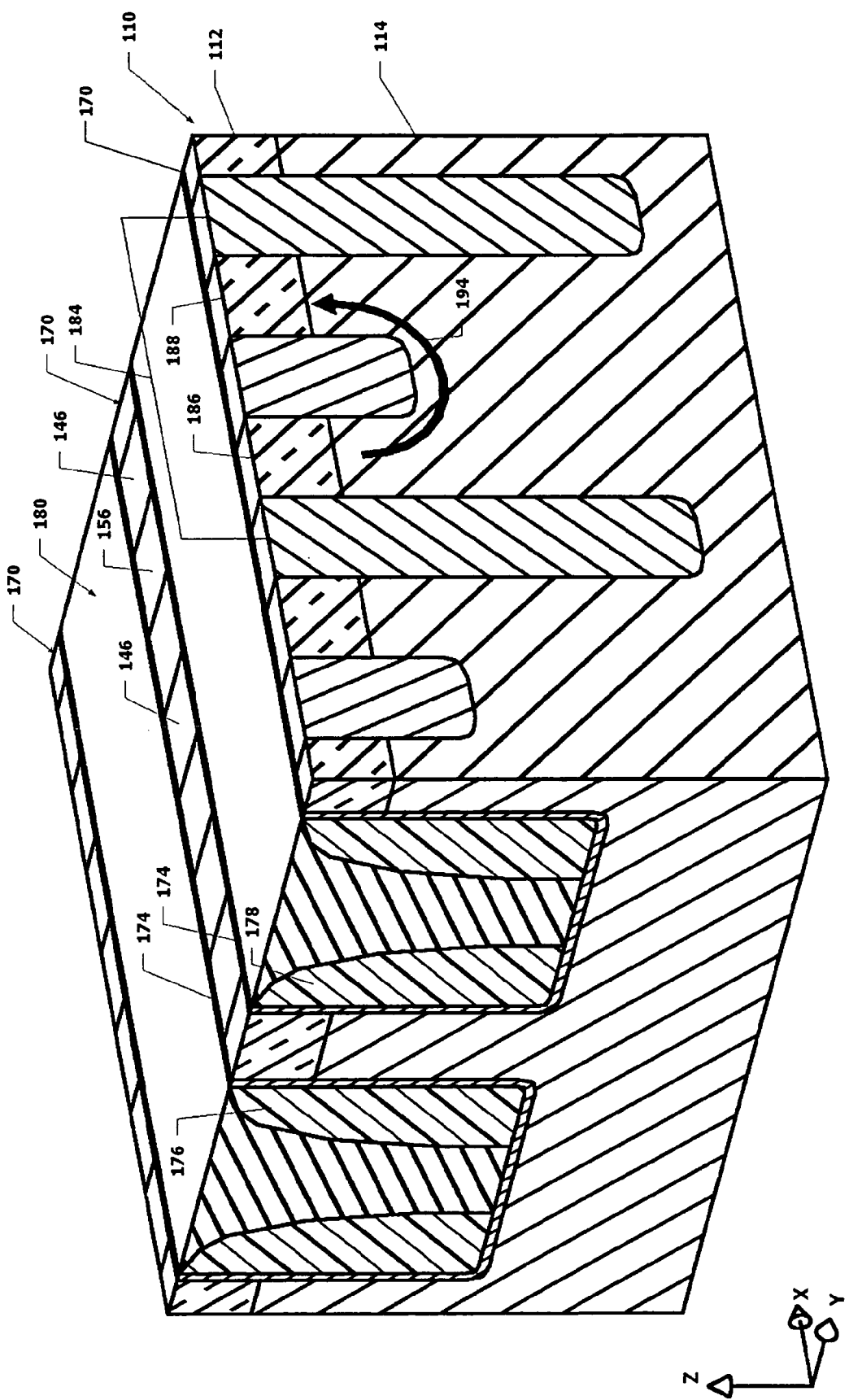

Next, the substrate 110 may be planarized, as illustrated by FIG. 19. Planarization may include processing the substrate 110 with a CMP process, an etch-back process, or other processes that planarize. The planarization process may stop on or in the upper doped region 112, removing the overburden 182 of the dielectric 180.

As illustrated by FIG. 19, a plurality of transistors 184 may be formed on the substrate 110. Each of the fin rows 170 may include a plurality of transistors 184. The transistors 184 on a given fin row 170 may be isolated from one another by the dielectric 146. The transistors 184 in adjacent fin rows 170 may be isolated from one another by the dielectric 180. Each of the transistors 184 may include one or both of the gates 176 and 178 disposed on either side of the fin rows 170. The illustrated transistors 184 may be referred to as multi-gate transistors or dual-gate transistors. Other embodiments may include transistors with more than two gates or fewer than two gates.

Figure 20:
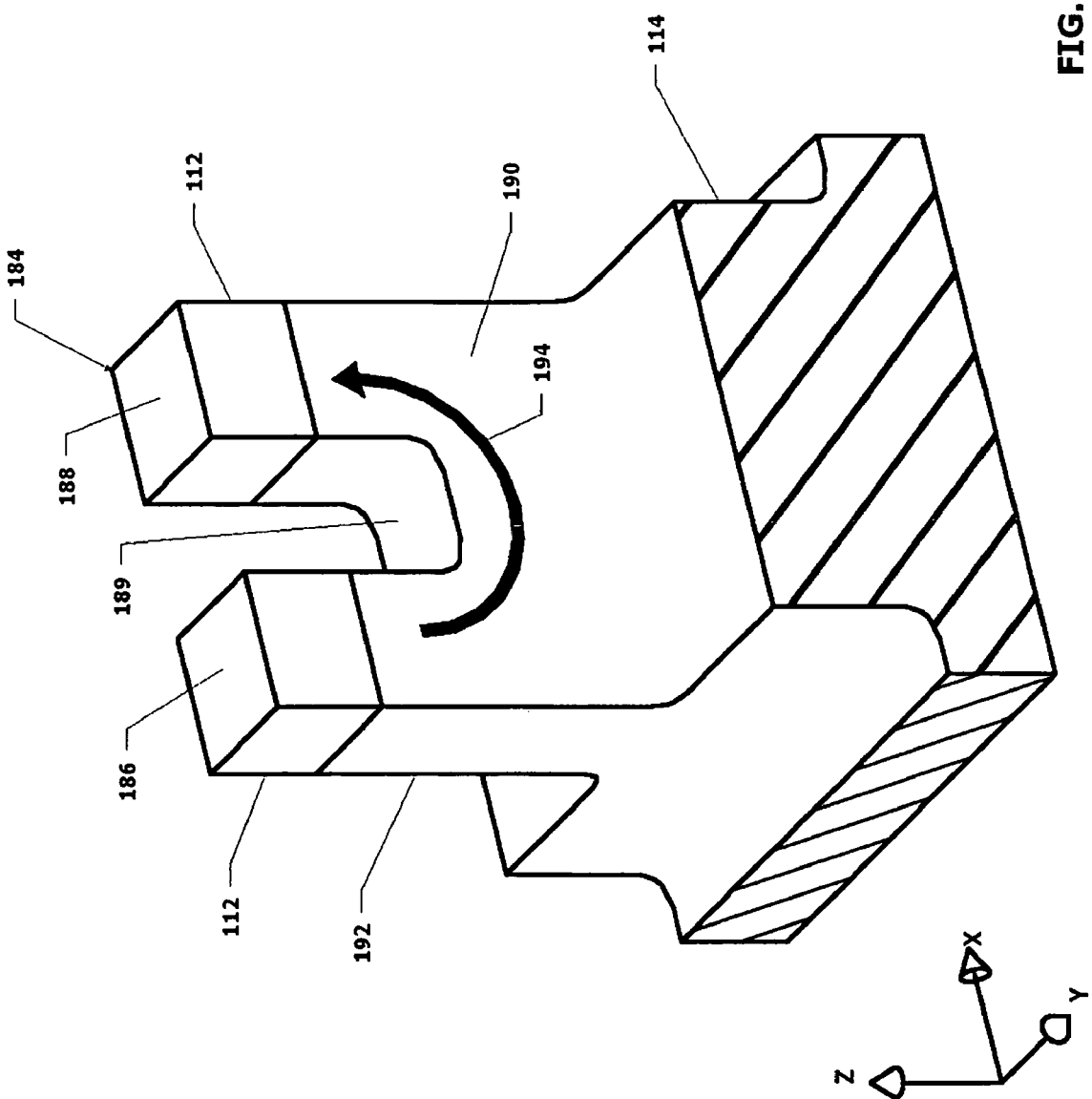

FIG. 20 illustrates the semiconductive portion of an example of a single transistor 184. The transistor 184 includes two legs 186 and 188 separated by a notch 189 (corresponding to trench 152 in FIG. 11). The distal portion of each of the legs 186 and 188 may be formed by the upper doped region 112, and the lower portion of the legs 186 and 188 may be formed by the lower doped region 114. The transistor 184 may generally define a fin with opposite faces 190 and 192.

In operation, the transistor 184 may establish a conductive channel 194 extending between the legs 186 and 188. This channel 194 may be formed in response to electric fields emanating from the gates 176 and 178 (FIG. 19). Both of the gates 176 and 178 may be held at generally the same voltage, or they may be controlled independently. The channel 194 may extend between the upper doped region 112 of the leg 186 and the upper doped region 112 of the leg 188, wrapping around the notch 189. The channel 194 may include a generally horizontal component under the notch 189 and generally vertical components along each of the legs 186 and 188. When both of the gates 176 and 178 are energized, the channel 194 may be formed adjacent both of the faces 190 and 192 of the transistor 184 or one of the faces 190 or 192.

Figure 21:
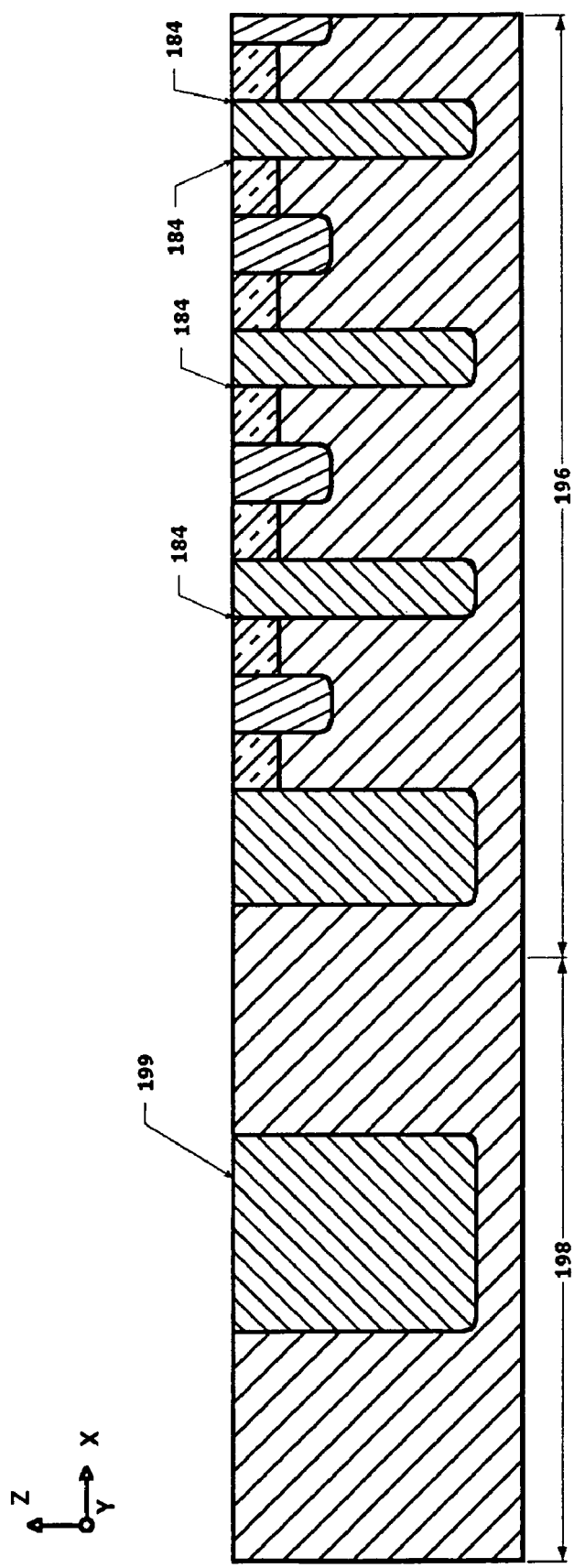
FIGS. 21-52 illustrate an example of a process for forming connections to the array of FIGS. 1-20 and for forming a gate of periphery transistors.

FIGS. 21-52 illustrate an example of a process for forming both connections to the transistors 184 and gates in a periphery area. As illustrated by FIG. 21, the above-described process may produce an array 196 and a periphery 198 on the substrate 110. The array 196 may include a plurality of the previously described transistors 184 arranged in a pattern, e.g., a rectangular or hexagon lattice. The periphery 198 may generally surround the array 196 or be disposed near a portion of the array 196, e.g., near one or more sides of the array 196. At the stage illustrated by FIG. 21, the periphery 198 may include precursor structures for a variety of devices, such as sense amplifiers, address decoders, and drivers. In some embodiments, the periphery 198 may be doped differently from the array 196. For example, the periphery 198 may be masked when the upper doped region 112 is formed, and separate doping steps may dope portions of the periphery 198. The periphery 198 may include isolation trenches 199 that may isolate subsequently-formed transistors in the periphery 198. The isolation trenches 199 may be patterned, etched, and filled generally simultaneously with the column isolation trenches 142, or they may be formed partially or substantially entirely separately.

Figure 22:
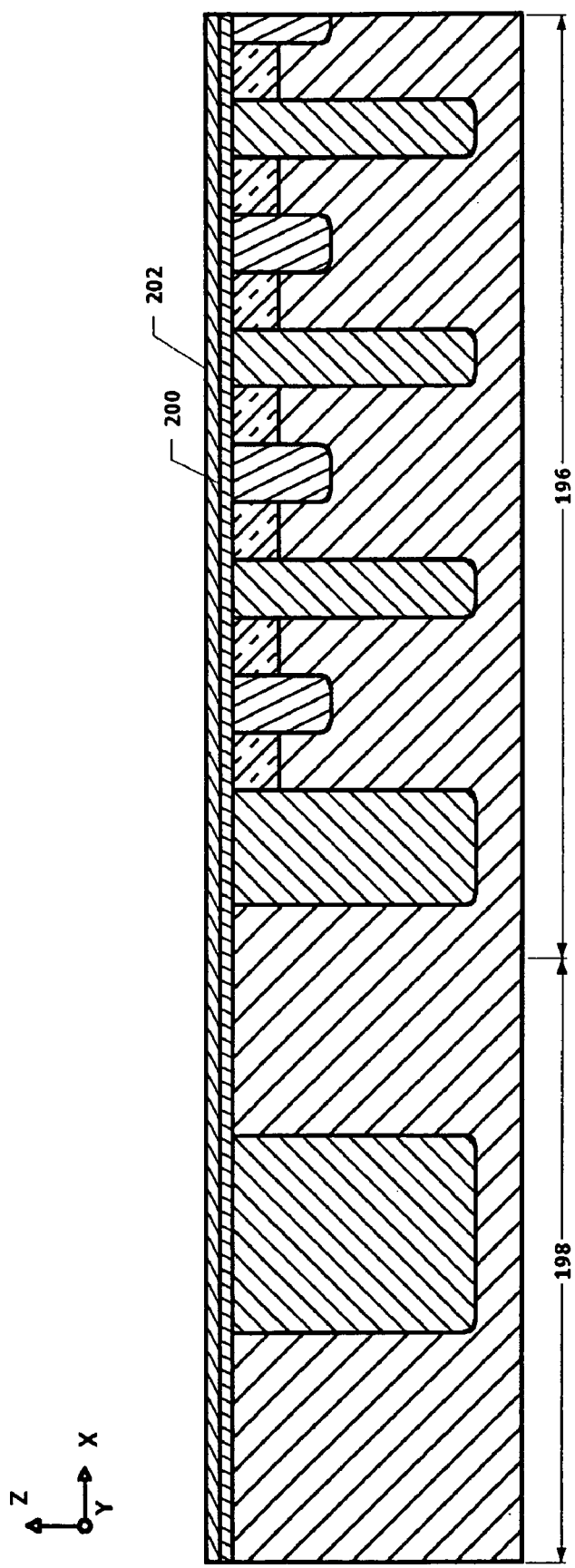

A buffer material 200 and a stop material 202 may be formed, as illustrated by FIG. 22. The buffer material 200 may be an oxide, e.g., an oxide formed with TEOS CVD, and the stop material 202 may be a nitride formed with CVD or other appropriate processes. The buffer material 200 may have a thickness less than about 200 Å, e.g., a thickness equal to or less than about 50 Å, and the stop material 202 may have a thickness less than about 500 Å, e.g., a thickness equal to or less than about 300 Å.

Figure 23:
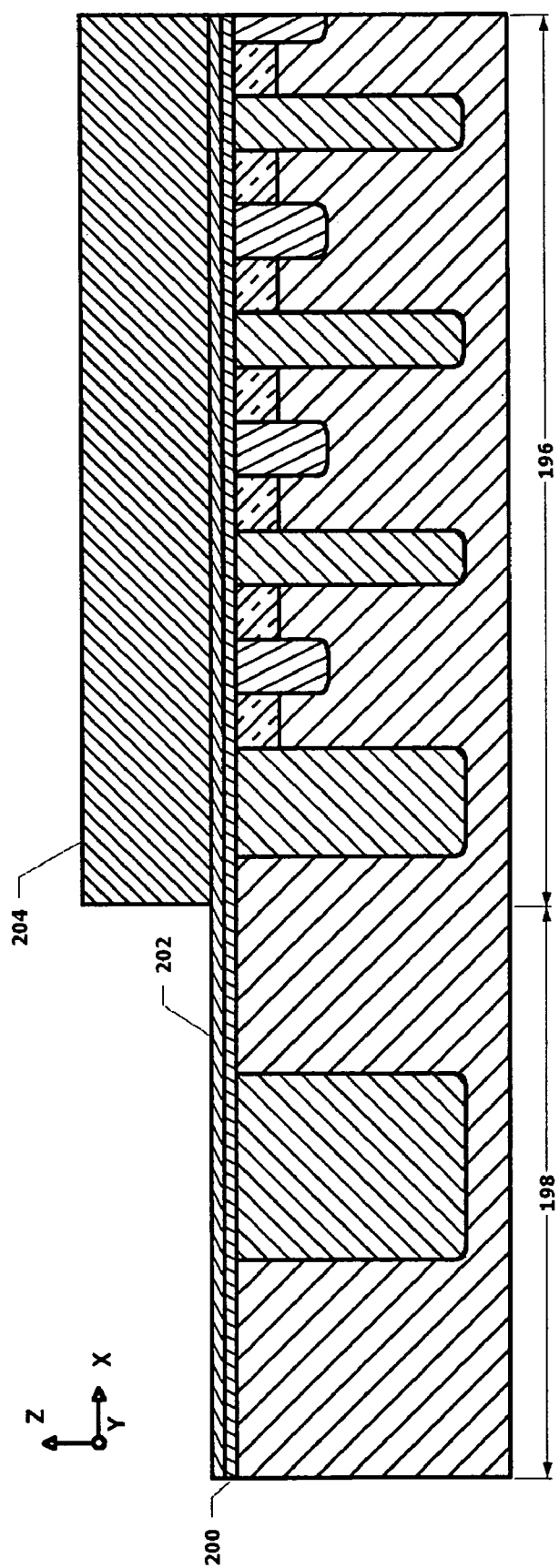

A mask 204 may be formed on the stop material 202, as illustrated by FIG. 23. The mask 204 may cover the array 196 and leave a portion or substantially all of the periphery 198 exposed. The mask 204 may be a soft mask or a hard mask formed with photolithography or other patterning techniques. For example, the mask 204 may be formed with photolithography equipment that is older or less capable than the photolithography equipment used to form a certain other features on the substrate 110, such as at the column mask 126 (FIG. 3) or the row mask 160 (FIG. 14). The mask 204 may be formed with an I-line photolithography tool (e.g., a photolithography tool having a light-source with a wavelength generally equal to or greater than 365 nm) or a G-line photolithography tool (e.g., a photolithography tool having a light source with a wavelength equal to or greater than 436 nm). In comparison, the masks 126 and 160 may be formed with a deep-UV photolithography tool (e.g., a photolithography tool having a light source with a wavelength generally equal to or less than 300 nm, a 248 nm, 193 nm, or 157 nm). The present technique is not limited to masks formed with these photolithography tools. For instance, the masks 126 and 160 may be formed with a deep-UV photolithography tool, and the mask 204 may be formed with a more advanced form of this tool, such as a deep-UV photolithography tool configured for immersion lithography or double patterning.

Figure 24:
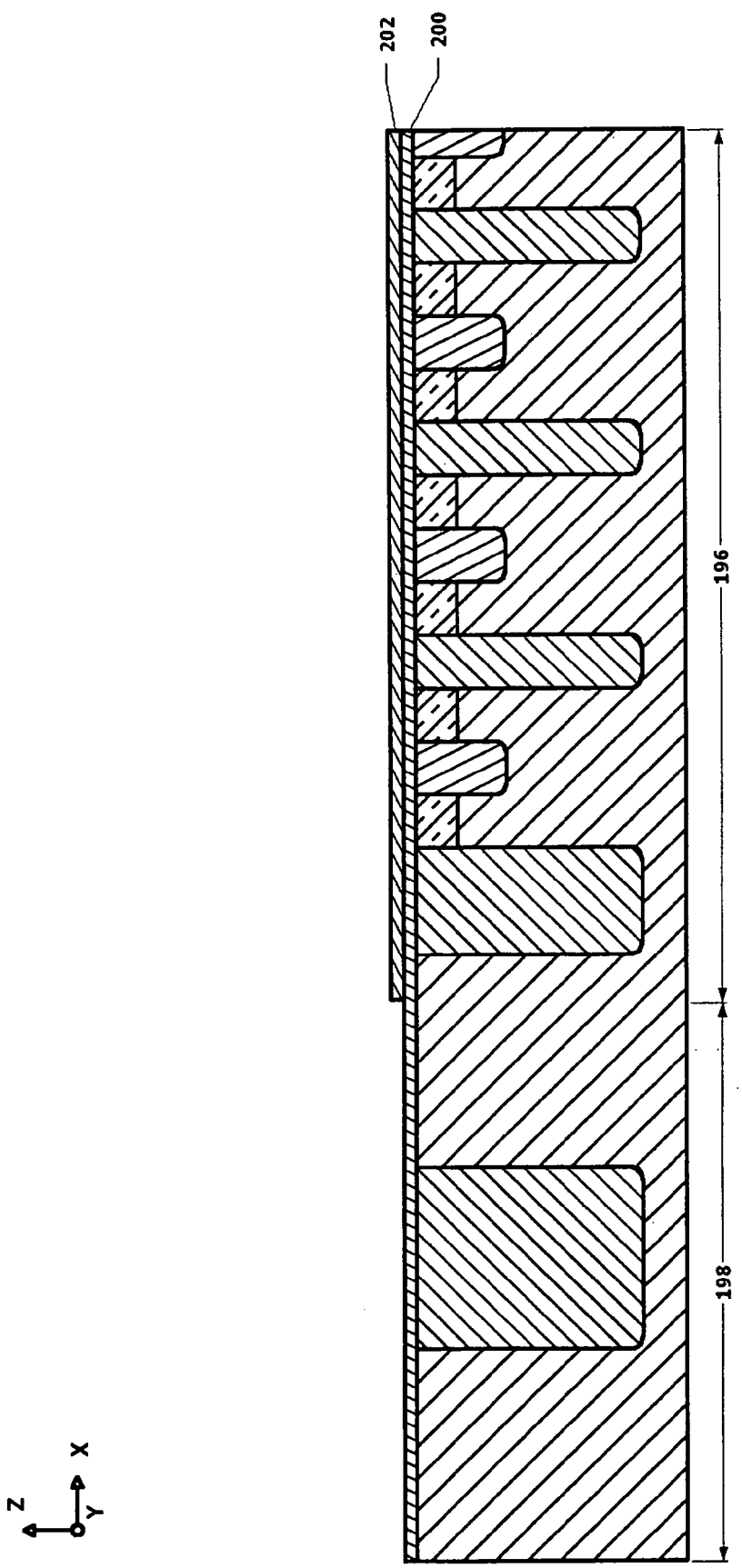

Next, the exposed portion of the stop material 202 and the mask 204 may be removed, as illustrated by FIG. 24. The stop material 202 may be removed with a wet etch or a dry etch that is selective to the stop material 202. The stop material 202 may remain over the array 196, and the buffer material 200 may be exposed in the periphery 198.

Figure 25:
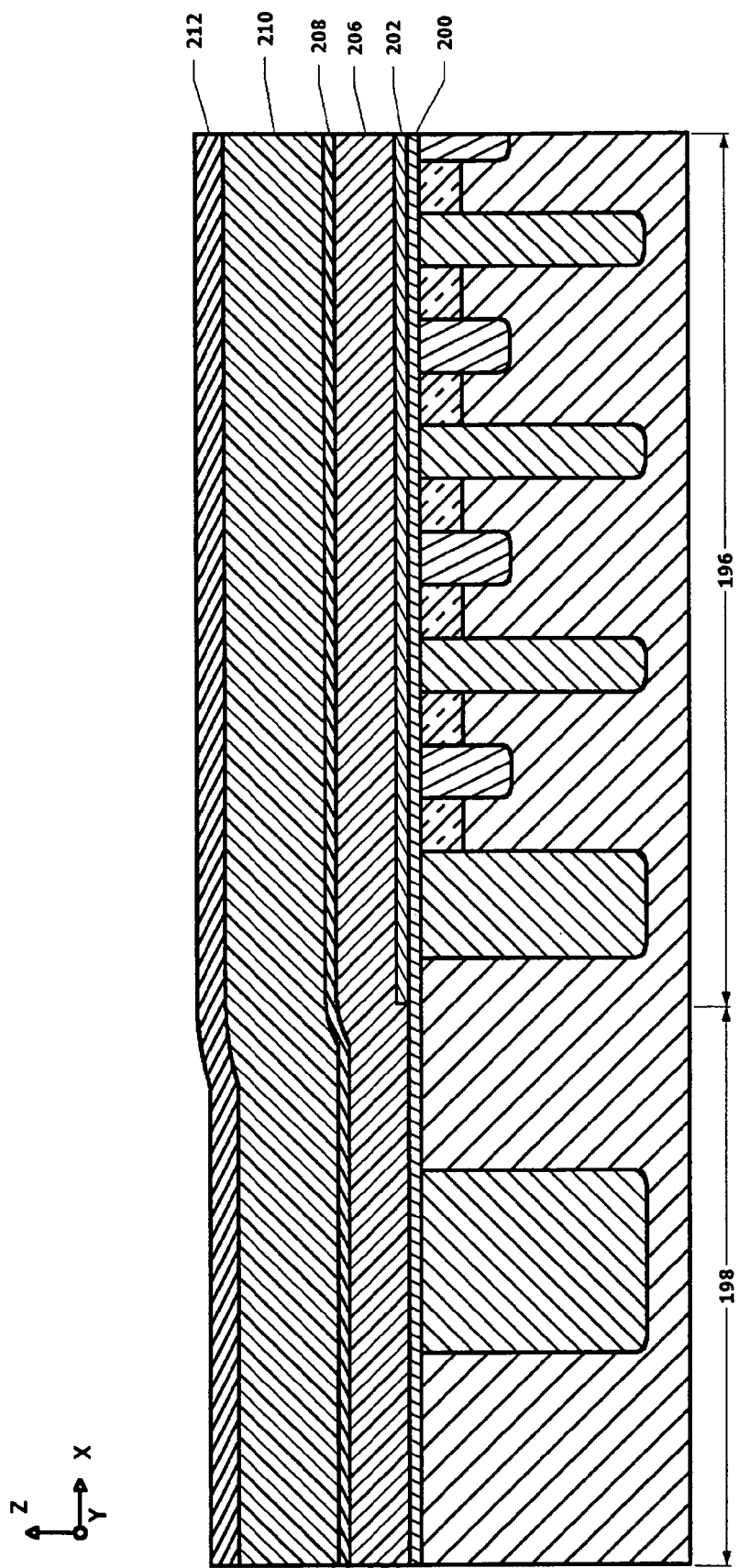

Next, a lower conductive material 206, an upper stop material 208, a sacrificial material 210, and an implant barrier 212 may be formed, as illustrated by FIG. 25. The lower conductive material 206 may be made of or include a conductive material, e.g., p+ doped polysilicon. The lower conductive material 206 may have a thickness less than about 1200 Å, e.g., a thickness equal to or less than about 700 Å. Making the lower conductive material 206 from doped polysilicon may facilitate certain subsequent higher temperature processing, as polysilicon is believed to be more resistant to oxidation than some other conductors. For instance, metals may oxidize at temperatures typically used to anneal the substrate 110 to heal etch damage to the crystal structure of the substrate 110. Indeed, the film stack illustrated by FIG. 25, which as explained below, after etching, generally defines the dimensions of the gates in the periphery 198, may be generally free of metal. In other embodiments, the lower conductive material 206 may include a metal, such as tungsten, and liners such as titanium nitride and titanium.

The upper stop material 208 may include or be made of a material selected to function as an etch stop. That is, the choice of the upper stop material 208 may be made in view of the etch used to etch the sacrificial material 210. The upper stop material 208 may be selected to be relatively resistant to this etch, slowing this etch and increasing the margin for over etching the sacrificial material 210. For example, the upper stop material 208 may be an oxide or a nitride, and the upper stop material 208 may have a thickness less than about 200 Å, e.g., a thickness equal to or less than about 100 Å. Thus, the upper stop material 208 may facilitate relatively tight control of the vertical dimension of etches through the film stack illustrated by FIG. 25.

The sacrificial material 210 may be a material selected to etch relatively anisotropically, e.g., a material that tends to form relatively vertical sidewalls when etched. For example, the sacrificial material 210 may include doped or undoped polysilicon. The sacrificial material 210 may have a thickness less than about 2500 Å, e.g., a thickness equal to or less than about 1500 Å. Making the sacrificial material 210 from polysilicon is believed to facilitate formation of sidewalls that are relatively vertical as compared to sidewalls produces by etches through other materials, such as oxide. Relatively vertical sidewalls are believed to facilitate more precise control of device dimensions. With highly sloped sidewalls, film thickness variations may affect the width of the bottom of trenches. In contrast, relatively vertical sidewalls may cause the film thickness to have less of an effect on the width of features near the bottom of the film being etched. Further, sidewall spacers may be formed on the relatively vertical sidewalls with more margin for over etch in horizontal areas, thereby reducing the likelihood of undesirable stringers between sidewalls spacers. Thus, the sacrificial material 210 may facilitate relatively precise control of the horizontal dimensions of the structures formed by etches through this film stack.

The implant barrier 212 may include an amorphous material, such as an oxide or amorphous carbon, and it may have a thickness equal to or less than about 1000 Å, e.g., a thickness equal to or less than about 500 Å. The implant barrier may impede implanted ions from penetrating the sacrificial material 210, as some crystal grains in the sacrificial material 210 may align with the implant beam and may be relatively permeable to the implanted ions. It should be noted, though, that not all embodiments offer all of the advantages of the film stack illustrated by FIG. 25, and some embodiments offer only some of its advantages or other advantages.

Figure 26:
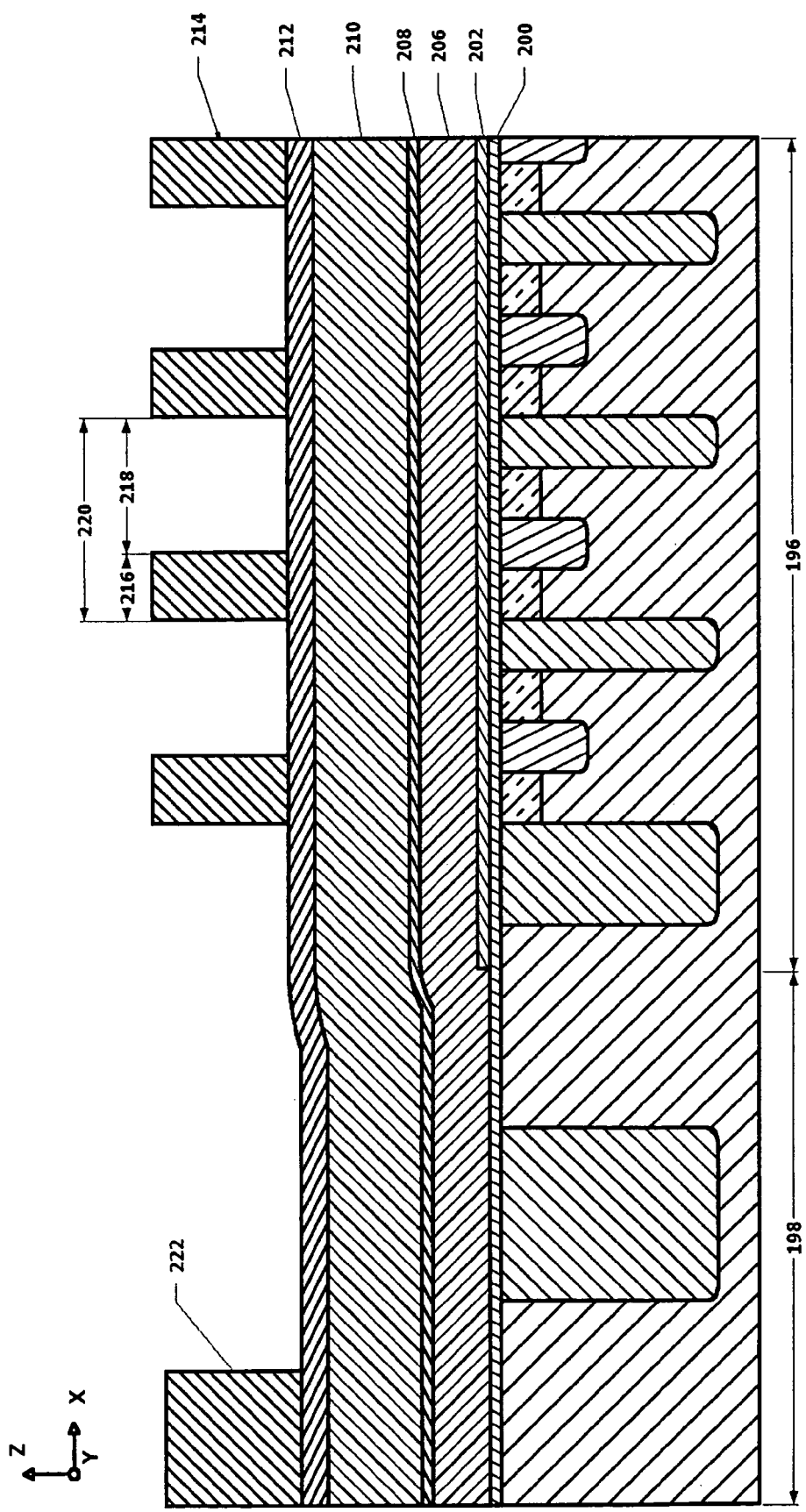

Next, a mask 214 may be formed, as illustrated by FIG. 26. The mask 214 may be a soft mask or a hard mask formed with photolithography or other patterning techniques known in the art. The mask 214 may include a pattern of lines that define a mask width 216, an exposed width 218, and a pitch 220 in the array 196. The pitch 220 may be generally equal to (or an integer multiple of) the pitch 132 of the column mask 126 described above with reference to FIG. 3. The lines of the mask 214 that define the masked width 216 may generally extend in the Y-direction and may generally be aligned with one of the legs 186 or 188 of each of the transistors 184 (FIG. 20). The masked width 216 may be less than the exposed width 218 and may be less than or generally equal to F, ¾ F, or ½ F. The mask 214 may also define a masked region 222 in the periphery 198.

The mask 214 may be formed by more advanced photolithography equipment relative to the photolithography equipment used to form other structures on the substrate 110. For instance, the mask 214 may be formed by the photolithography equipment used to form the masks 126 (FIG. 3) and 160 (FIG. 14), equipment which may have a minimum feature size (F) that is smaller than the minimum feature size of the photolithography equipment used to form the mask 204 (FIG. 23). F may be smaller than or generally equal to about 120 Å, 100 Å, 80 Å, or 50 Å. The masks 214, 126, and 160 may be formed with deep-UV photolithograph equipment, and the mask 204 may be formed with I-line photolithography equipment.

The masked region 222 may define a gate of a subsequently formed transistor in the periphery 198. Thus, in some embodiments, the mask 214 may serve dual purposes: defining the gates in the periphery 198 and, as explained below, data lines in the array 196. Because the mask 214 may serve these dual purposes, the throughput of the more advanced photolithography equipment is economized, as dimensions of several structures may be defined simultaneously. It should be noted, though, that not all embodiments offer this advantage, and some embodiments offer other advantages.

Figure 27:
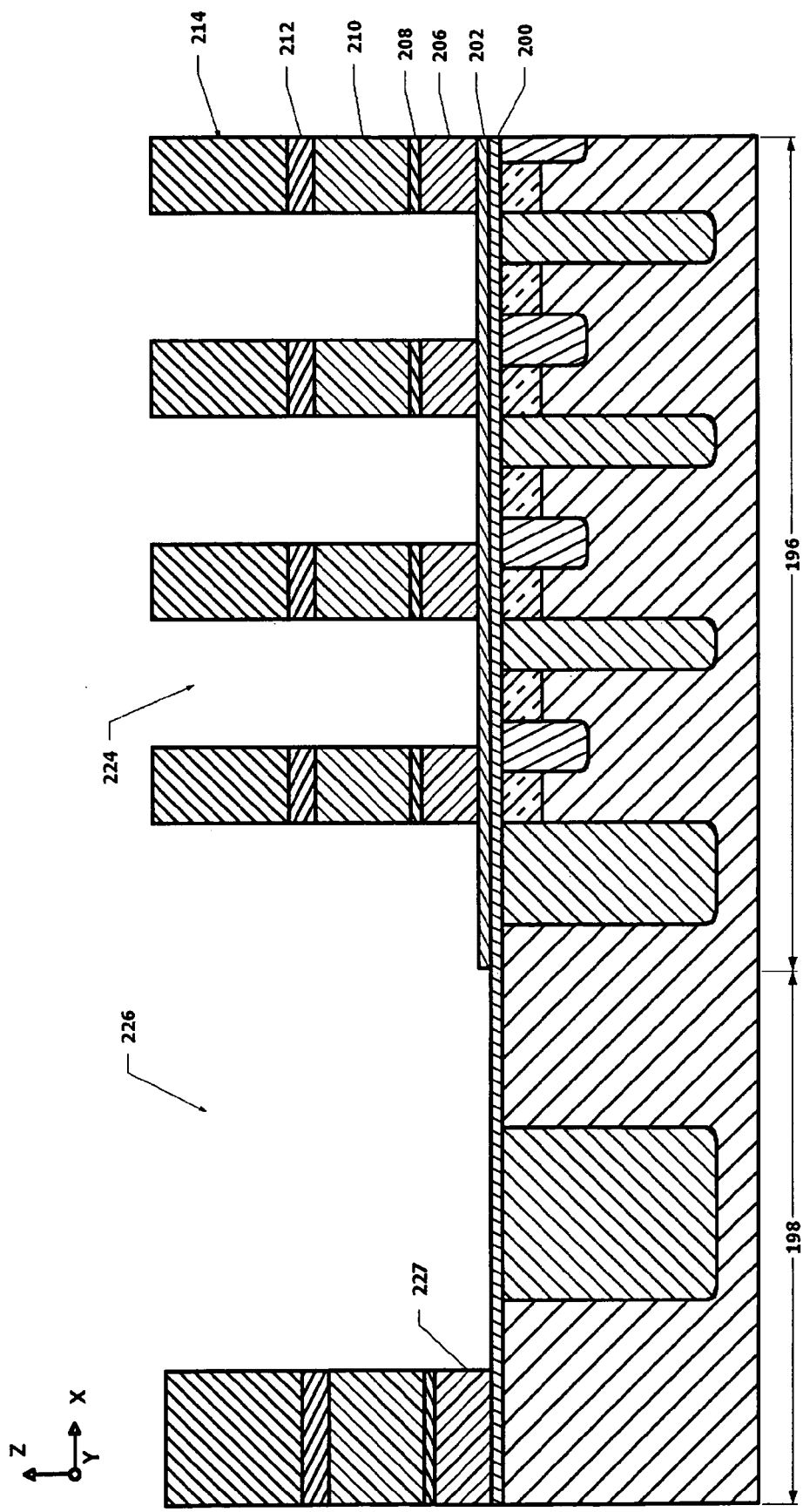

After forming the mask 214, the substrate 110 may be etched, as illustrated by FIG. 27. The etch may be generally anisotropic, and it may stop on or in the stop material 202 or the buffer material 200. The etch may form generally linear recesses 224 in the array 196 and the recess 226 in the periphery 198. The recesses 224 may be disposed over one of the legs 186 or 188 of the transistors 184 (FIG. 20). The etch may be performed in two or more stages. For example, the implant barrier 212 and the sacrificial material 210 may be etched first, using the upper stop material 208 as an etch stop. The portion of the etch that consumes the sacrificial material 210 may be generally selective to polysilicon and selective against oxide. Using the upper stop material 208 as an etch stop is believed to form a relatively uniform etch front near this layer and produce relatively uniform vertical dimensions within the linear recesses 224 and the recess 226. Next, the upper stop material 208 and the lower conductive material 206 may be etched, stopping on or in the stop material 202 or the buffer material 200. As mentioned above, forming the sacrificial material 210 and the lower conductive material 206 from polysilicon is believed to facilitate formation of the recesses 224 and 226 with relatively vertical sidewalls.

The etch illustrated by FIG. 27 may define a gate 227 in the periphery 198. The gate 227 may be made from the lower conductive material 206, and it may be generally free of metal. After this etch, the substrate 110 may be annealed in a furnace, e.g., at a temperature greater than 400 degrees C., e.g., greater than or equal to 800 about degrees C.

Figure 28:
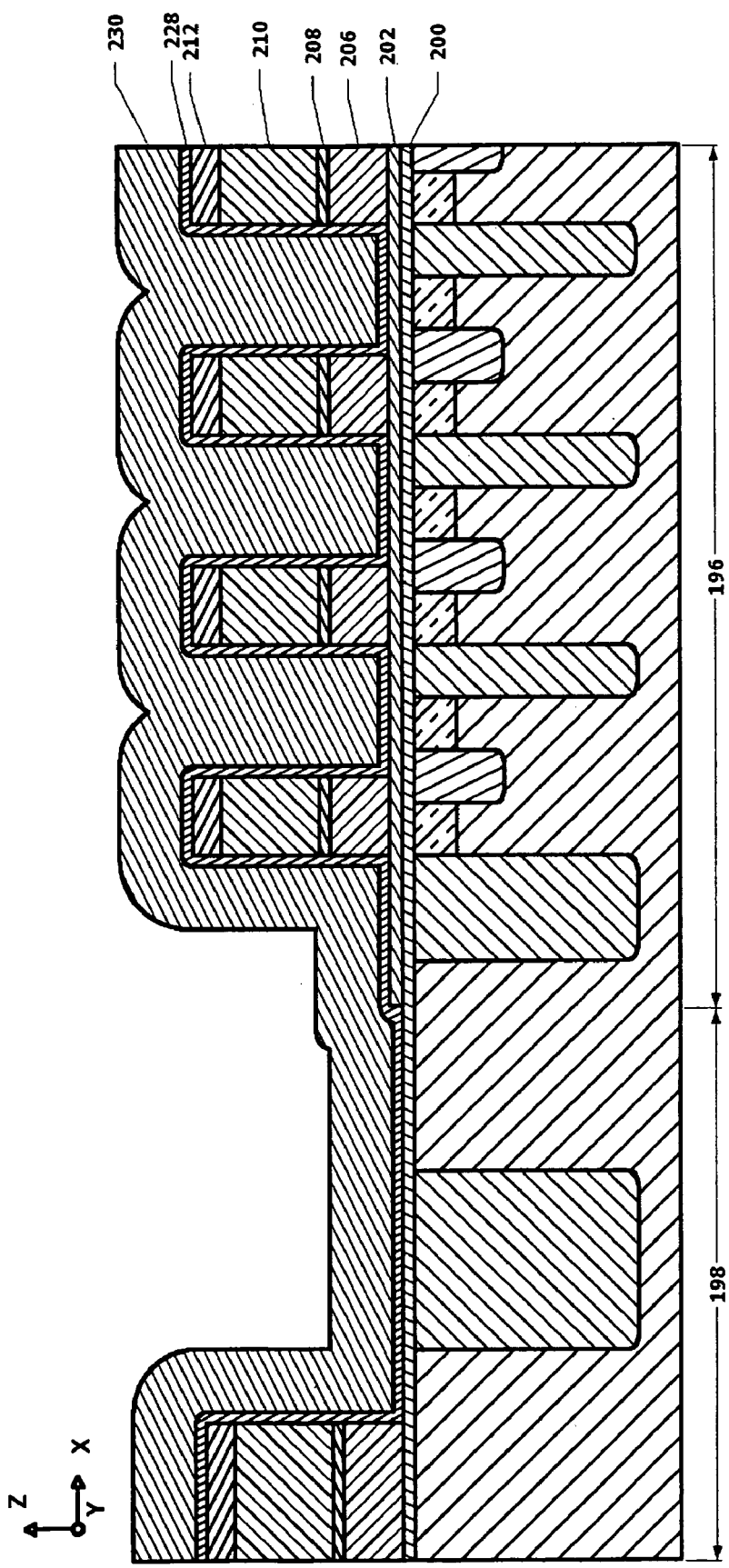

Next, spacer materials 228 and 230 may be formed, as illustrated by FIG. 28. The spacer material 228 may be a nitride deposited with CVD, and it may have a thickness less than about 300 Å, e.g., a thickness equal to or less than about 100 Å. The spacer material 230 may be an oxide deposited with CVD, and it may have a thickness less than about 400 Å, e.g., less than or equal to about 200 Å. The spacer material 230 may substantially fill the recesses 224 (FIG. 27) in the array 196.

Figure 29:
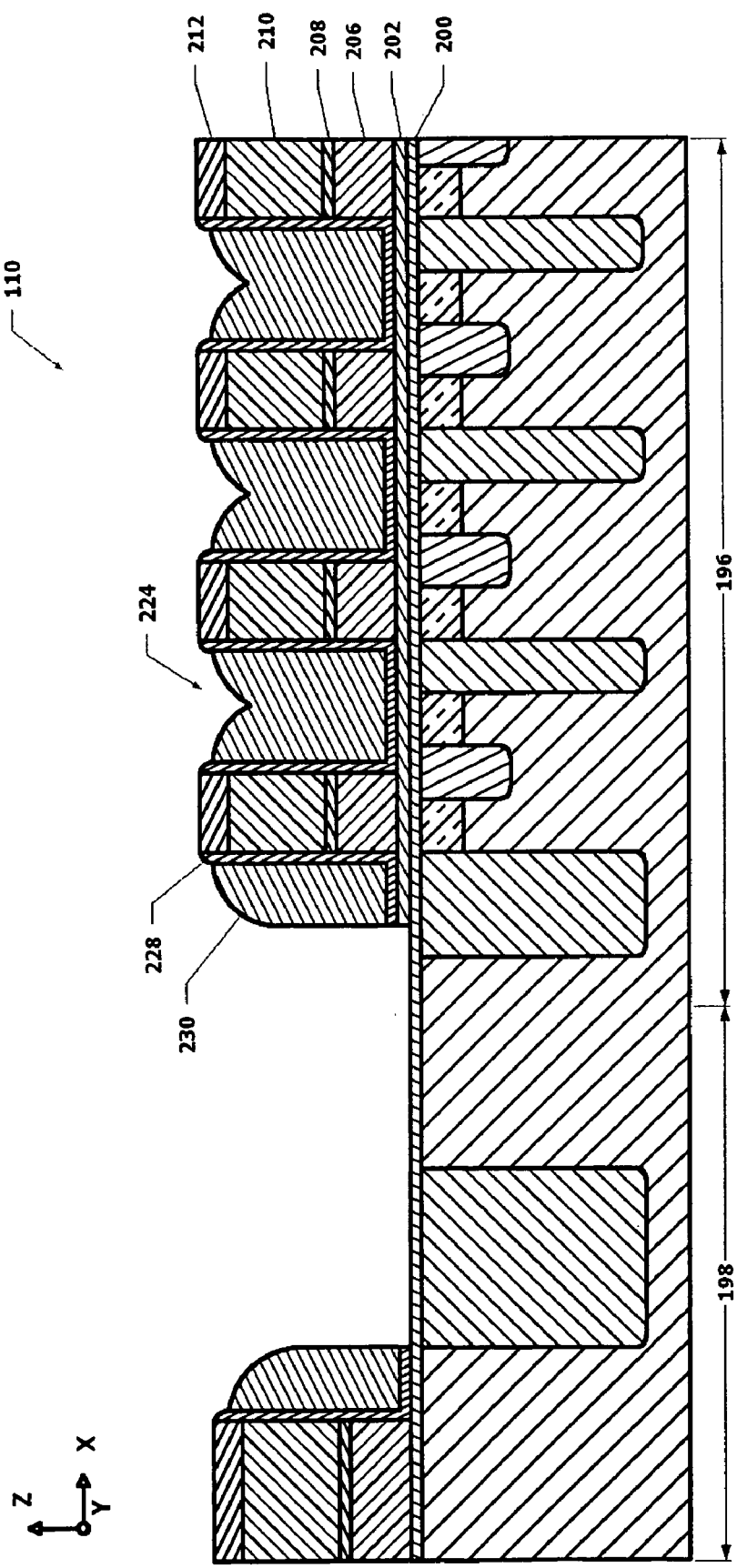

The spacer materials 228 and 230 may form spacers (identified with the same reference numbers as the material from which they are formed), as illustrated by FIG. 29. The spacers 228 and 230 may be formed by generally anisotropically etching the substrate 110. After forming the spacers 228 and 230, a portion of the spacer material 230 may cover all or a portion of the spacer material 228 within the recesses 224 in the array 196. The spacer etch may expose the top of the implant barrier 212.

Figure 30:
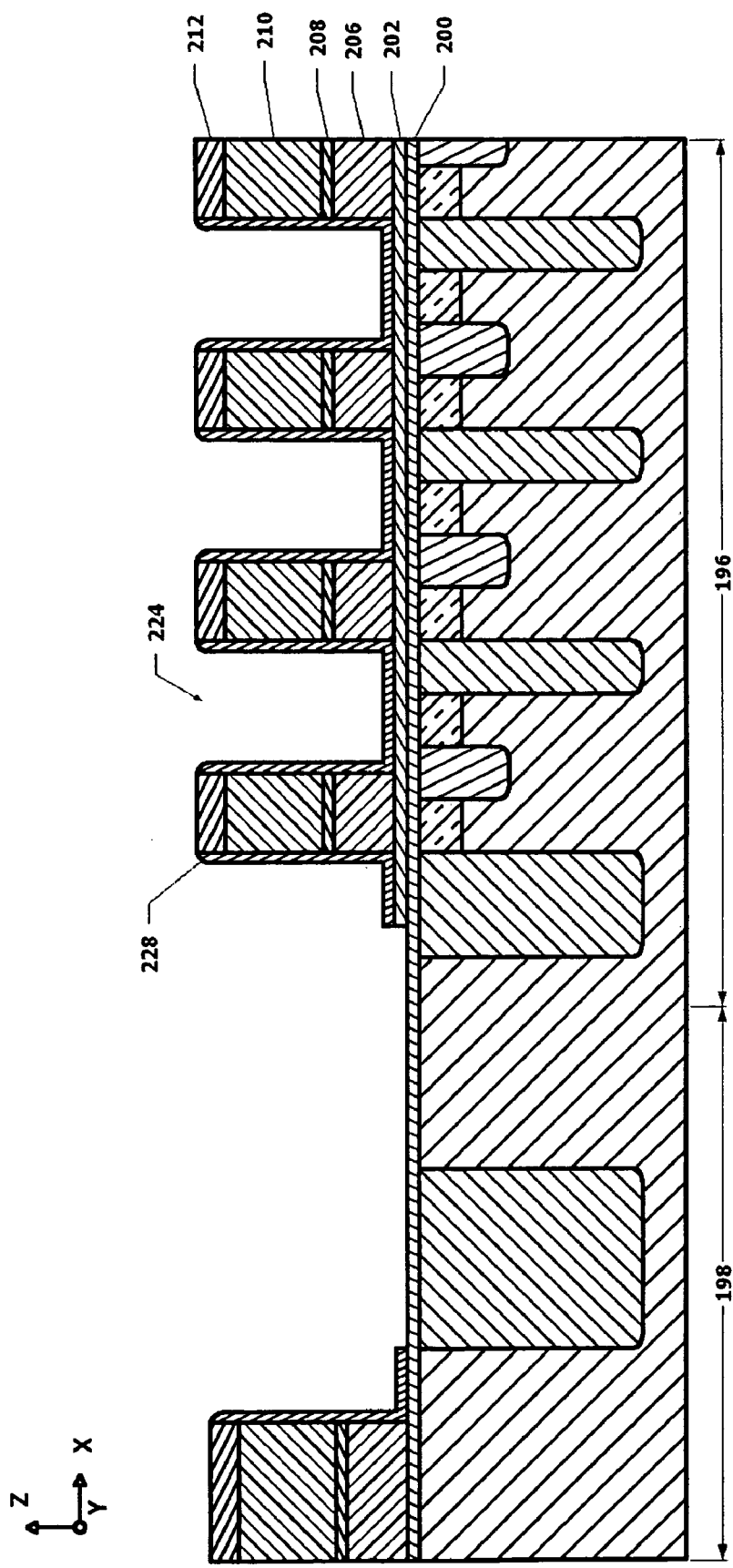

Next, the spacer material 230 may be removed, as illustrated by FIG. 30. The spacer material 230 may be removed with a wet or dry etch that is selective to the spacer material 230. A portion of the spacer material 228 may remain along the bottom of the recesses 224 in the array, while a substantial portion of the periphery 198 may be not covered by the spacer material 228. Thus, the spacer material 228 may be patterned differently in the array 196 and the periphery 198 without using an additional photomask.

Figure 31:
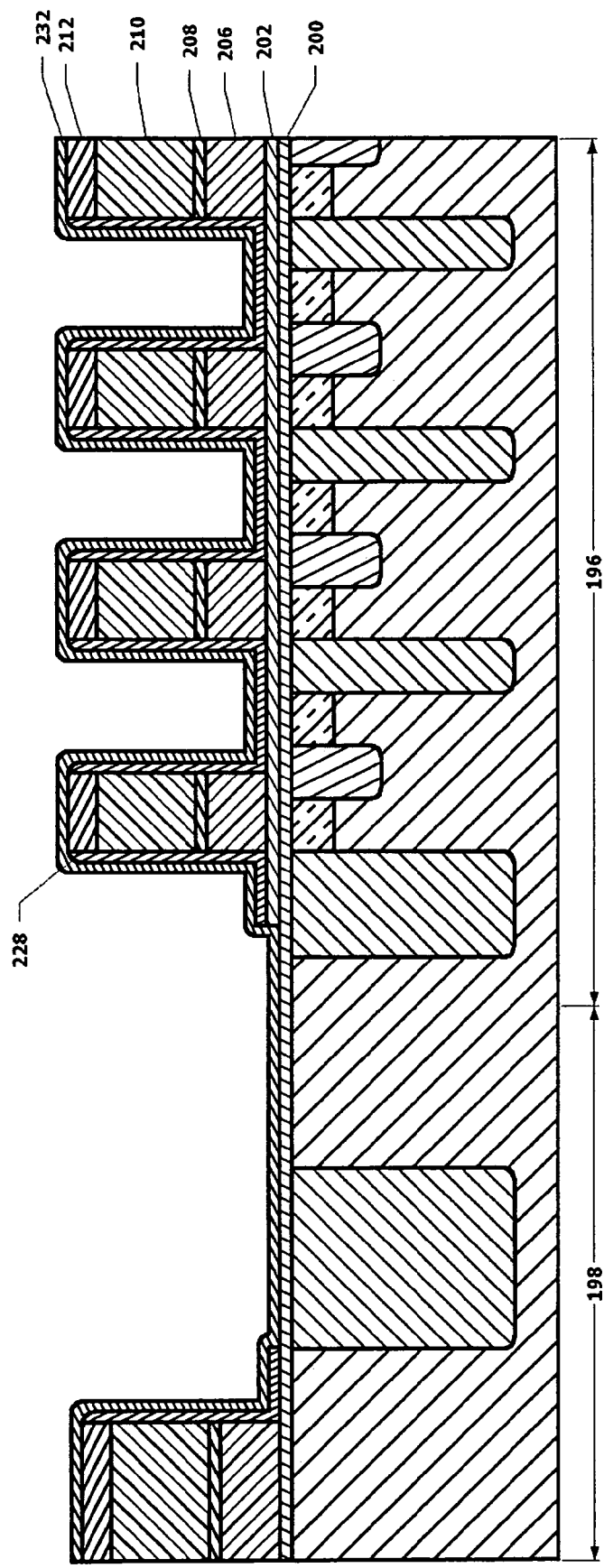

A liner 232 may be formed, as illustrated by FIG. 31. The liner 232 may be a nitride deposited with CVD or other appropriate processes. The liner 232 may have a thickness less than about 300 Å, e.g., a thickness equal to or less than about 150 Å.

Figure 32:
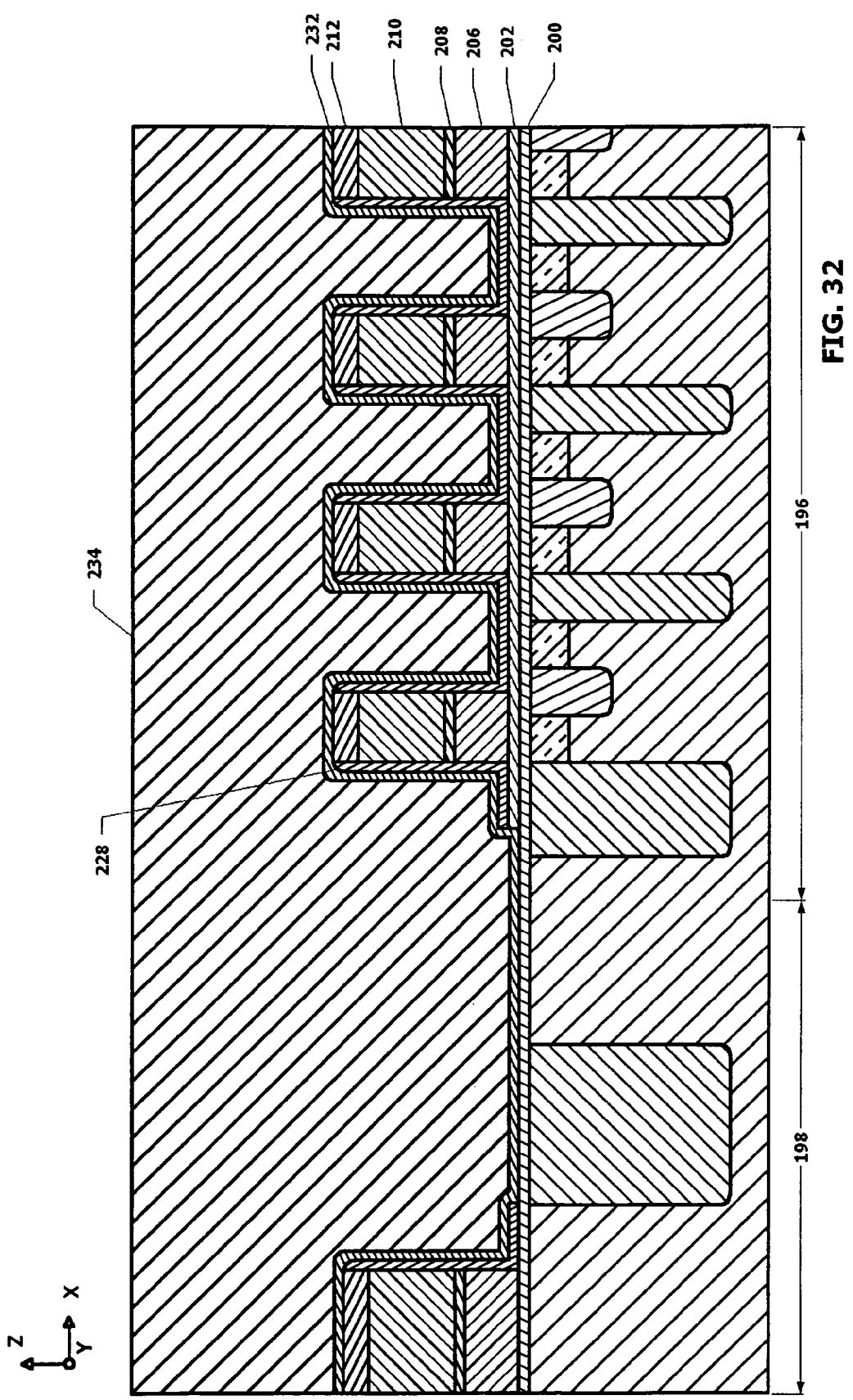

Next, a dielectric 234 may be formed, as illustrated by FIG. 32. The dielectric 234 may be an oxide or other appropriate material deposited with CVD or it may be a spun-on dielectric, for example. The dielectric 234 may be densified by heating the substrate 110 to drive volatile compounds from the dielectric 234. The dielectric 234 may be deposited to a thickness selected to generally planarize the substrate 110, e.g., a thickness at least greater than the depth of the recesses 224 (FIG. 31).

Figure 33:
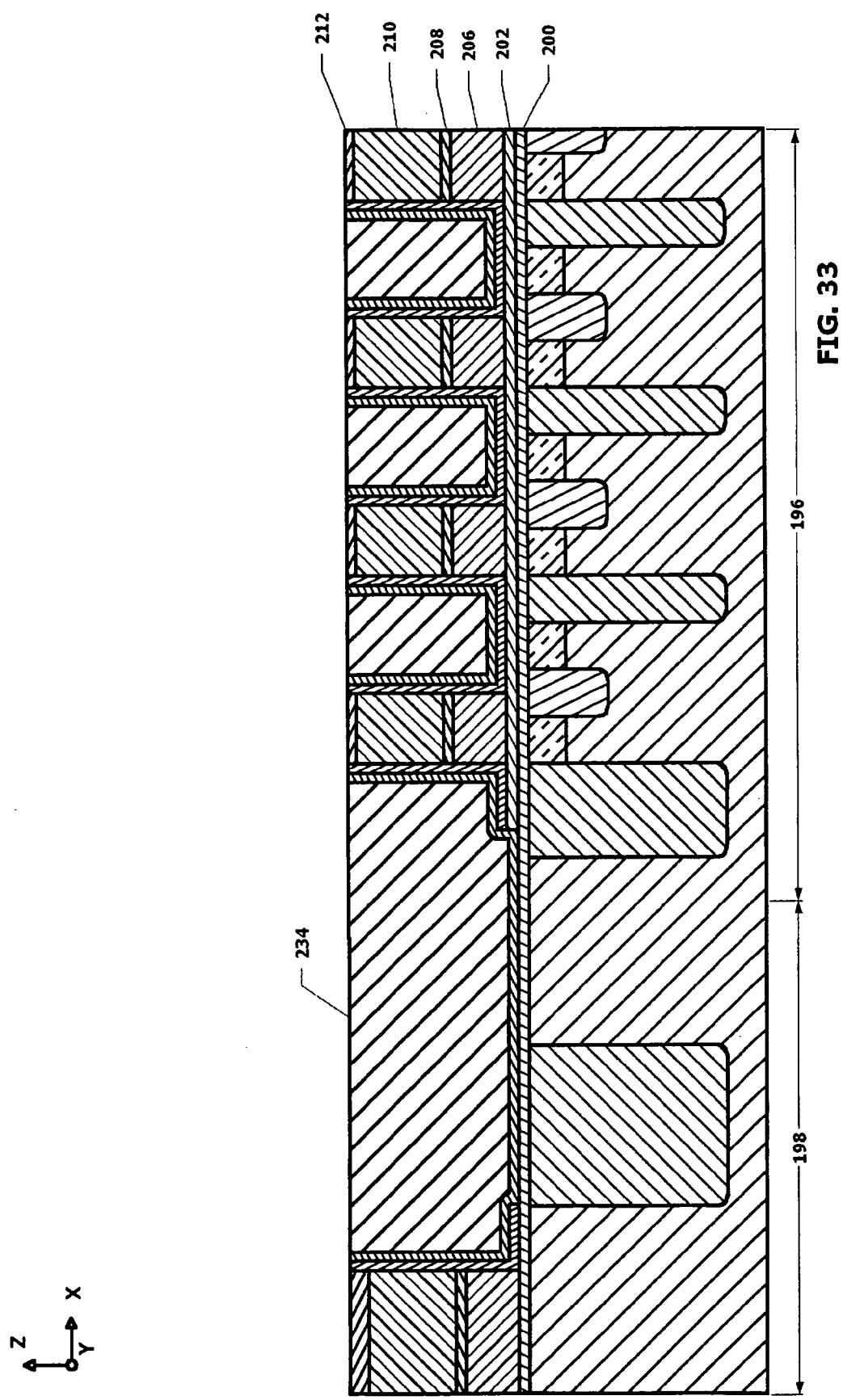

The substrate 110 may be planarized, as illustrated by FIG. 33. Planarizing may include polishing the substrate 110 with CMP or etching the substrate 110 with an etch that is generally nonselective to the exposed materials on the substrate 110. Planarization may stop on or in the implant barrier 212 or on or in the upper conductor 210, for example. In some embodiments, planarization may stop in the implant barrier 212, and the exposed portion of the implant barrier 212 may be removed with a wet or dry etch.

Figure 34:
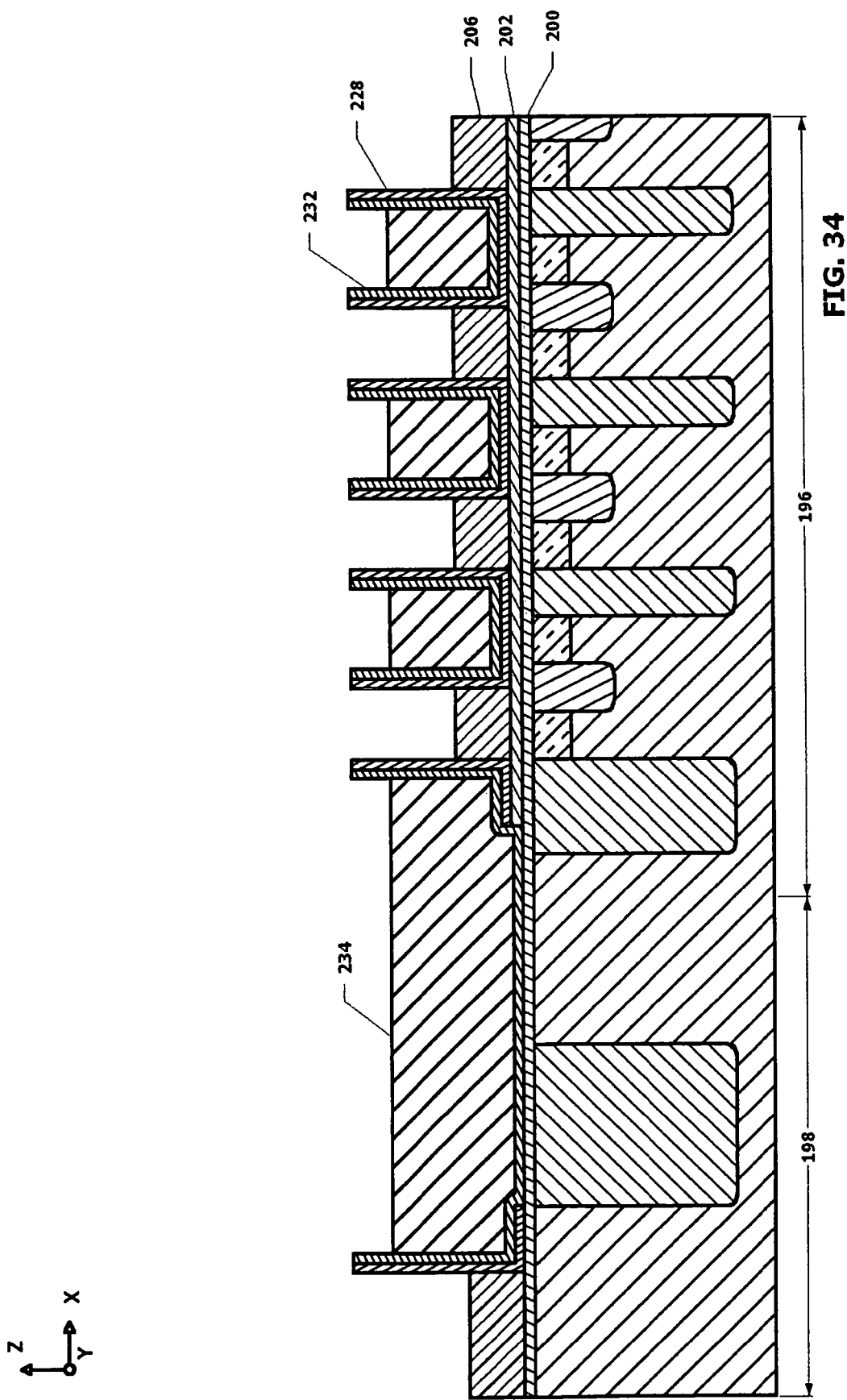

Next, the upper conductor 210 and the upper stop material 208 may be removed, as illustrated by FIG. 34. The upper conductor 210 may be removed with an etch, e.g. a wet etch, that is selective to the upper stop material 208, and the upper stop material 208 may be removed with a different etch that is selective to the lower conductor 206. One or both of these etches may remove a portion of the dielectric 234 as well.

Figure 35:
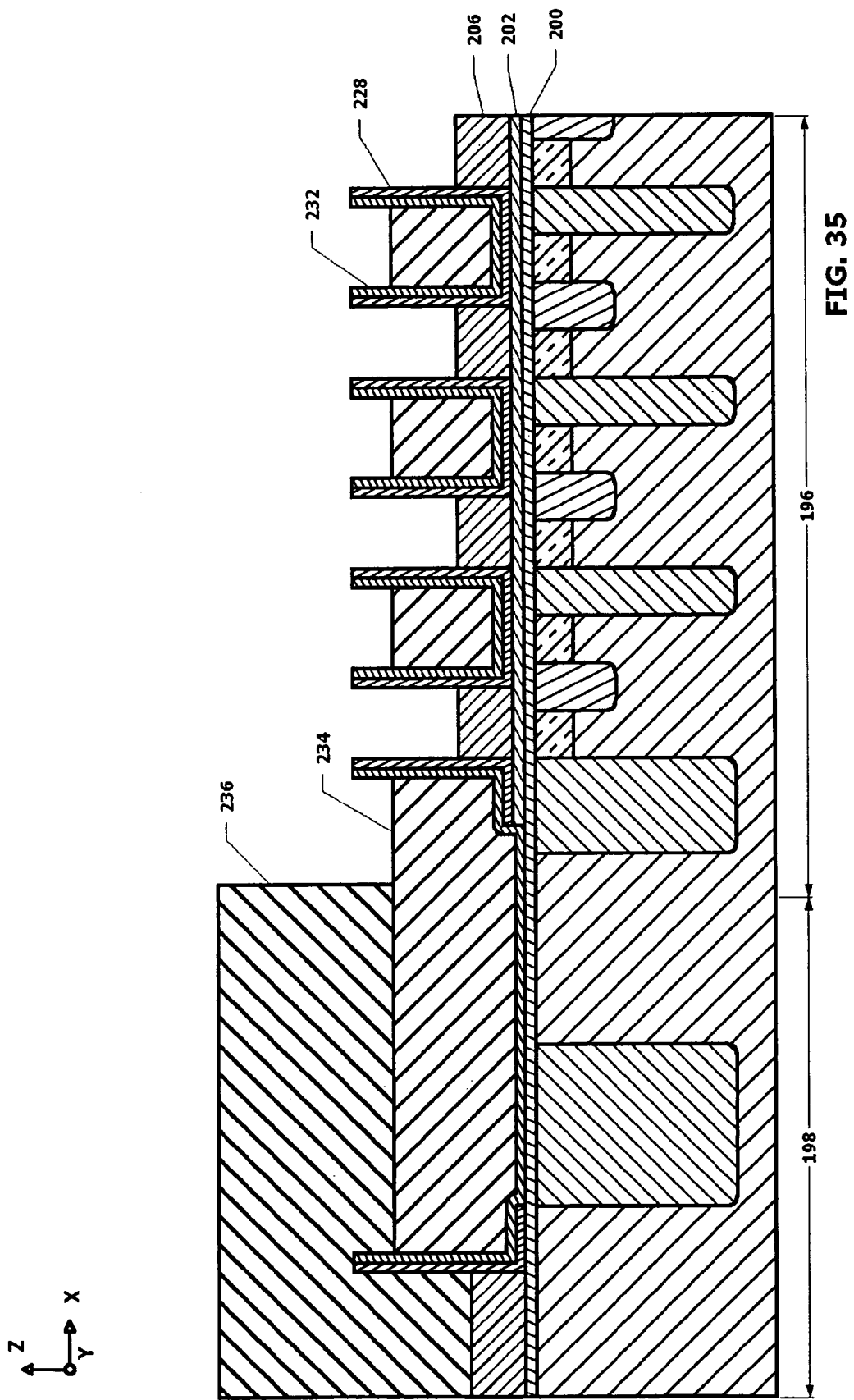

A mask 236 may be formed on the substrate 110, as illustrated by FIG. 35. The mask 236 may expose the array 196 and cover a portion or substantially all of the periphery 198. The mask 236 may be a hard mask or a soft mask formed with photolithography or other patterning techniques. The mask 236 may be formed with photolithography equipment that is older or less capable than the photolithography equipment that was used to form certain other features on the substrate 110, such as at the mask 214. In some embodiments, the mask 236 may be formed with an I-line photolithography tool (e.g., a photolithography tool having a light-source with a wavelength generally equal to or greater than 365 nm) or a G-line photolithography tool (e.g., a photolithography tool having a light source with a wavelength equal to or greater than 436 nm), and the mask 214 (FIG. 26) may be formed with a deep-UV photolithography tool (e.g., a photolithography tool having a light source with a wavelength generally equal to or less than 300 nm, a 248 nm, 193 nm, or 157 nm). The present technique, however, is not limited to the present generation of photolithography tools. As photolithography advances, and deep-UV tools are usurped with more capable systems, the mask 236 may be formed with a deep-UV photolithography system, and the mask 214 may be formed with the more advanced system, e.g., a system with a smaller minimum feature size (F), such as a system configured for double-patterning, immersion lithography, or a smaller-wavelength light source.

Figure 36:
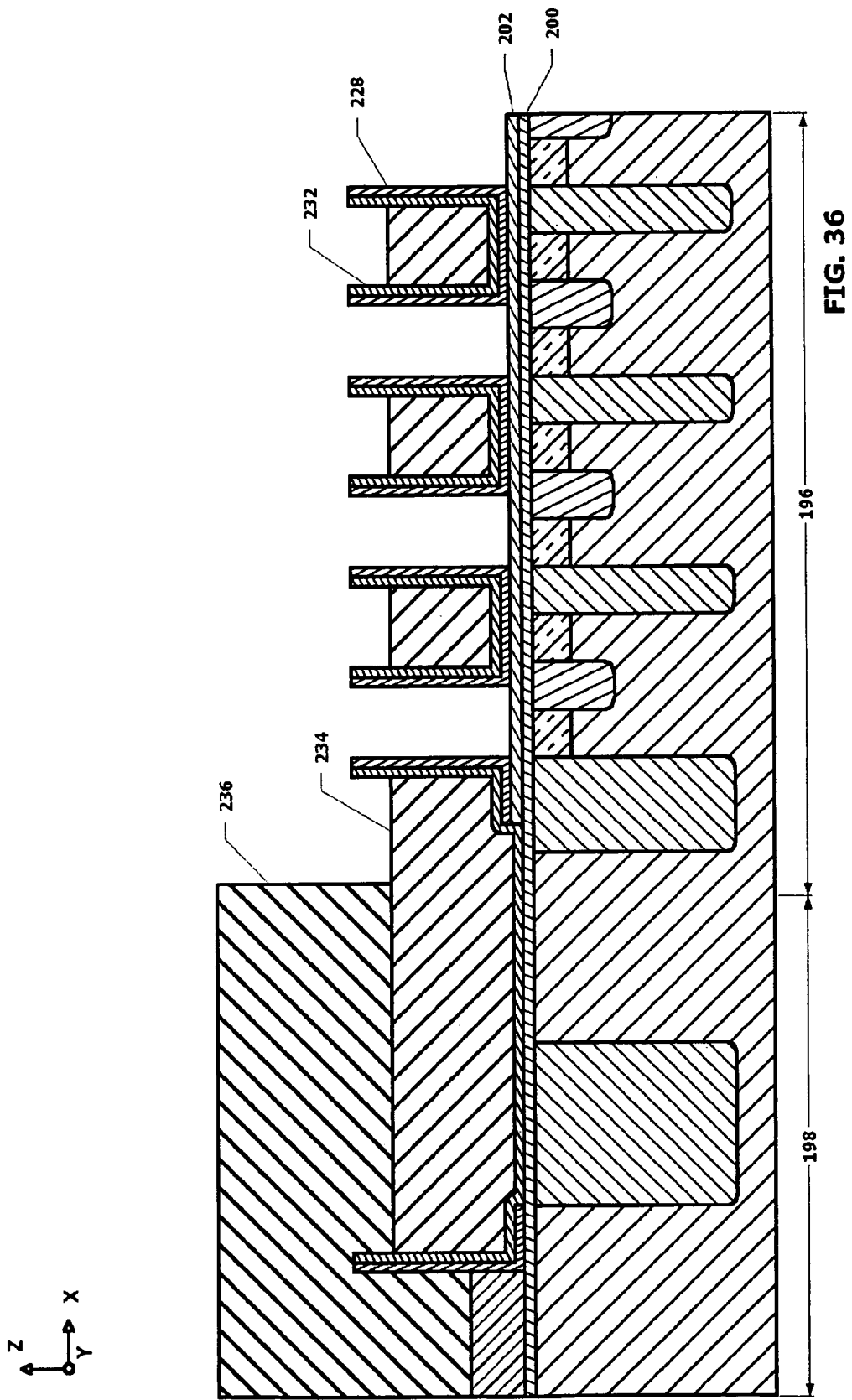

Next, the portion of the lower conductor 206 that is not covered by the mask 236 may be removed, as illustrated by FIG. 36. This portion of the lower conductor 206 may be removed with a dry or wet etch that is selective to the lower conductor 206. The etch may stop on or in the stop material 202.

Figure 37:
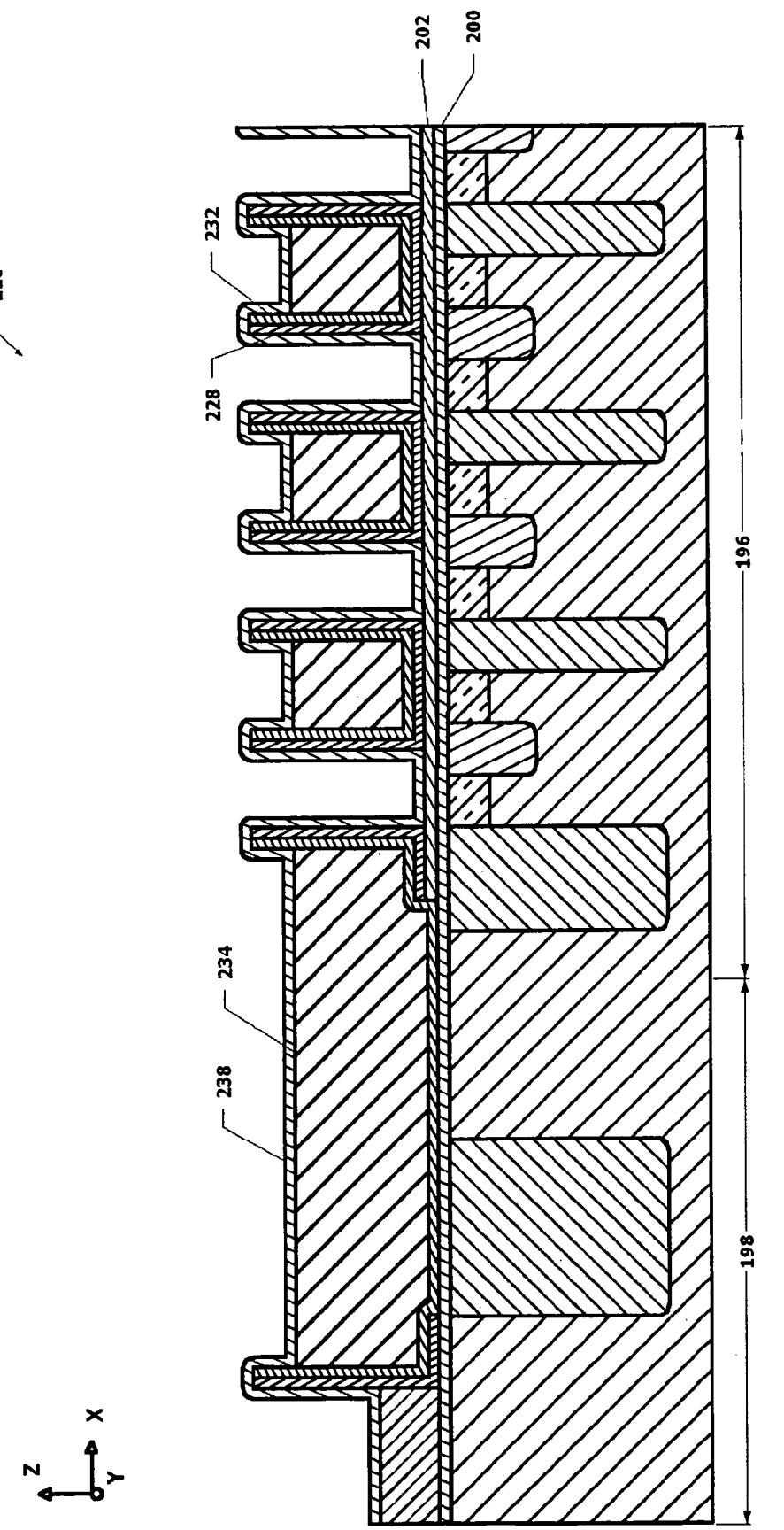

The mask 236 may be removed, and a liner material 238 may be formed on the substrate 110, as illustrated by FIG. 37. The mask 236, like many of the other masks described herein, may be removed with an etch that is selective to the mask 236 or by combusting the mask 236 with oxygen in a furnace, for example. The liner material 238 may be a nitride, an oxide, or other appropriate material, and it may be formed with CVD or other processes. The liner material 238 may have a thickness less than about 500 Å, e.g., a thickness equal to or less than about 300 Å.

Figure 38:
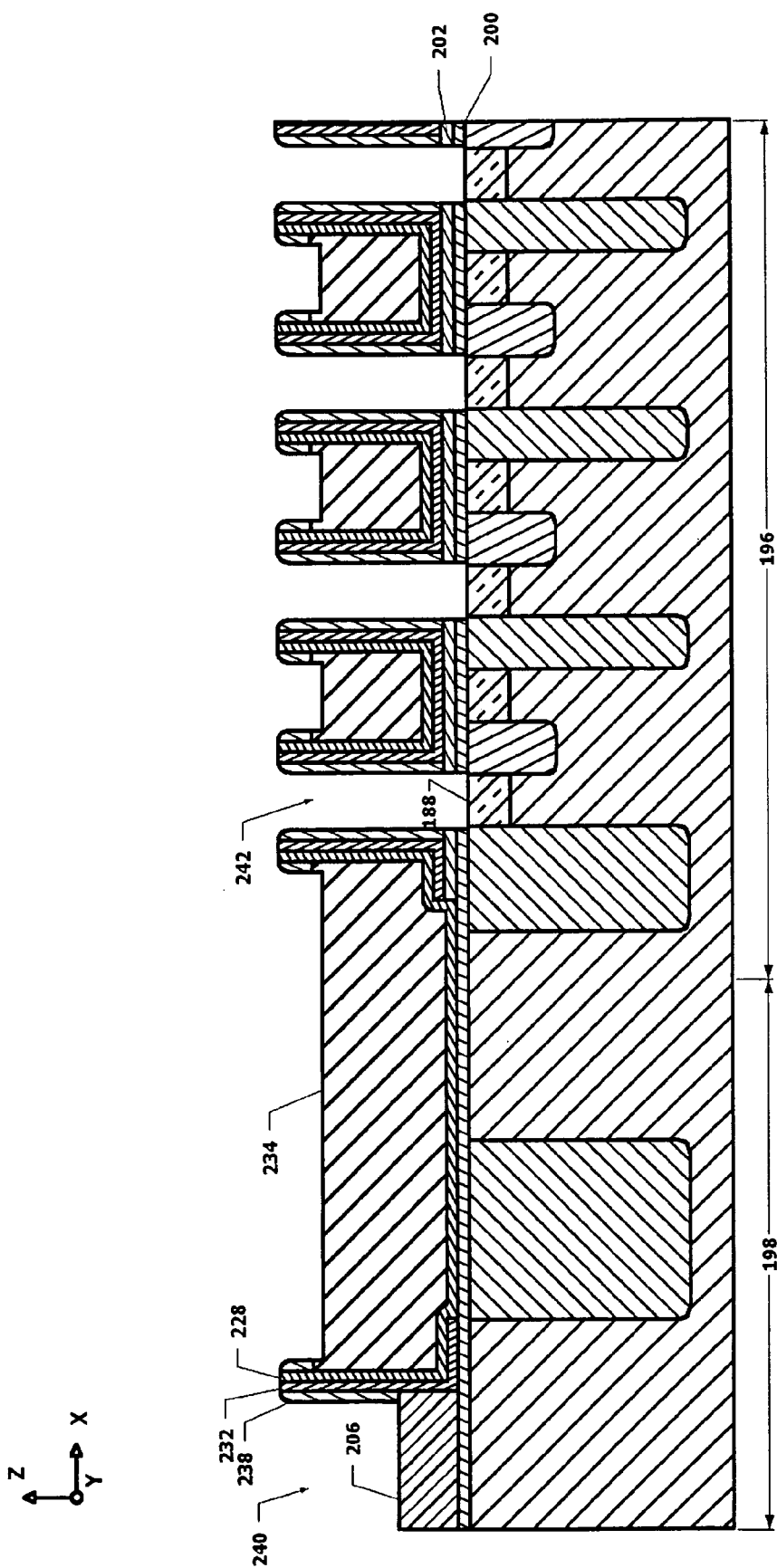

Next, the portion of the liner material 238 that is disposed on generally horizontal surfaces may be removed to form spacers (identified with the same reference number 238 as the material from which they are formed), as illustrated by FIG. 38. The liner material 238 may be etched with a generally anisotropic dry etch that is selective to the liner material 238, e.g., a dry etch that is selective to nitride. The resulting spacer formed by the liner material 238 may narrow the recesses 242 to a width that is less than or generally equal to F, ¾ F, or ½ F. Each recess 242 may be a generally linear recess extending in the Y-direction and exposing the upper doped region 112 of one of the legs 186 or 188 (FIG. 20) of the transistors 184 (FIG. 20). The exposed portion of the upper doped region 112 may be implanted, e.g., with phosphorus or other dopants, to reduce contact resistance with subsequently formed conductors. The recess 240 may extend to the lower conductive material 206 in the periphery 198. Although the recesses 240 and 242 may extend to different structures 206 and 188, the dimensions and position of the recesses 242 and 240 may be generally defined by a single mask 214. The other masks 204 and 236 formed by less expensive lithography equipment may determine which structures defined by the mask 214 connect to the upper doped region 112 or the lower conductive material 206, allowing the mask 214 to serve two purposes.

Figure 39:
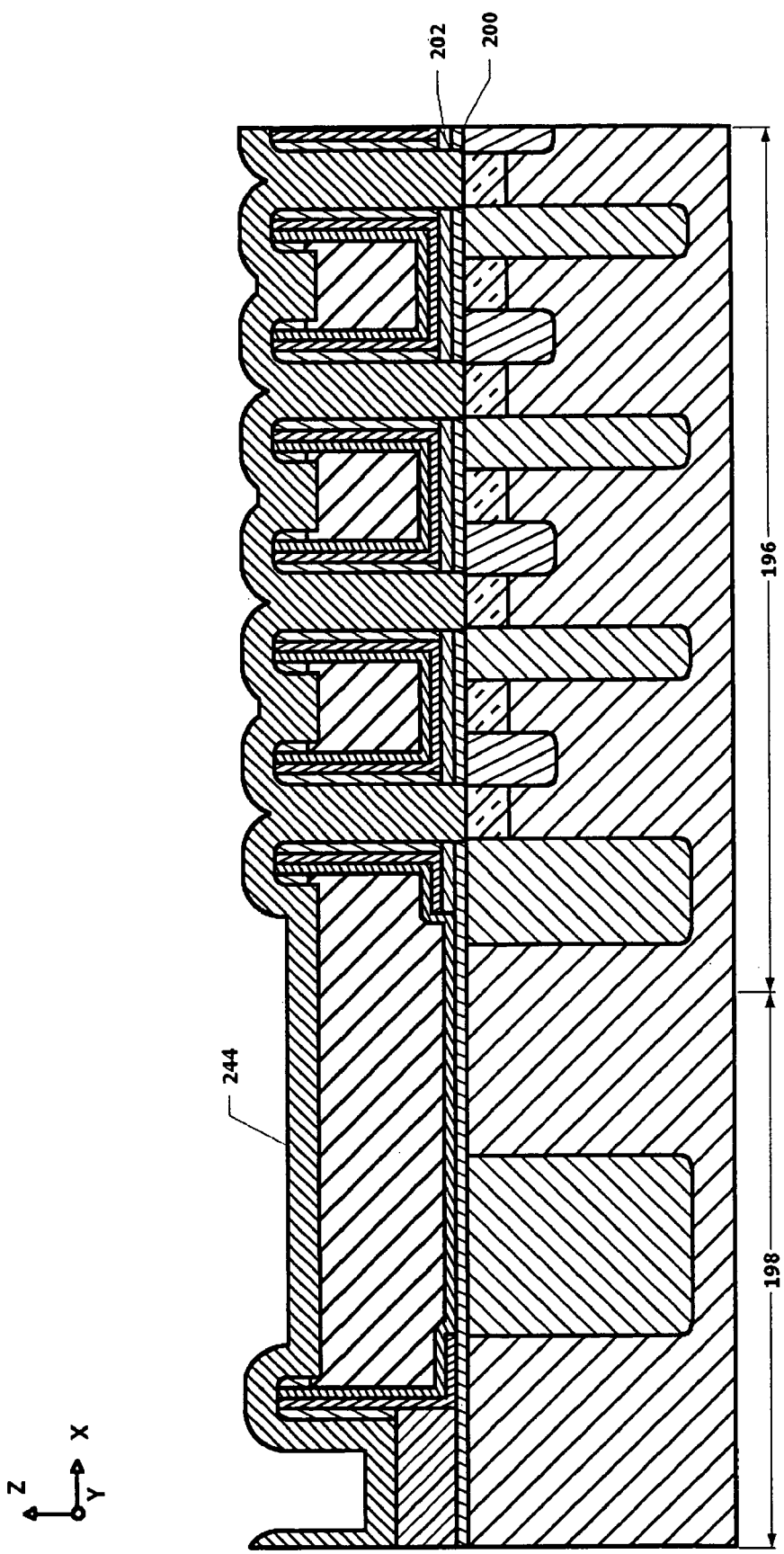

A conductive material 244 may be formed on the substrate 110, as illustrated by FIG. 39. The conductive material 244 may be doped polysilicon or a metal, such as titanium, or other appropriate materials. In some embodiments, the conductive material 244 includes a titanium nitride liner (not shown) and a titanium liner deposited with collimated physical-vapor deposition. The conductive material 244 may also include tungsten deposited on the titanium and titanium nitride liners. The tungsten may be less than about 400 Å thick, e.g., less than or equal to about 200 Å.

Figure 40:
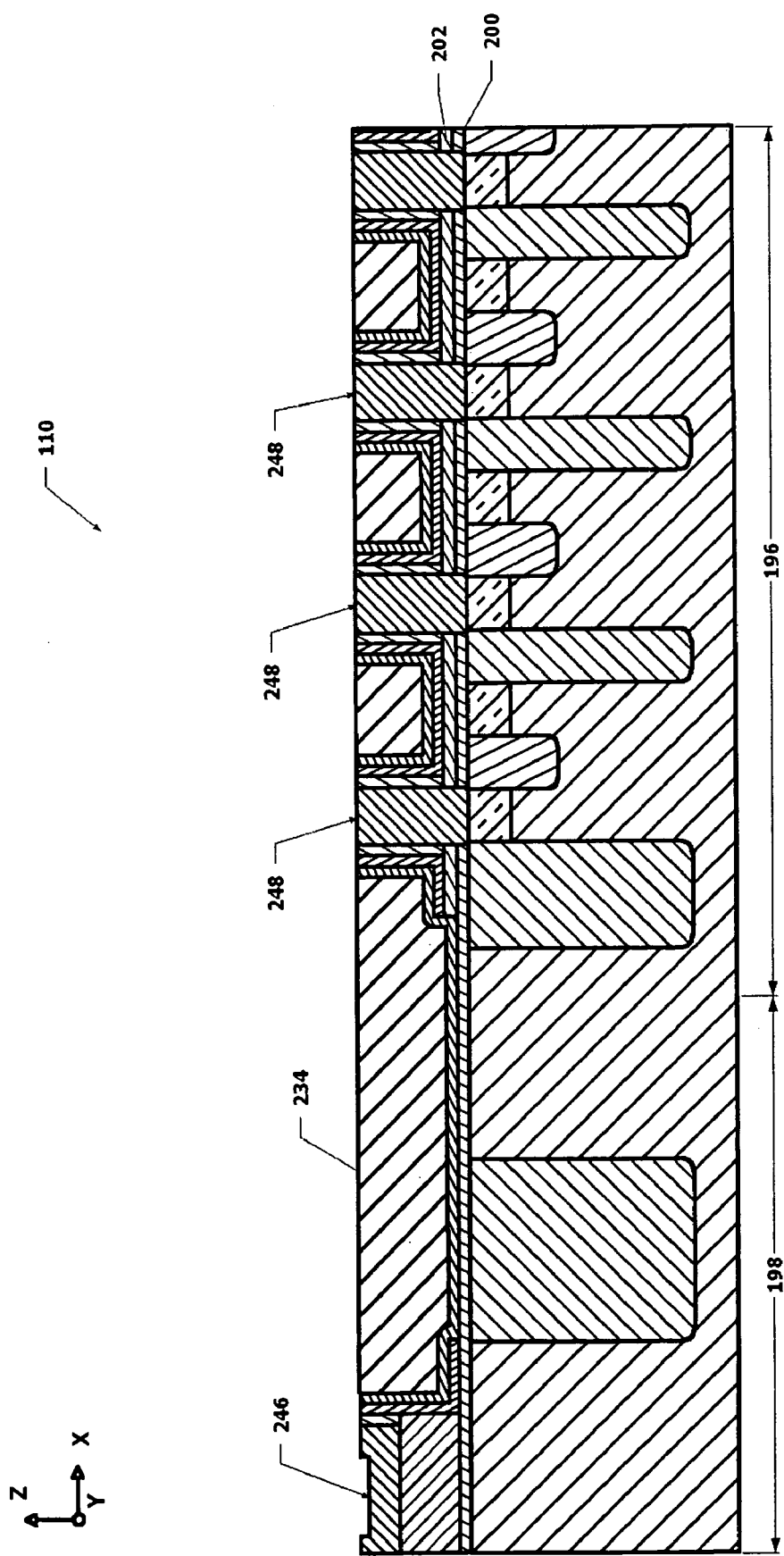

Next, the substrate 110 may be planarized, as illustrated by FIG. 40. Planarizing may include polishing the substrate with CMP or etching the substrate 110 with an etch-back process (e.g., by forming a sacrificial planarizing material, such as a spun on glass or resist, on the substrate 110 and etching the sacrificial material and the conductive material 244). Planarization may stop on or in the dielectric 234, forming a conductive plate 246 and data lines 248 that may be isolated from one another. The data lines 248 may extend in the Y-direction and connect to one of the legs 186 or 188 of a plurality of transistors 184 (FIG. 20). For instance, each data line 248 may connect to one leg 188 or 186 of one transistor 184 in each fin row 170 (FIG. 19). The data lines 248 may be isolated from one another by the dielectric 234, the liner material 238, the liner 232, the spacer material 228, the remaining buffer material 200, and the remaining stop material 202. In other embodiments, the data lines 248 may not extend generally straight in the Y-direction, e.g., they may undulate, vary in width, or be segmented.

Figure 41:
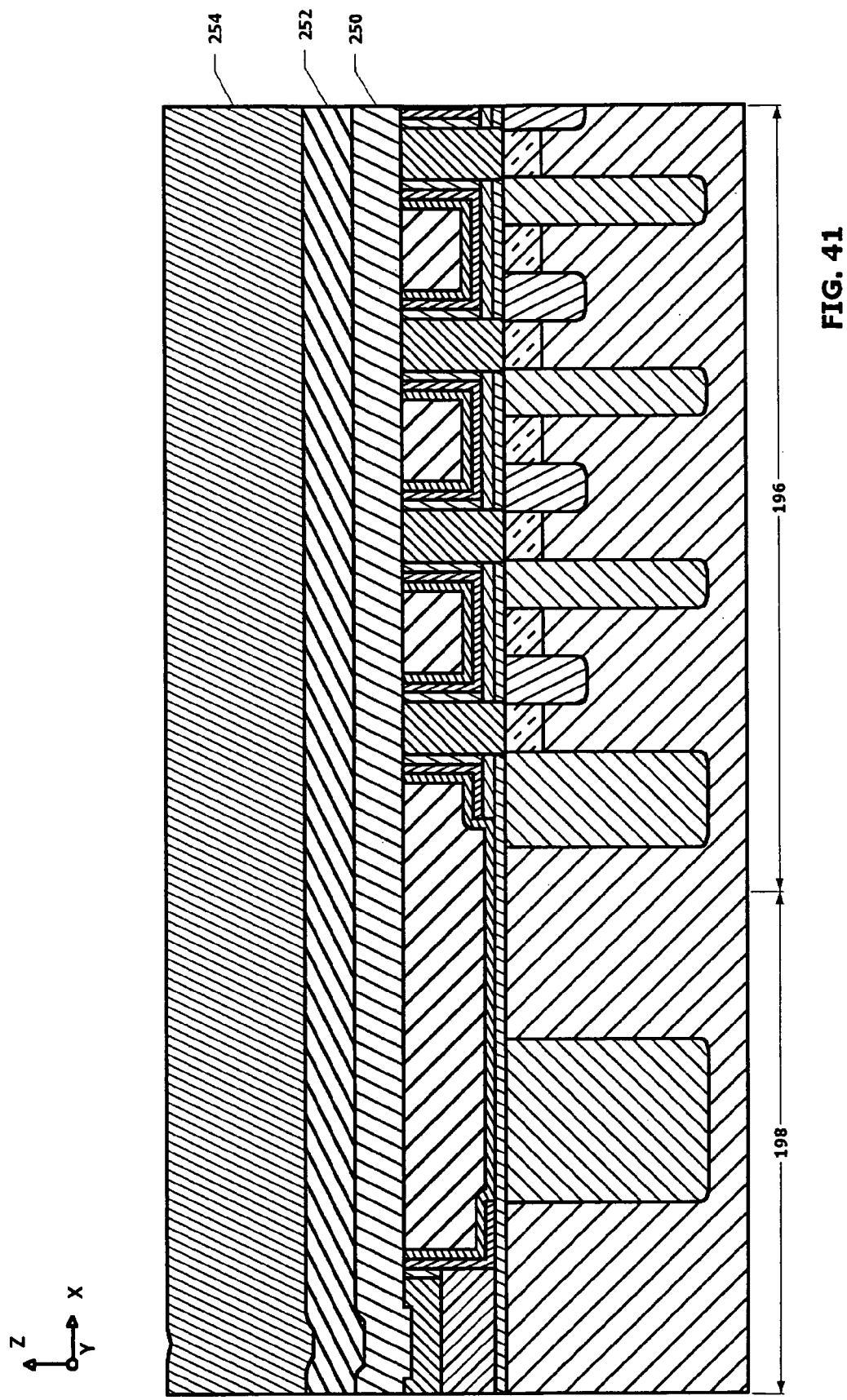

Next, a dielectric material 250, a stop material 252, and a sacrificial material 254 may be formed, as illustrated by FIG. 41. The dielectric material 250 may be an oxide or other appropriate material deposited with CVD or other processes, such as a spun-on-dielectric process. The dielectric 250 may have a thickness less than about 2000 Å, e.g., a thickness equal to or less than about 1000 Å or about 500 Å. The stop material 252 may be a nitride or other appropriate material selected to function as a stop layer for subsequent etches. The stop material 252 may have a thickness less than about 2500 Å, e.g., a thickness equal to or less than about 1500 Å or about 1000 Å. The sacrificial material 254 may include amorphous carbon deposited with CVD, PVD, or other appropriate processes, and it may have a thickness less than or equal to about 4000 Å.

Figure 42:
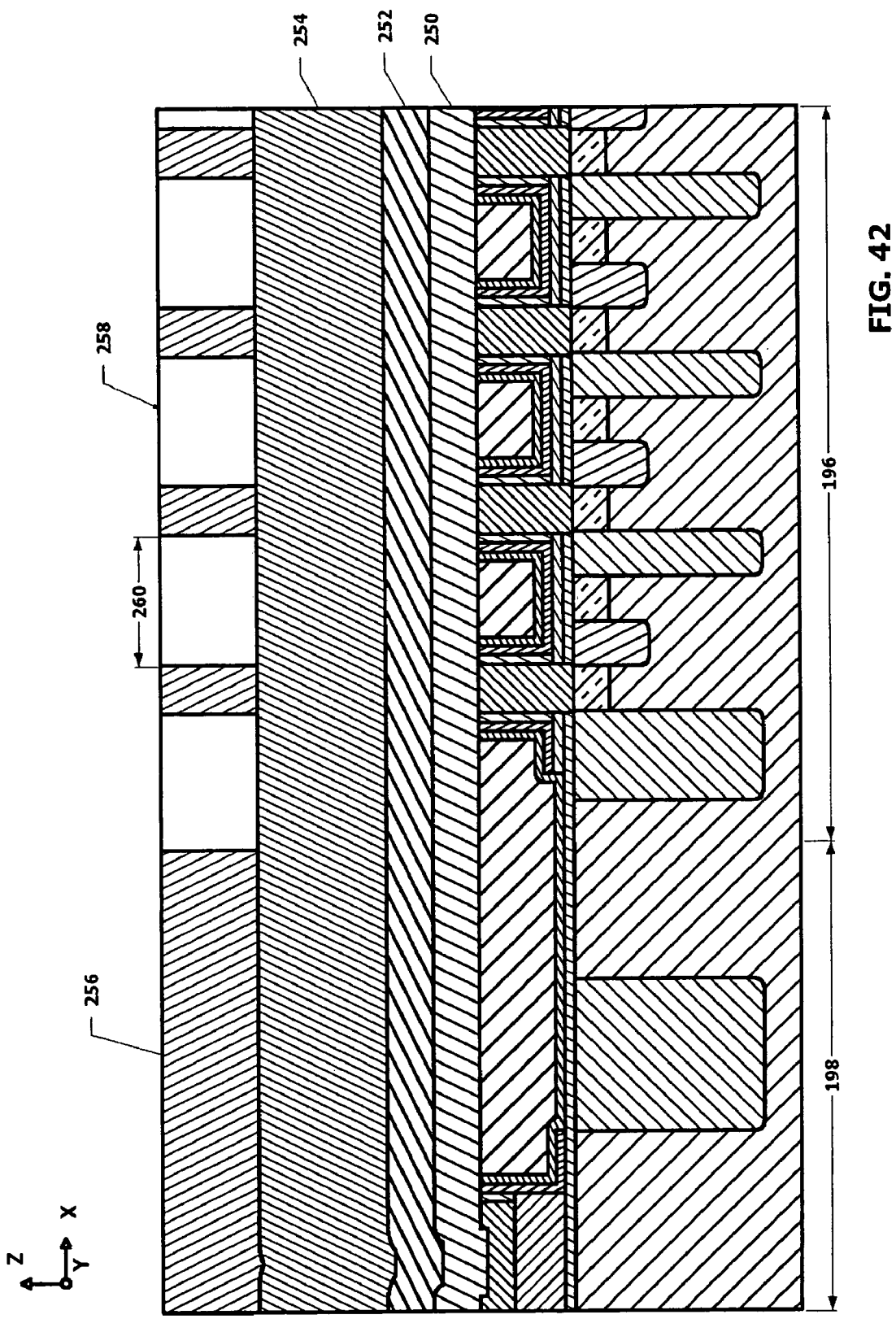

A mask 256 may be formed on the sacrificial material 254, as illustrated by FIG. 42. The mask 256 may generally cover the periphery 198 and define a plurality of openings 258 over the array 196. The openings 258 may have a generally right-circular-cylindrical shape, a generally right-elliptical-cylindrical shape, or other shape. The openings 258 may have a diameter 260 that is generally equal to or less than F, and the openings 258 may be generally centered over one of the legs 186 or 188 of each of the transistors 184 (FIG. 20). The mask 256 may be a hard mask or a soft mask formed with photolithography or other patterning techniques.

Figure 43:
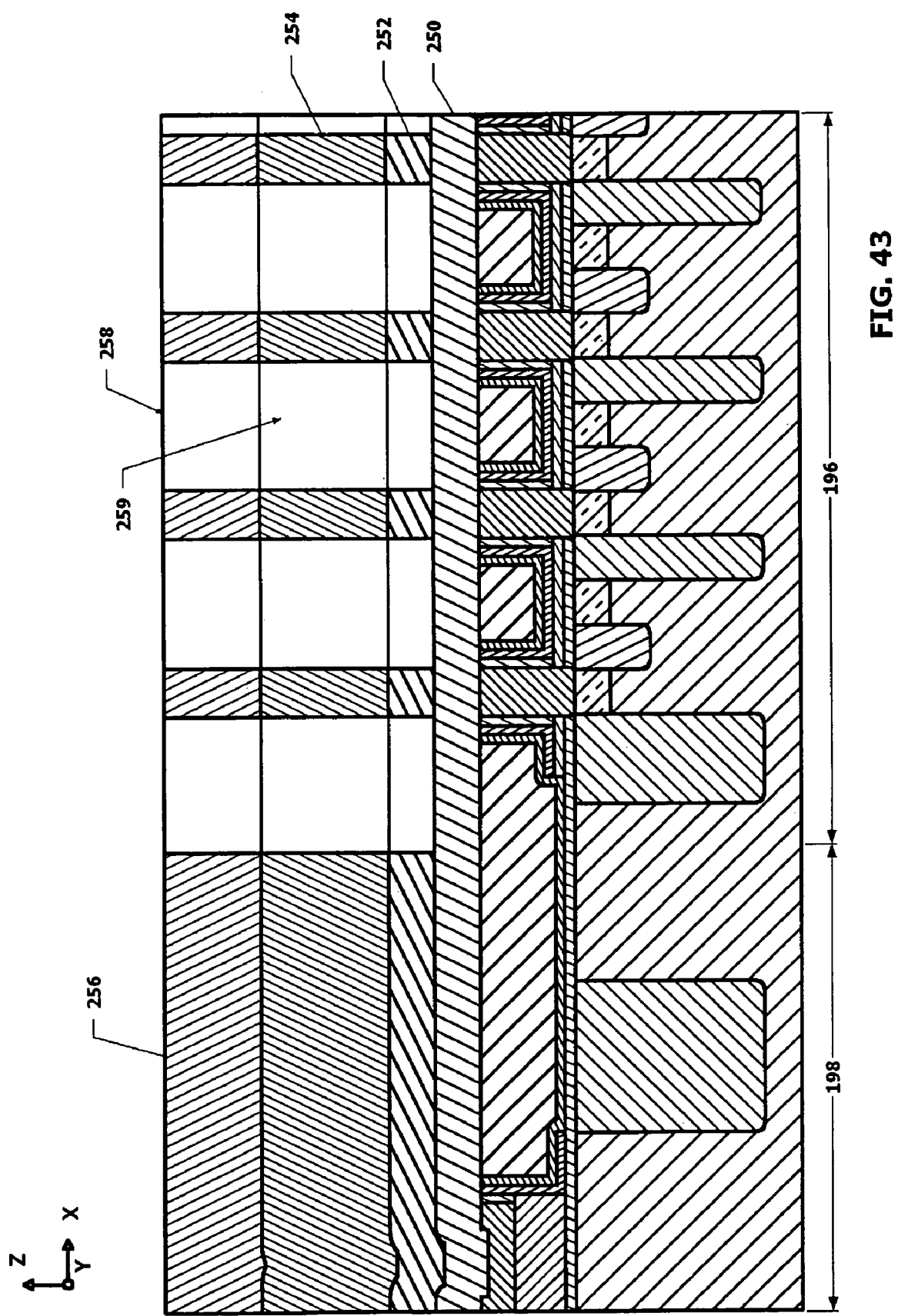

Next, the portions of the conductive material 254 and the stop material 252 disposed under the openings 258 may be removed to form recesses 259, as illustrated by FIG. 43. These materials 252 and 254 may be removed with a wet etch or a dry etch that is generally anisotropic. The etch may stop on or in the dielectric material 250.

Figure 44:
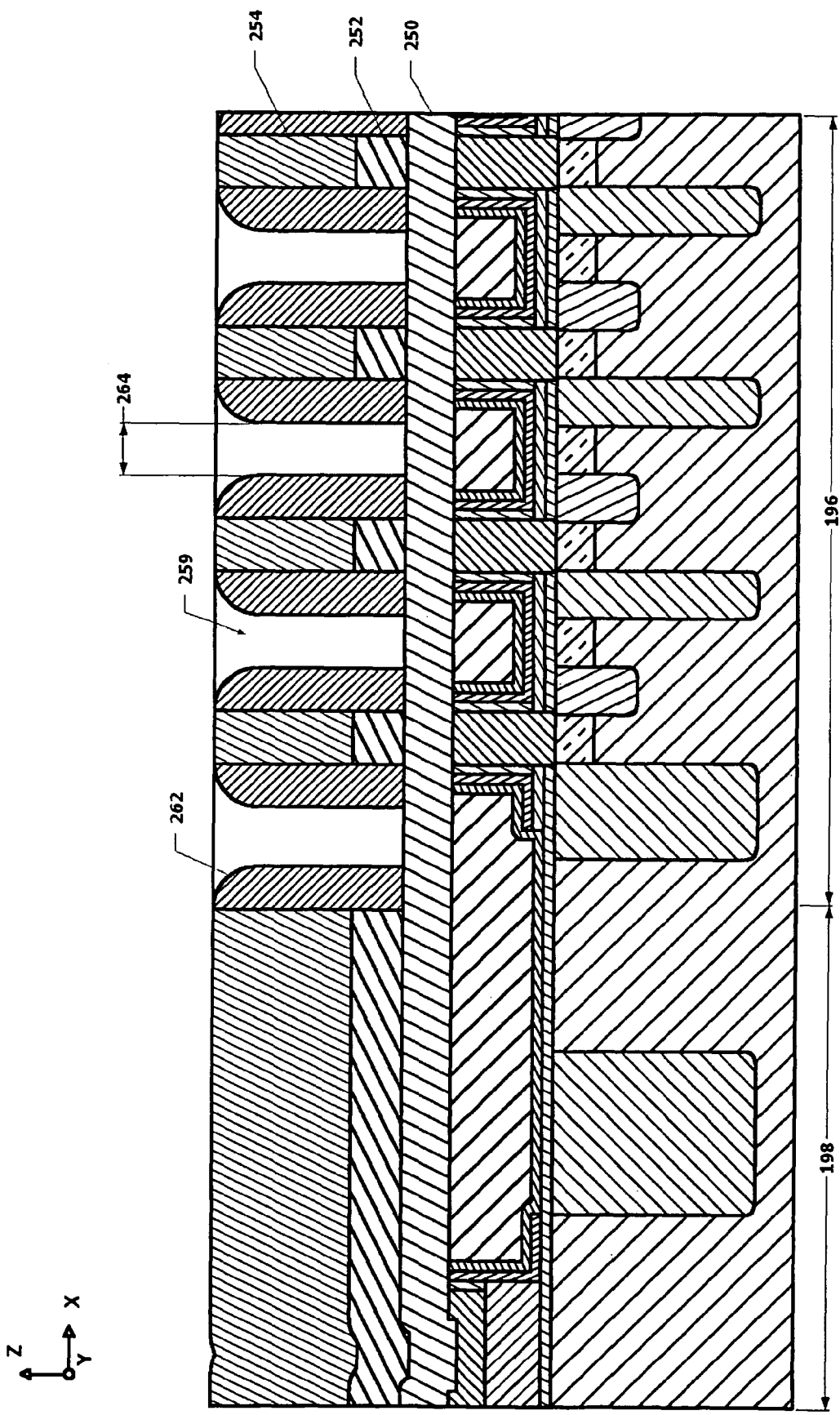

The mask 256 may be removed, and a spacer 262 may be formed in the recesses 259, as illustrated by FIG. 44. The spacer 262 may be formed by depositing a layer of spacer material and then generally anisotropically etching the spacer material to remove the spacer material from generally horizontal surfaces, leaving the spacers 262 in the recesses 259. The spacers 262 may be made of a conductive material, such as doped polysilicon or a metal, for example, or a non-conductive material. The spacer material may be deposited with a thickness less than about 800 Å, e.g., a thickness equal to or less than about 400 Å. The spacer 262 may narrow the diameter of the openings 258 to a narrower diameter 264 that may be generally equal to or less than F, ¾ F, or ½ F.

Figure 45:
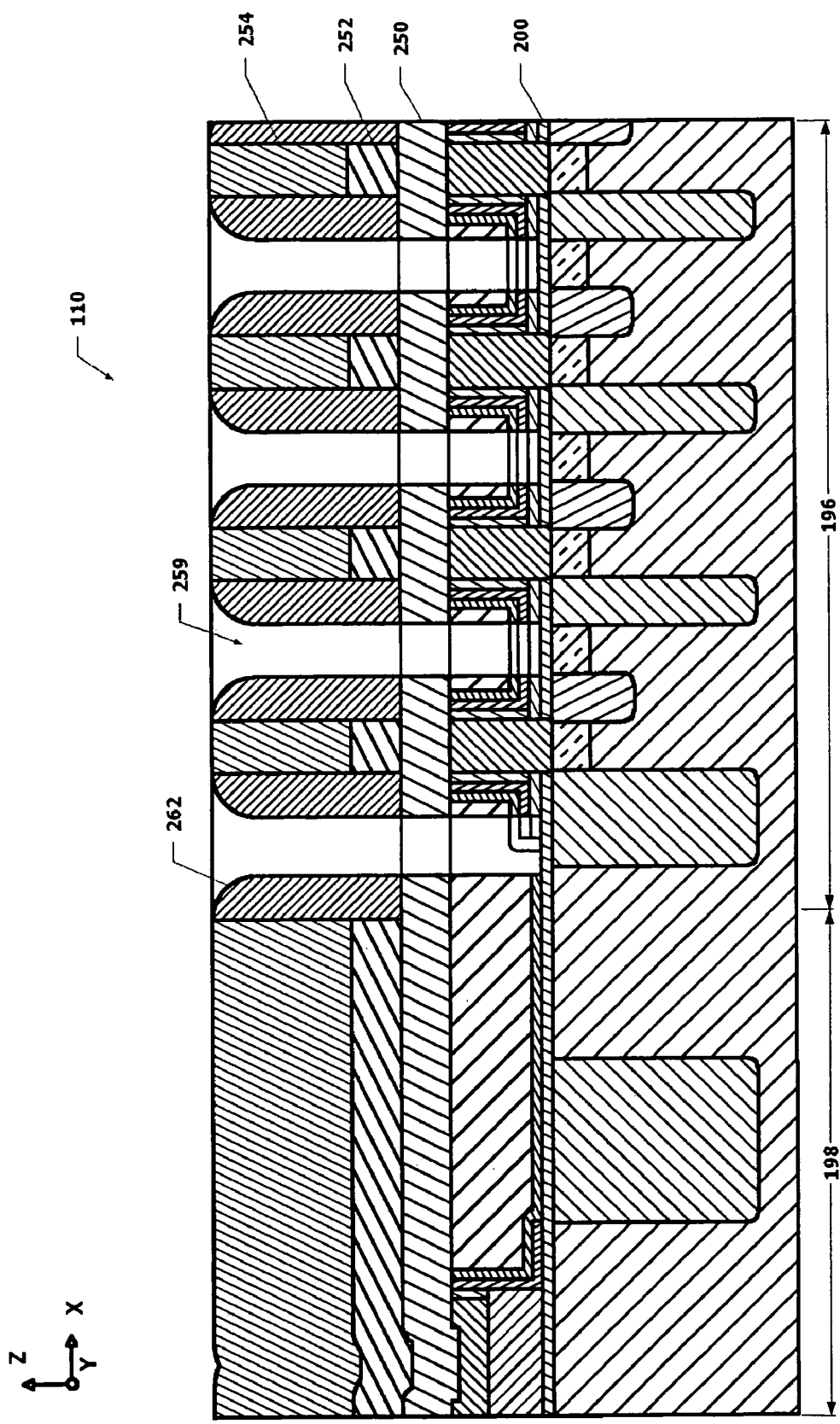

Next, the substrate 110 may be etched, as illustrated by FIG. 45. The substrate 110 may be etched with a generally anisotropic dry etch. During the etch, the sacrificial material 254 and the spacers 262 may mask portions of the substrate 110 as the narrowed recesses 259 are extended into the substrate 110 to the buffer material 200.

Figure 46:
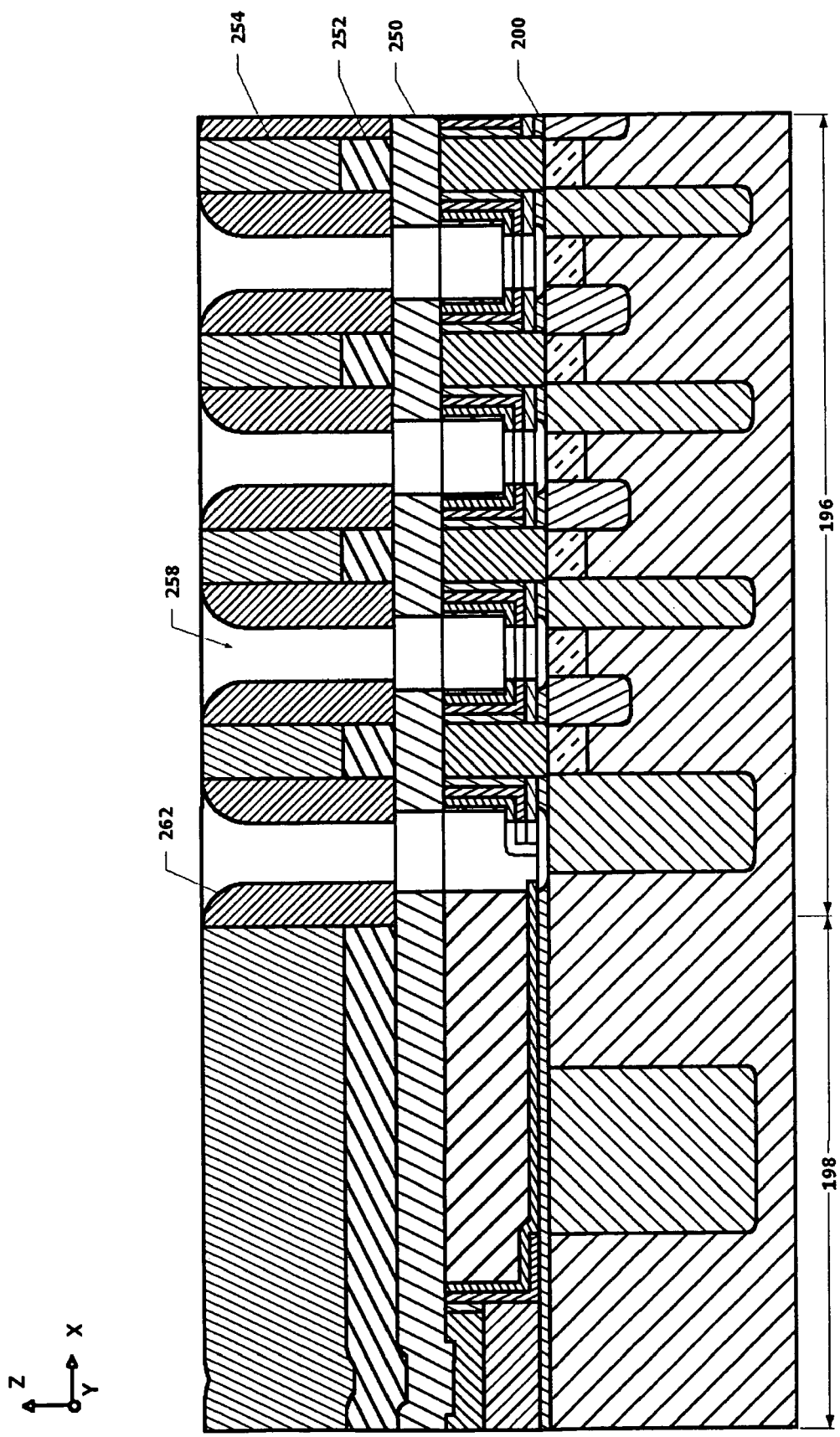

The substrate 110 may be etched to further remove the portion of the buffer material 200 disposed at the bottom of the recesses 259, as illustrated by FIG. 46. The buffer material 200 may be removed with a hydrofluoric acid clean or other wet or dry etch. The etch may attack portions of the side wall of the recesses 259, such as the dielectric 250 and the dielectric 234, and widen portions of the recesses 259. The etch may expose the surface of the upper doped region 112 (FIG. 20) of one of the legs 186 or 188 of each of the transistors 184 (FIG. 20).

Figure 47:
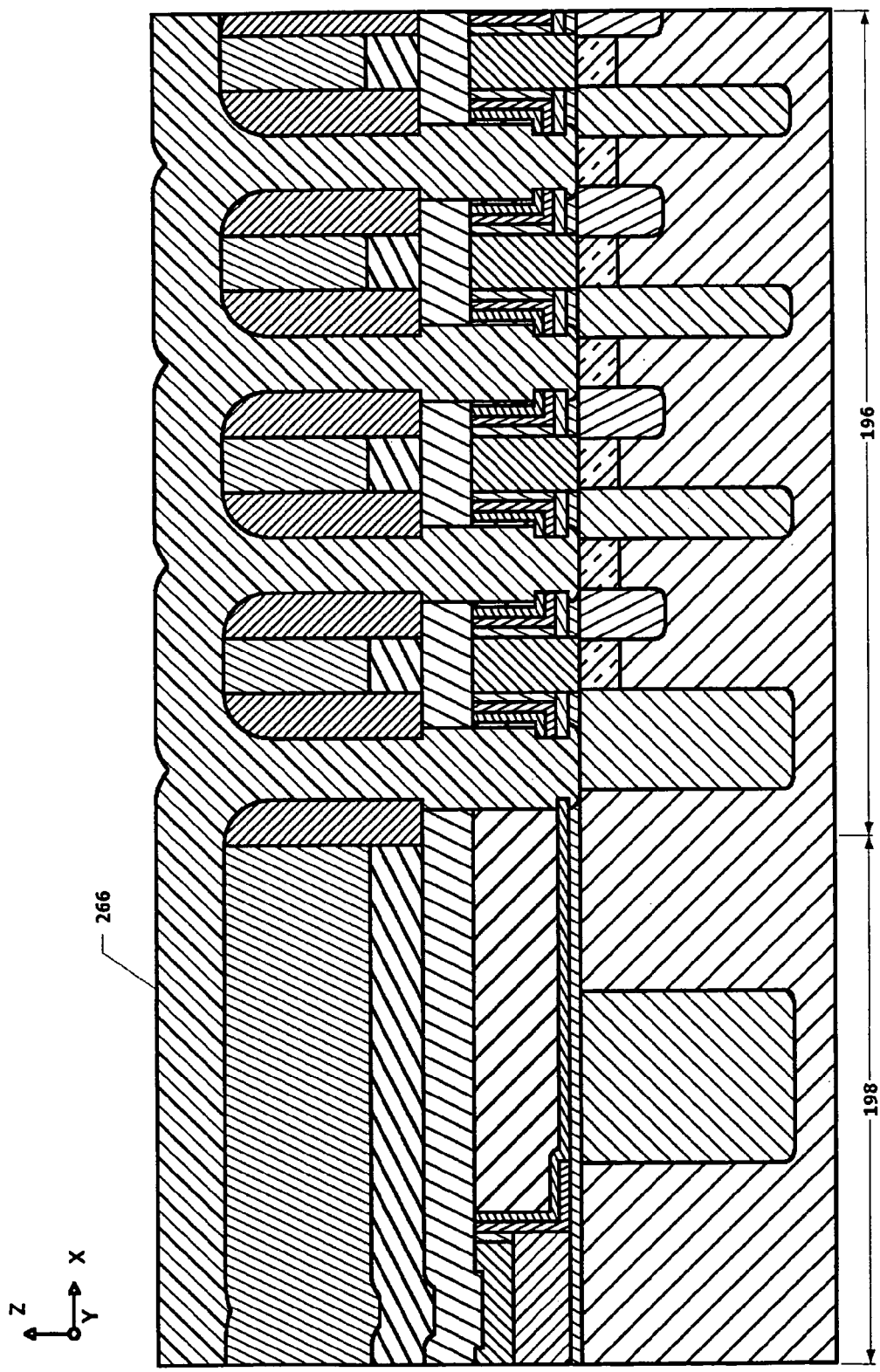

A conductive material 266 may then be formed on the substrate 110, as illustrated by FIG. 47. The conductive material 266 may be doped polysilicon (e.g., n+ doped polysilicon), a metal, or other appropriate materials, and it may have a thickness less than 700 Å, e.g. a thickness less than or generally equal to 400 Å. The conductive material 266 may extend to the bottom of the recesses 259 (FIG. 46). The conductive material 266 may be generally free of metal, and the area where the conductive material 226 meets the upper doped region 112 may be generally free of silicides. Keeping this area generally free of silicides is believed to reduce current leakage. It should be noted, though, that not all embodiments offer this advantage, and some embodiments offer other advantages.

Figure 48:
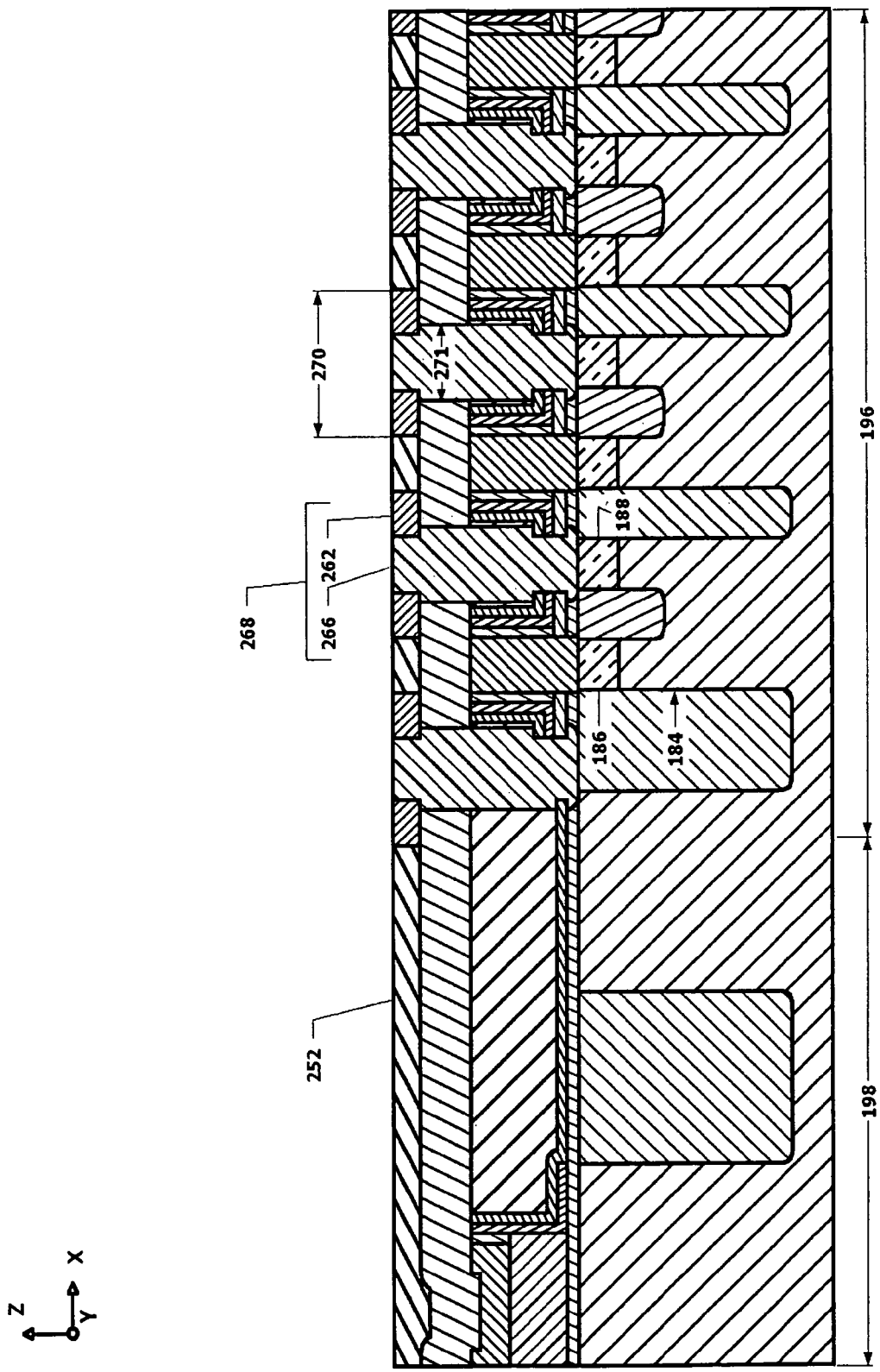

Next, the substrate 110 may be planarized, as illustrated by FIG. 48. Planarizing may include polishing the substrate 110 with CMP or etching the substrate with an etch-back process. Planarization may stop on or in the stop material 252, leaving a portion of the spacer material 262 and the conductive material 266 exposed.

The spacer material 262 and the conductive material 266 together may form a contact 268. The contacts 268 may extend generally along the z-axis to one of the two legs 186 or 188 of each of the transistors 184 in the array 196. In other embodiments, the contacts 268 may extend to transistors with other structures, e.g., a source or drain of a CMOS transistor with a generally horizontal channel between its source and drain. The contacts 268 may be generally cylindrical structures with a generally horizontal flange formed by the spacer material 262 and having a diameter 270. In some embodiments, the diameter 270 may be generally equal to or less than F. The diameter 270 and a diameter 271 of the lower portion of the contacts 268 may be generally defined by a single photolithography step, and the difference between these dimensions may be generally defined by the thickness of the spacer 262. Forming both of these dimensions 270 and 271 with a single photolithography step is believed to economize capacity of photolithography equipment. It should be noted, though, that not all embodiments offer this advantage, and some embodiments offer other advantages.

In the cross-section of FIG. 48, the contacts 268 generally have a T-shape. The spacer material 262 may enlarge the target for subsequently-formed data elements, e.g., capacitor plates, ovonic devices, or imaging devices, thereby potentially increasing the alignment margin for these structures. The spacers 268 may be generally electrically isolated from other spacers 268 on the same fin row 170 (FIG. 19) and from spacers 268 on other fin rows 170.

Figure 49:
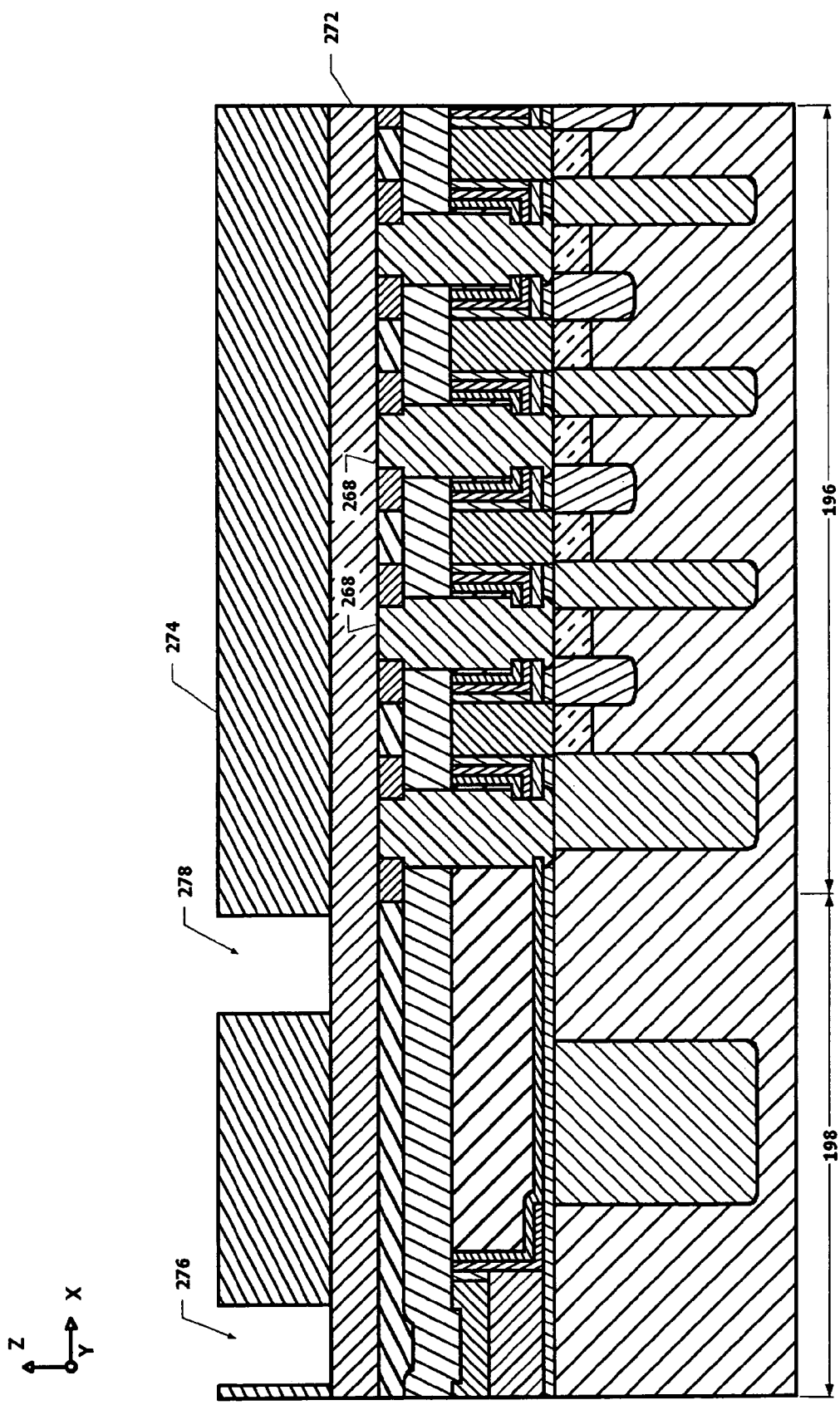

Next, a dielectric material 272 may be formed, and a mask 274 may be formed on the dielectric material 272, as illustrated by FIG. 49. The dielectric material 272 may be an oxide, such as an oxide deposited with CVD. The dielectric material 272 may cover the contacts 268. The dielectric material 272 may have a thickness less than about 2000 Å, e.g., a thickness equal to or less than about 500 Å. The mask 274 may be a soft mask or a hard mask formed with photolithography or other lithography processes. The mask 274 may include exposed regions 276 and 278 in the periphery 198, and it may generally mask the array 196.

Figure 50:
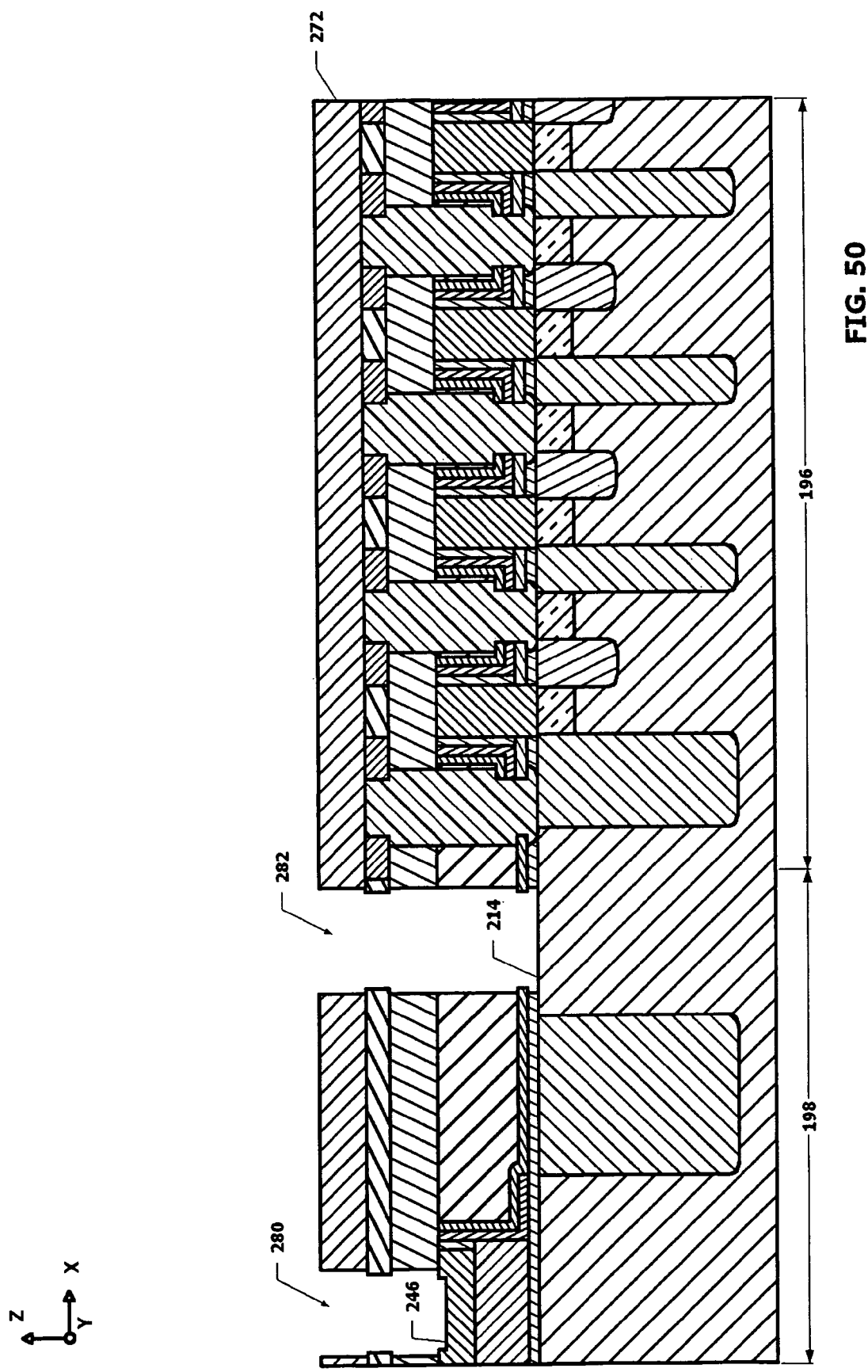

The areas under the exposed regions 276 and 278 may be etched, as illustrated by FIG. 50. The etch may be a generally anisotropic dry etch, and the etch may be generally selective against the conductive plate 246. The etch may produce an opening 280 that extends to the conductive plate 246 and an opening 282 that extends further into or to the lower doped region 214 or other portion of the substrate.

Figure 51:
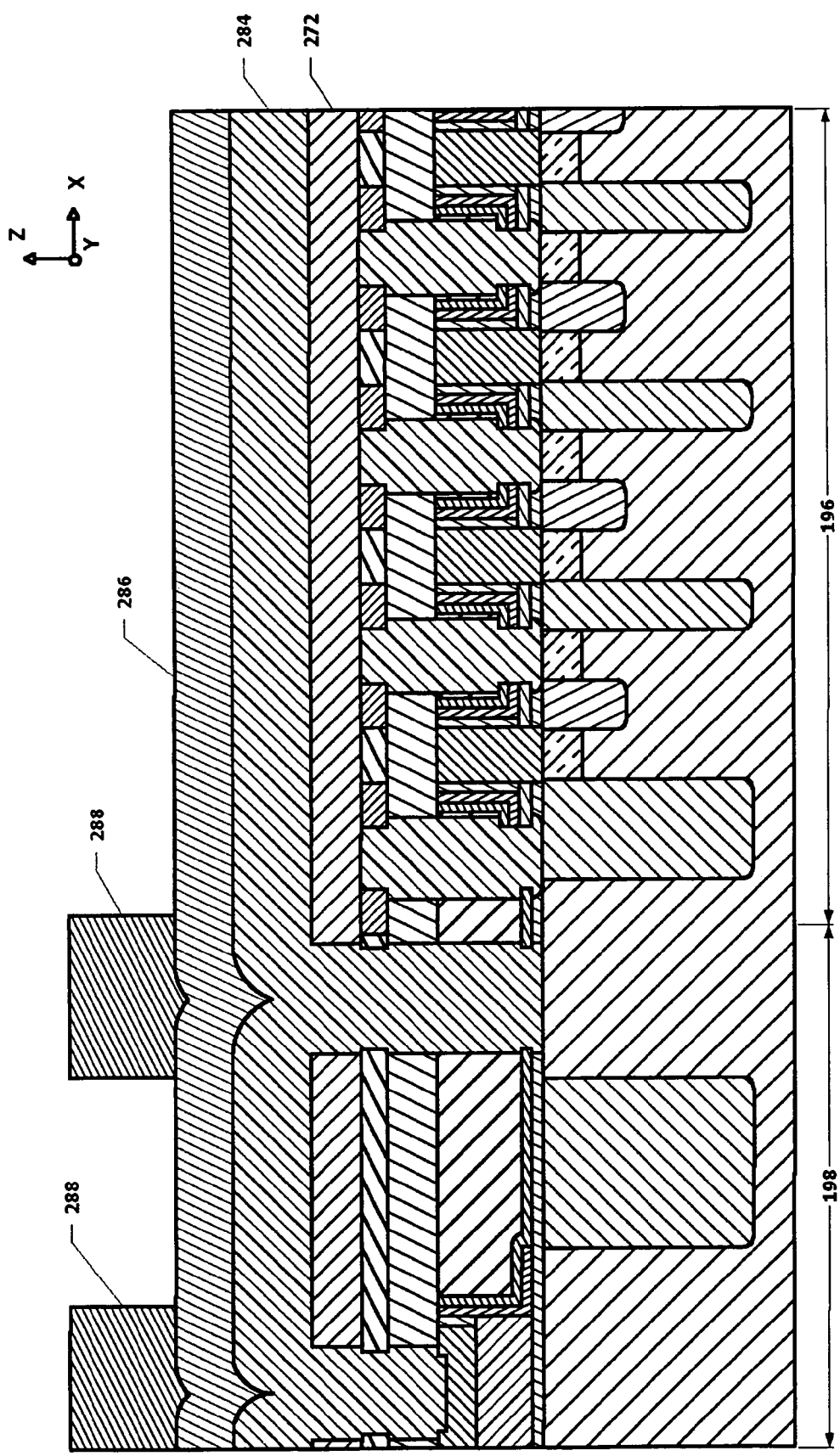

Next, a conductive material 284, a hard-mask material 286, and a mask 288 may be formed, as illustrated by FIG. 51. The conductive material 284 may include liners, such as titanium and titanium nitride liners (not shown) deposited with physical-vapor deposition (PVD), and tungsten or other conductive materials deposited with, for example, PVD or other processes. The hard-mask material 286 may include carbon or other materials deposited with CVD or other processes. The mask 288 may be formed with photolithography, and it 288 may generally leave the array 196 and portions of the periphery 198 exposed.

Figure 52:
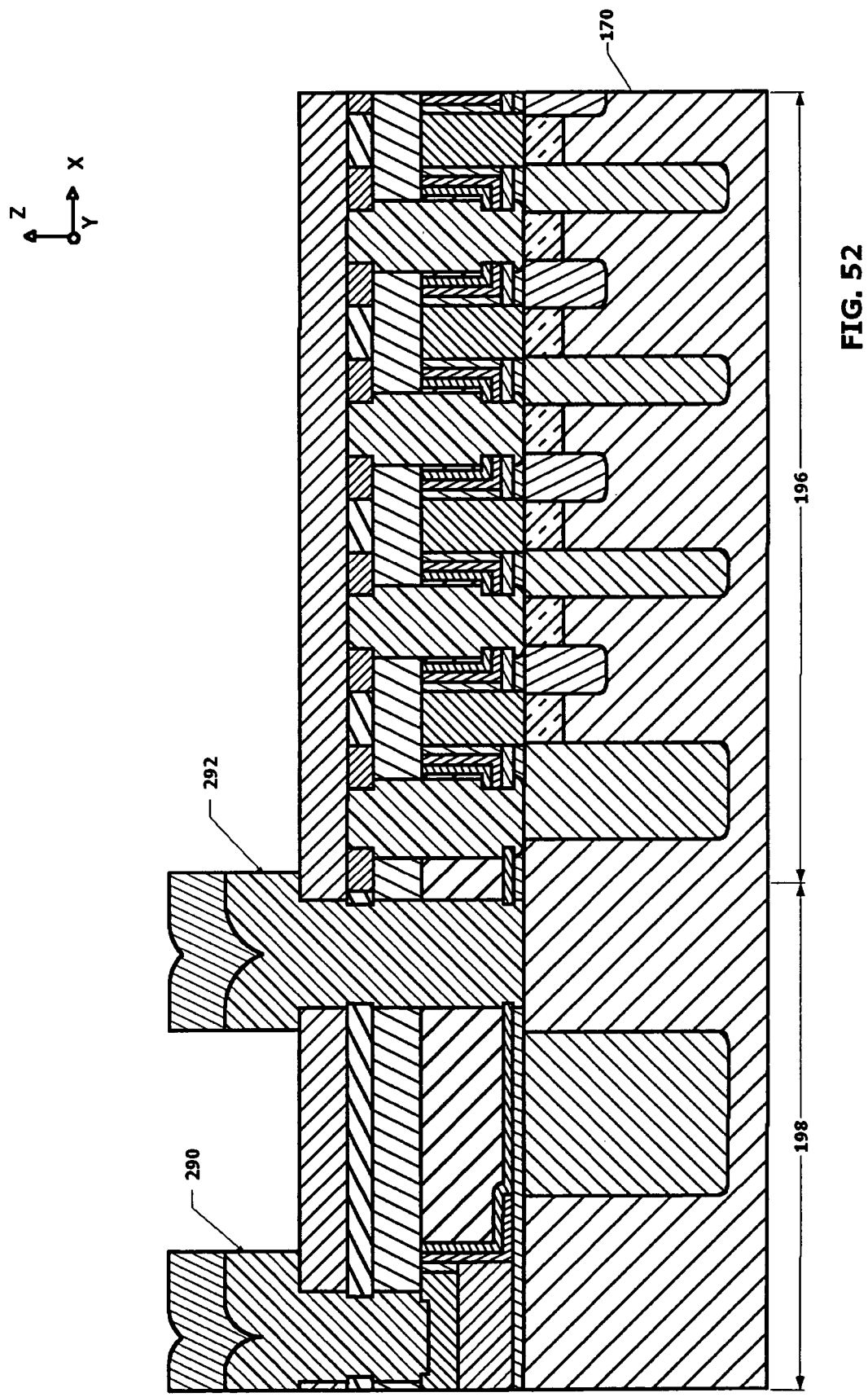

Next, the substrate 110 may be etched to form contacts 290 and 292, as illustrated by FIG. 52. The substrate 110 may be etched with an etch that is generally anisotropic, such as a dry etch. The etch may stop on or in the dielectric 272. The contacts 292 may connect to the gates 176 and 178 on either side of a fin row 170 (FIG. 19). The contact 292 may be referred to as a "word line contact." The contact 292 may straddle one fin row 170, and different contacts 292 may contact to other gates 176 and 178 on other fin rows 170 (FIG. 19). The contact 290 may connect to a gate stack 294 formed from the conductive plate 246 and the lower conductive material 206.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method, comprising:
   forming a lower stop material on a substrate;
   forming a conductive material on the lower stop material;
   forming an upper stop material on the conductive material;
   forming a sacrificial material on the upper stop material;
   etching the sacrificial material with an etch that is selective to the sacrificial material and selective against the upper stop material; and
   etching the conductive material.

2. The method of claim 1, wherein forming the conductive material comprises forming doped polysilicon on the substrate.

3. The method of claim 1, wherein forming the upper stop material comprises forming a nitride on the conductive material.

4. The method of claim 1, wherein forming the sacrificial material comprises forming polysilicon on the upper stop material.

5. A method, comprising:
   forming a conductive material on a substrate;
   forming a stop material on the conductive material;
   forming a sacrificial material on the stop material;
   etching the sacrificial material with an etch that is selective to the sacrificial material and selective against the stop material;
   forming an implant barrier on the sacrificial material before etching the sacrificial material, wherein the implant barrier comprises a generally amorphous material; and
   etching the conductive material.

6. The method of claim 5, comprising forming a mask on the implant barrier after forming the sacrificial material.

7. The method of claim 6, wherein forming the mask comprises generally defining a lateral dimension of a gate in a periphery area of the substrate and generally defining a lateral dimension of a data line in an array area of the substrate.

8. A method, comprising:
   forming a conductive material on a substrate;
   forming a stop material on the conductive material;
   forming a sacrificial material on the stop material;
   etching the sacrificial material with an etch that is selective to the sacrificial material and selective against the stop material;
   etching the conductive material; and
   forming a data line in a recess formed by removing the conductive material.

9. A method, comprising:
   forming a lower stop material on a substrate;
   forming a conductive material on the lower stop material;
   forming an upper stop material on the conductive material;
   forming a sacrificial material on the upper stop material;

etching the sacrificial material with an etch that is selective to the sacrificial material and selective against the upper stop material; and etching the conductive material; and forming a gate from the conductive material.

10. A method, comprising:

patterning a data line and a gate with a first lithography step;

forming the data line from a first material; and forming the gate from a second material, wherein patterning the data line and the gate comprises patterning the data line in an array area of a substrate and patterning the gate in a periphery area of the substrate.

11. The method of claim 10, wherein patterning the data line and the gate comprises patterning the data line and the gate with a deep-UV photolithography tool.

12. A method, comprising:

patterning a data line and a gate with a first lithography step;

forming the data line from a first material; and forming the gate from a second material, wherein patterning the data line and the gate comprises etching the second material before the first material is formed on the substrate.

13. The method of claim 12, wherein forming the data line from the first material comprises:

forming a third material on the second material after etching the second material;

patterning an array area and a periphery area with a second lithography step, wherein a minimum feature size of the second lithography step is greater than a minimum feature size of the first lithography step;

removing the second material from the array area; and forming the data line by forming the first material in a recess formed by removing the second material from the array area.

14. The method of claim 13, wherein:

the first lithography step is a photolithography step performed with a deep-UV photolithography tool; and the second lithography step is a photolithography step performed with an I-line photolithography tool.

15. A method, comprising:

patterning a first structure and a second structure with a first lithography step;

designating the first structure as having a first function and the second structure as having a second function with a second lithography step, wherein lithographic limit of the first lithography step is smaller than a lithographic limit of the second lithography step.

16. The method of claim 15, comprising:

forming a gate dielectric on a substrate before patterning the first structure and the second structure; and forming a conductive material on the gate dielectric before patterning the first structure and the second structure.

17. The method of claim 16, wherein:

the first structure is formed from the conductive material; and the second structure is formed in a recess formed by removing the conductive material.

18. The method of claim 15, wherein:

the first structure is a gate of a transistor; and the second structure connects to a source or a drain of another transistor.

* * * * *